United States Patent
Katayama

(10) Patent No.: US 11,930,287 B2
(45) Date of Patent: Mar. 12, 2024

(54) IMAGING ELEMENT AND ELECTRONIC DEVICE

(71) Applicant: SONY SEMICONDUCTOR SOLUTIONS CORPORATION, Kanagawa (JP)

(72) Inventor: Hiroshi Katayama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 108 days.

(21) Appl. No.: 17/608,519

(22) PCT Filed: May 1, 2020

(86) PCT No.: PCT/JP2020/018455
§ 371 (c)(1),
(2) Date: Nov. 3, 2021

(87) PCT Pub. No.: WO2020/230675
PCT Pub. Date: Nov. 19, 2020

(65) Prior Publication Data
US 2022/0232183 A1    Jul. 21, 2022

(30) Foreign Application Priority Data

May 10, 2019    (JP) ................................. 2019-090200

(51) Int. Cl.
*H04N 25/702* (2023.01)
*H01L 27/146* (2006.01)
(Continued)

(52) U.S. Cl.
CPC ..... *H04N 25/702* (2023.01); *H01L 27/14621* (2013.01); *H01L 27/14623* (2013.01);
(Continued)

(58) Field of Classification Search
None
See application file for complete search history.

(56) References Cited

U.S. PATENT DOCUMENTS

2005/0029433 A1    2/2005   Sakoh et al.
2011/0279727 A1    11/2011  Kusaka
(Continued)

FOREIGN PATENT DOCUMENTS

JP    2005-057024    3/2005
JP    2011-176715    9/2011
(Continued)

OTHER PUBLICATIONS

International Search Report prepared by the Japan Patent Office dated Jul. 15, 2020, for International Application No. PCT/JP2020/018455, 2 pgs.
(Continued)

*Primary Examiner* — Paul M Berardesca
(74) *Attorney, Agent, or Firm* — Sheridan Ross PC

(57) ABSTRACT

An imaging element according to an embodiment includes: a light receiving unit including a plurality of photoelectric conversion elements arranged in a lattice-pattern array, and a plurality of lenses provided for respective sets of elements on a one-to-one basis, each set of elements including two or more of the plurality of photoelectric conversion elements arranged adjacent to each other. In the light receiving unit, among a plurality of pixel sets each including the set of elements and one of the plurality of lenses provided in the set of elements, at least two pixel sets adjacent to each other are different from each other in pupil correction amount.

19 Claims, 36 Drawing Sheets

(51) Int. Cl.
*H04N 25/13* (2023.01)
*H04N 25/42* (2023.01)
*H04N 25/46* (2023.01)
*H04N 25/704* (2023.01)
*G02B 3/00* (2006.01)

(52) U.S. Cl.
CPC .. *H01L 27/14627* (2013.01); *H01L 27/14645* (2013.01); *H04N 25/42* (2023.01); *H04N 25/46* (2023.01); *H04N 25/704* (2023.01); *G02B 3/0056* (2013.01); *H04N 25/134* (2023.01)

(56) References Cited

U.S. PATENT DOCUMENTS

| | | | | |
|---|---|---|---|---|
| 2013/0127002 | A1* | 5/2013 | Okigawa | H04N 25/704 |
| | | | | 257/432 |
| 2015/0009367 | A1 | 1/2015 | Kobayashi | |
| 2016/0088245 | A1* | 3/2016 | Nakata | H04N 25/134 |
| | | | | 257/432 |
| 2016/0269655 | A1* | 9/2016 | Numata | H01L 27/1461 |
| 2017/0077163 | A1* | 3/2017 | Chou | H01L 27/14605 |
| 2019/0289235 | A1 | 9/2019 | Nakamura | |
| 2020/0027913 | A1 | 1/2020 | Nomura | |

FOREIGN PATENT DOCUMENTS

| | | |
|---|---|---|
| JP | 2017-188633 | 10/2017 |
| JP | 2018-014476 | 1/2018 |
| JP | 2018201015 A | 12/2018 |
| TW | 201021557 | 6/2010 |
| TW | 201242002 | 10/2012 |
| WO | WO 2013/145886 | 10/2013 |
| WO | WO-2017212909 A1 | 12/2017 |
| WO | WO 2018/150902 | 8/2018 |

OTHER PUBLICATIONS

Official Action for Taiwan Patent Application No. 109111725, dated Dec. 11, 2023, 7 pages.

* cited by examiner

DIRECTION OF PUPIL CORRECTION

DIRECTION OF PUPIL CORRECTION

DIRECTION OF PUPIL CORRECTION

DIRECTION OF PUPIL CORRECTION

IMAGING ELEMENT AND ELECTRONIC DEVICE

CROSS REFERENCE TO RELATED APPLICATIONS

This application is a national stage application under 35 U.S.C. 371 and claims the benefit of PCT Application No. PCT/JP2020/018455 having an international filing date of 1 May 2020, which designated the United States, which PCT application claimed the benefit of Japanese Patent Application No. 2019-090200 filed 10 May 2019, the entire disclosures of each of which are incorporated herein by reference.

FIELD

The present invention relates to an imaging element and an electronic device.

BACKGROUND

It has been known that light is irradiated from a main lens toward a pixel array in which a plurality of pixels, each including a microlens, are arranged. In this configuration, an entrance pupil diameter with respect to a pixel changes depending on an image height of each pixel with respect to a position of an optical axis of the main lens, and an amount of light irradiated to the pixel changes. Therefore, a pupil correction technology has been known for suppressing a change in entrance pupil diameter by shifting the position of the microlens or the like of each pixel depending on the image height.

In addition, there has been known an image plane phase difference AF technique in which autofocus (AF) processing and parallax detection are performed on the basis of a phase difference of a pixel signal from each of a plurality of pixels arranged in a row direction (or a column direction) in the above-described pixel array.

CITATION LIST

Patent Literature

Patent Literature 1: JP 2017-188633 A
Patent Literature 2: JP 2018-014476 A

SUMMARY

Technical Problem

In a conventional art, a pupil correction amount for each pixel included in one pixel array is fixed for each pixel. Meanwhile, in a case where the pixel array is applied to a general camera, if the main lens is changed by replacing a lens, operating a zoom, or the like, the entrance pupil diameter of the main lens changes. In a case where the entrance pupil diameter of the main lens changes as described above, a pupil correction is not appropriately made, and it is difficult to acquire a phase difference of an image signal with high accuracy.

An object of the present disclosure is to provide an imaging element and an electronic device capable of acquiring a phase difference of an image signal with high accuracy in a wider entrance pupil diameter range.

Solution to Problem

For solving the problem described above, an imaging element according to one aspect of the present disclosure has a light receiving unit that includes a plurality of photoelectric conversion elements arranged in a lattice-pattern array, and a plurality of lenses provided for respective sets of elements on a one-to-one basis, each set of elements including two or more of the plurality of photoelectric conversion elements arranged adjacent to each other, wherein in the light receiving unit, among a plurality of pixel sets each including the set of elements and one of the plurality of lenses provided in the set of elements, at least two pixel sets adjacent to each other are different from each other in pupil correction amount.

DESCRIPTION OF EMBODIMENTS

Hereinafter, embodiments of the present disclosure will be described in detail with reference to the drawings. Note that, in the following embodiments, the same parts are denoted by the same reference signs, and redundant description will be omitted.

(Configuration Commonly Applicable to Each Embodiment)

Figure 1:
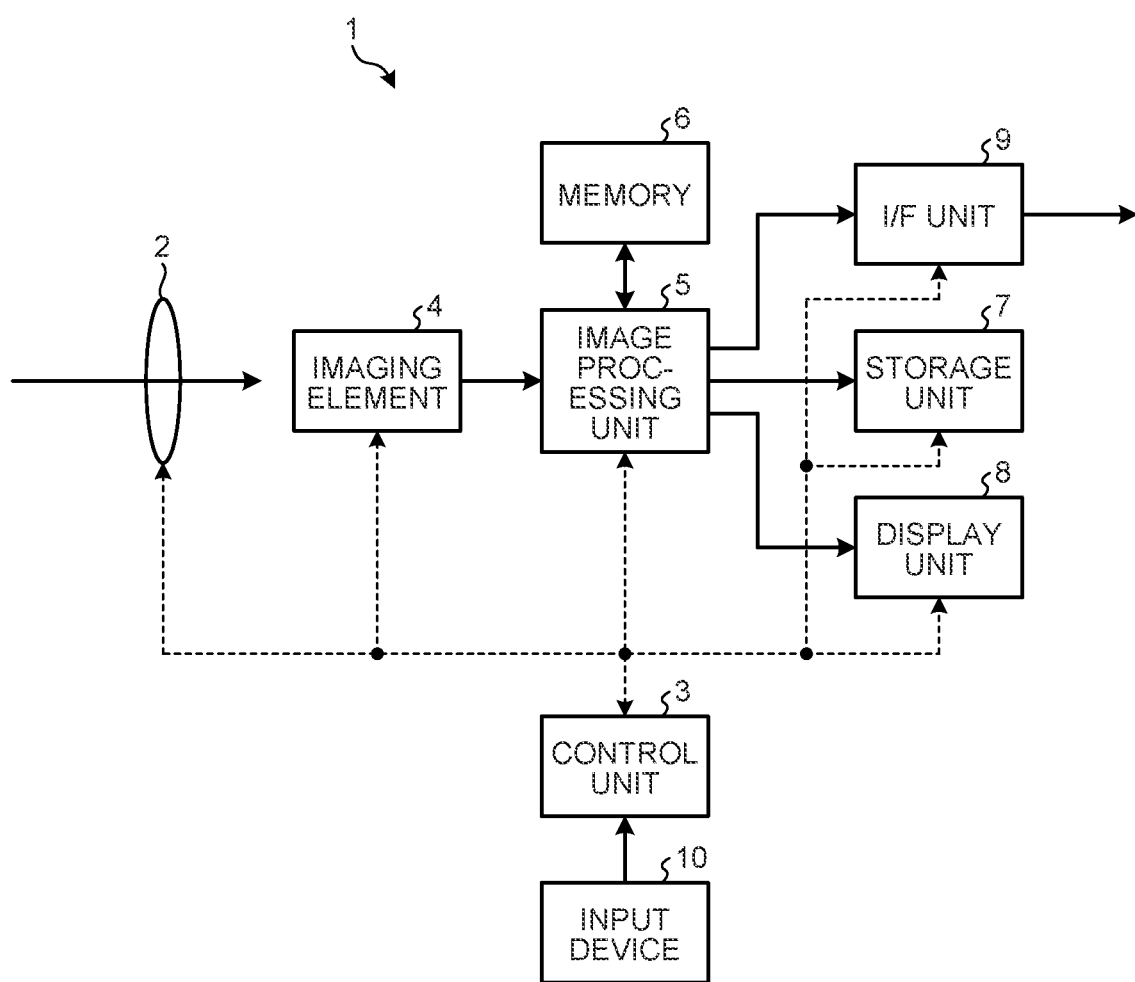
FIG. 1 is a block diagram illustrating a configuration of an example of an electronic device commonly applicable to each embodiment.

FIG. 1 is a block diagram illustrating a configuration of an example of an electronic device commonly applicable to each embodiment. In FIG. 1, an electronic device 1 includes an optical system 2, a control unit 3, an imaging element 4, an image processing unit 5, a memory 6, a storage unit 7, a display unit 8, an interface (I/F) unit 9, and an input device 10.

Here, as the electronic device 1, a digital still camera, a digital video camera, a mobile phone with an imaging function, a smartphone, or the like can be applied. In addition, as the electronic device 1, a monitoring camera, an in-vehicle camera, a medical camera, or the like can also be applied.

The imaging element 4 includes a plurality of photoelectric conversion elements arranged, for example, in a lattice-pattern array. The photoelectric conversion elements convert received light into charges by photoelectric conversion. The imaging element 4 includes a drive circuit driving the plurality of photoelectric conversion elements, and a signal processing circuit reading out a charge from each of the plurality of photoelectric conversion elements and generating image data on the basis of the read-out charge.

The optical system 2 includes a main lens formed of one lens or a plurality of lenses combined to each other and a mechanism for driving the main lens, and forms an image of image light (incident light) from a subject on a light receiving surface of the imaging element 4 via the main lens. In addition, the optical system 2 includes an autofocus mechanism adjusting focus according to a control signal and a zoom mechanism changing a zoom factor according to a control signal. In addition, the electronic device 1 may be configured such that the optical system 2 is detachable and replaceable with another optical system 2.

The image processing unit 5 executes predetermined image processing on the image data output from the imaging element 4. For example, the image processing unit 5 is connected to the memory 6 such as a frame memory, and writes the image data output from the imaging element 4 into the memory 6. The image processing unit 5 executes predetermined image processing on the image data written into the memory 6, and writes the image data subjected to the image processing into the memory 6 again.

The storage unit 7 is a non-volatile memory, for example, a flash memory, a hard disk drive, or the like, and stores the image data output from the image processing unit 5 in a non-volatile manner. The display unit 8 includes a display device, for example, a liquid crystal display (LCD), and a drive circuit driving the display device, and can display an image based on the image data output by the image processing unit 5. The I/F unit 9 is an interface for transmitting the image data output from the image processing unit 5 to the outside. For example, a universal serial bus (USB) can be applied as the I/F unit 9. The I/F unit 9 is not limited thereto, and may be an interface connectable to a network by wired communication or by wireless communication.

The input device 10 includes an operator or the like for receiving a user input. If the electronic device 1 is, for example, a digital still camera, a digital video camera, a mobile phone with an imaging function, or a smartphone, the input device 10 can include a shutter button for instructing the imaging element 4 to capture an image or an operator for realizing the function of the shutter button.

The control unit 3 includes a processor, for example, a central processing unit (CPU) or the like, a read only memory (ROM), and a random access memory (RAM), and controls an overall operation of the electronic device 1 using the RAM as a work memory according to a program stored in the ROM in advance. For example, the control unit 3 can control an operation of the electronic device 1 according to a user input received by the input device 10. In addition, the control unit 3 can control the autofocus mechanism in the optical system 2 on the basis of an image processing result of the image processing unit 5.

Figure 2:
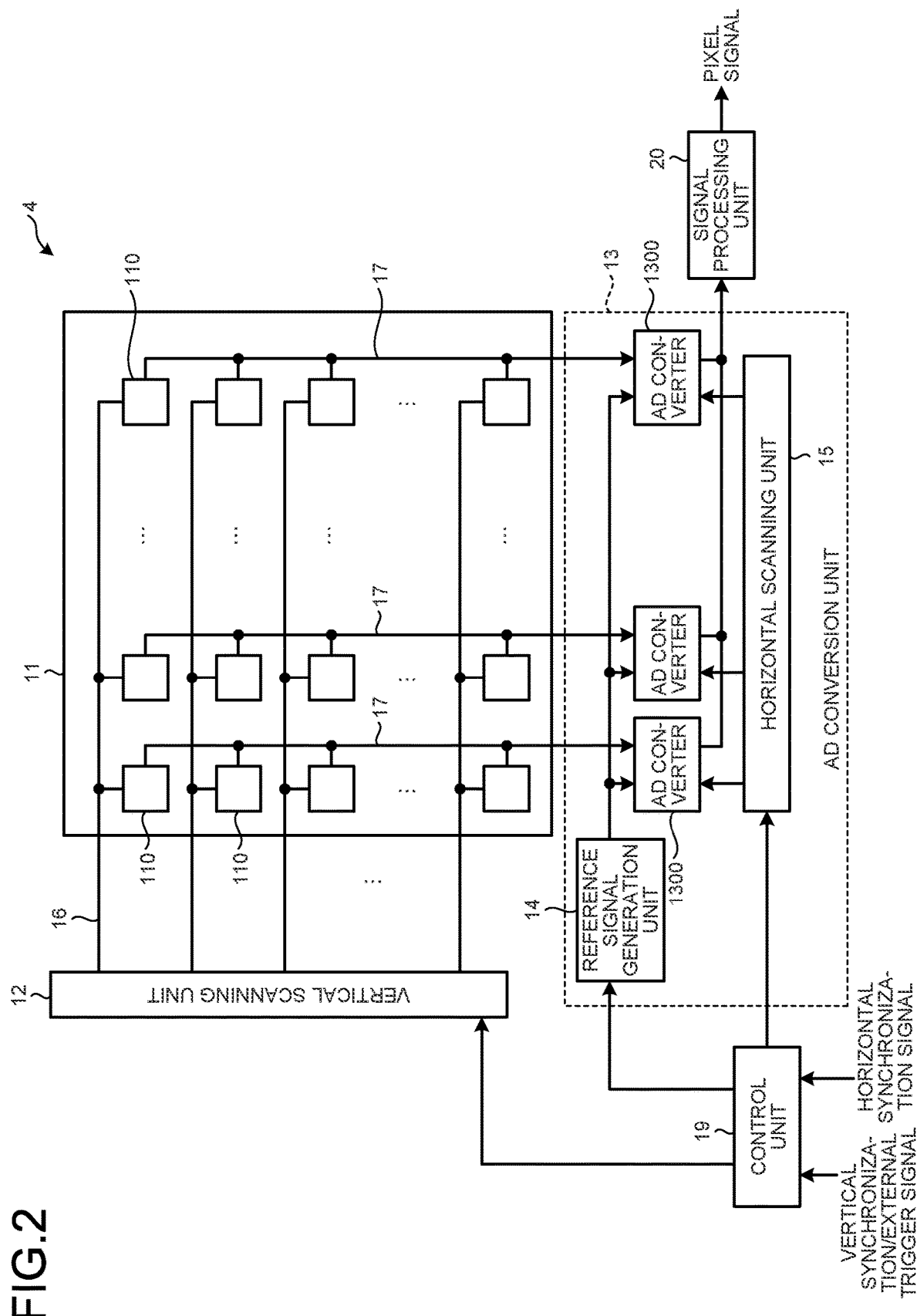
FIG. 2 is a block diagram illustrating a basic configuration example of an imaging element commonly applicable to each embodiment.

FIG. 2 is a block diagram illustrating a basic configuration example of the imaging element 4 commonly applicable to each embodiment. In FIG. 2, the imaging element 4 includes a pixel array unit 11, a vertical scanning unit 12, an analog to digital (AD) conversion unit 13, a pixel signal line 16, a vertical signal line 17, an output unit 18, a control unit 19, and a signal processing unit 20.

The pixel array unit 11 includes a plurality of pixels 110 each having a photoelectric conversion element performing photoelectric conversion of received light. As the photoelectric conversion element, a photodiode can be used. In the pixel array unit 11, the plurality of pixels 110 are arranged in a horizontal direction (row direction) and in a vertical direction (column direction) in a two-dimensional lattice pattern. In the pixel array unit 11, the arrangement of the pixels 110 in the row direction is referred to as a line. A one-frame image (image data) is formed by pixel signals read out from a predetermined number of lines in the pixel array unit 11. For example, in a case where the one-frame image is formed with 3000 pixels×2000 lines, the pixel array unit 11 includes at least 2000 lines each including at least 3000 pixels 110.

Furthermore, with respect to each row and each column of pixels 110 in the pixel array unit 11, the pixel signal line 16 is connected to each row, and the vertical signal line 17 is connected to each column.

An end of the pixel signal line 16 that is not connected to the pixel array unit 11 is connected to the vertical scanning unit 12. The vertical scanning unit 12 transmits a control signal, such as a drive pulse at the time of reading out a pixel signal from the pixel 110, to the pixel array unit 11 via the pixel signal line 16 according to control of the control unit 19, which will be described later. An end of the vertical signal line 17 that is not connected to the pixel array unit 11 is connected to the AD conversion unit 13. The pixel signal read out from the pixel is transmitted to the AD conversion unit 13 via the vertical signal line 17.

The control for reading out the pixel signal from the pixel will be schematically described. The reading-out of the pixel signal from the pixel is performed by transferring a charge accumulated in the photoelectric conversion element by exposure to a floating diffusion (FD) layer, and converting the transferred charge into a voltage in the floating diffusion layer. The voltage obtained by converting the charge in the floating diffusion layer is output to the vertical signal line 17 via an amplifier.

More specifically, in the pixel 110, during exposure, the photoelectric conversion element and the floating diffusion layer are in an off (open) state therebetween, and a charge generated by photoelectric conversion according to incident light is accumulated in the photoelectric conversion element. After the exposure is completed, the floating diffusion layer and the vertical signal line 17 are connected to each other according to a selection signal supplied via the pixel signal line 16. Further, the floating diffusion layer is reset by connecting the floating diffusion layer to a line for supplying a power supply voltage VDD or a black level voltage in a short period of time according to a reset pulse supplied via the pixel signal line 16. A reset-level voltage of the floating diffusion layer (which will be referred to as voltage P) is output to the vertical signal line 17. Thereafter, the photoelectric conversion element and the floating diffusion layer are in an on (close) state therebetween according to a transfer pulse supplied via the pixel signal line 16, and the charge accumulated in the photoelectric conversion element is transferred to the floating diffusion layer. A voltage corresponding to a charge amount of the floating diffusion layer (which will be referred to as voltage Q) is output to the vertical signal line 17.

The AD conversion unit 13 includes an AD converter 1300 provided for each vertical signal line 17, a reference signal generation unit 14, and a horizontal scanning unit 15. The AD converter 1300 is a column AD converter performing AD conversion processing with respect to each column in the pixel array unit 11. The AD converter 1300 performs AD conversion processing on the pixel signal supplied from the pixel 110 via the vertical signal line 17, and generates two digital values (values corresponding to the voltage P and the voltage Q respectively) for correlated double sampling (CDS) processing for noise reduction.

The AD converter 1300 supplies the generated two digital values to the signal processing unit 20. The signal processing unit 20 performs CDS processing on the basis of the two digital values supplied from the AD converter 1300, and generates a pixel signal (pixel data) according to a digital signal. The pixel data generated by the signal processing unit 20 is output to the outside of the imaging element 4.

The image data output from the signal processing unit 20 is supplied, for example, to the image processing unit 5 and sequentially stored in the memory 6 that is, for example, a frame buffer. When the pixel data for one frame is stored in the frame buffer, the stored pixel data is read out from the frame buffer as one-frame image data.

The reference signal generation unit 14 generates a ramp signal RAMP to be used by each AD converter 1300 to convert a pixel signal into two digital values on the basis of an ADC control signal input from the control unit 19. The ramp signal RAMP is a signal whose level (voltage value) decreases at a constant slope with respect to time, or a signal whose level decreases stepwise. The reference signal generation unit 14 supplies the generated ramp signal RAMP to each AD converter 1300. The reference signal generation unit 14 is configured using, for example, a digital-to-analog (DA) conversion circuit or the like.

Under the control of the control unit 19, the horizontal scanning unit 15 performs selective scanning to select each AD converter 1300 in a predetermined order, thereby sequentially outputting each digital value temporarily retained by each AD converter 1300 to the signal processing unit 20. The horizontal scanning unit 15 is configured using, for example, a shift register, an address decoder, etc.

The control unit 19 performs drive control of the vertical scanning unit 12, the AD conversion unit 13, the reference signal generation unit 14, the horizontal scanning unit 15, and the like. The control unit 19 generates various drive signals on which the operations of the vertical scanning unit 12, the AD conversion unit 13, the reference signal generation unit 14, and the horizontal scanning unit 15 are based. The control unit 19 generates a control signal to be supplied by the vertical scanning unit 12 to each pixel 110 via the pixel signal line 16 on the basis of a vertical synchronization signal or an external trigger signal and a horizontal synchronization signal supplied from the outside (for example, the control unit 3). The control unit 19 supplies the generated control signal to the vertical scanning unit 12.

Based on the control signal supplied from the control unit 19, the vertical scanning unit 12 supplies various signals including a drive pulse to each pixel 110 for each of pixel signal lines 16 corresponding to selected pixel rows in the pixel array unit 11, and a pixel signal is output from each pixel 110 to the vertical signal line 17. The vertical scanning unit 12 is configured using, for example, a shift register, an address decoder, etc.

The imaging element 4 configured as described above is a column AD type complementary metal oxide semiconductor (CMOS) image sensor in which the AD converter 1300 is arranged for each column.

(Outline of Color Filter Array)

Each pixel 110 can be provided with a filter selectively transmitting light having a predetermined wavelength band. When the wavelength band for transmission is a visible light wavelength band, the filter is called a color filter. Hereinafter, it is assumed that each pixel 110 is provided with a color filter having a wavelength band for one of red (R), green (G), and blue (B) constituting the three primary colors. Each pixel 110 is not limited thereto, and may be provided with a color filter for one of colors having a complementary color relationship with each other, or may be provided with a filter selectively transmitting light having an infrared wavelength band or a filter entirely transmitting light having a visible light wavelength band. Hereinafter, unless otherwise specified, these various filters will be described as color filters collectively.

Figure 3:
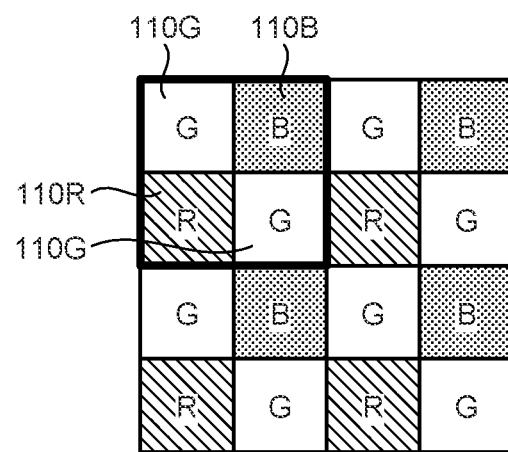
FIG. 3 is a diagram illustrating an example of a commonly used Bayer array.

FIG. 3 is a diagram illustrating an example of a commonly used Bayer array. In FIG. 3, the Bayer array includes two pixels 110G each provided with a color filter for G color, one pixel 110R provided with a color filter for R color, and a pixel 110B provided with a color filter for B color. In the Bayer array, these four pixels are arranged in a lattice pattern of 2 pixels×2 pixels such that the two pixels 110G are not adjacent to each other. In other words, the Bayer array is an array in which pixels 110 provided with color filters transmitting light having the same wavelength band are not adjacent to each other.

Note that, hereinafter, unless otherwise specified, the "pixel 110R provided with the color filter for R color" will be referred to as "R color pixel 110R" or simply as "pixel 110R". The pixel 110G provided with the color filter for G color and the pixel 110B provided with the color filter for B color will also be referred to in the same manner. Furthermore, as long as the color filter is not particularly concerned, the respective pixels 110R, 110G, and 110B will be described as pixels 110 collectively.

Figure 4:
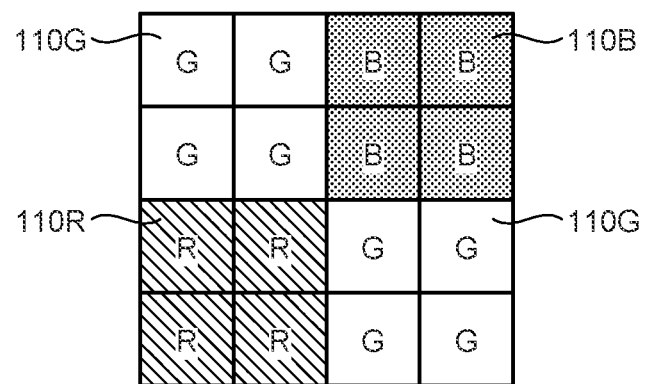
FIG. 4 is a diagram illustrating an example of a pixel configuration applicable to a first embodiment.

FIG. 4 is a diagram illustrating an example of a pixel configuration applicable to a first embodiment, which will be described later. In the pixel configuration of FIG. 4, pixel blocks each including four R color pixels 110R, four G color pixels 110G, or four B color pixels 110B are arranged in a pixel array according to the Bayer array, with each pixel block as a unit in which 2 pixels×2 pixels for the same color are arranged in a lattice pattern. Hereinafter, unless otherwise specified, such a pixel array will be referred to as a four-divided Bayer type RGB array.

More specifically, in the four-divided Bayer type RGB array, pixel blocks, each including R color pixels 110R, G color pixels 110G, or B color pixels 110B, are arranged in a 2×2 lattice pattern such that the same-color pixel blocks are not adjacent to each other, with the numbers of pixels 110R, pixels 110G, and pixels 110B in a ratio of 1:2:1. In the example of FIG. 4, the pixel blocks including the G color pixels 110G are arranged to the left of and under the pixel block including the B color pixels 110B, and the pixel block including the R color pixels 110R is arranged diagonally to the pixel block including the B color pixels 110B.

(Outline of Arrangement of OCL Commonly Applicable to Each Embodiment)

Figure 5:
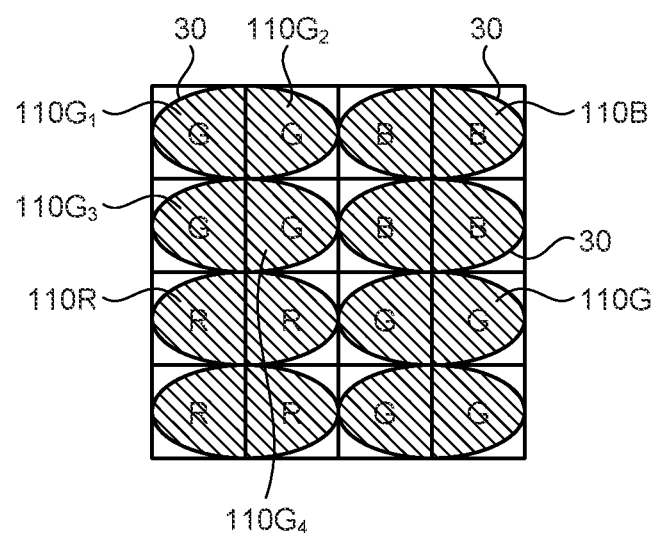
FIG. 5 is a diagram schematically illustrating an example in which one OCL is provided for two pixels, which is applicable to each embodiment.

Each pixel 110 arranged in the pixel array unit 11 is provided with an on-chip lens (OCL) corresponding thereto. In each embodiment, one OCL is provided to be shared in common by a plurality of pixels 110 adjacent to each other. FIG. 5 is a diagram schematically illustrating an example in which one OCL is provided for two pixels 110, which is applicable to each embodiment.

Four G color pixels $110G_1$, $110G_2$, $110G_3$, and $110G_4$ in the four-divided Bayer type RGB array illustrated in FIG. 5 as an example will be described in more detail. In FIG. 5, one OCL 30 is provided for a set of two pixels $110G_1$ and $110G_2$ adjacent to each other in the horizontal direction. Similarly, one OCL 30 is provided for a set of two pixels $110G_3$ and $110G_4$ adjacent to each other in the horizontal direction. Similarly, for the R color pixels 110R and the B color pixels 110B, one OCL 30 is provided for each of a set of two pixels 110R adjacent to each other in the horizontal direction and a set of two pixels 110B adjacent to each other in FIG. 5.

Note that, hereinafter, one OCL 30 and a set of a plurality of adjacent pixels 110 sharing the OCL 30 in common will be collectively referred to as "pixel set" if appropriate. In the example of FIG. 5, the pixel set includes two pixels 110 adjacent to each other in the horizontal direction of the pixel array unit 11. Note that, hereinafter, in each drawing illustrating that the pixels 110 are arranged in a two-dimensional lattice pattern as in FIG. 5, a left-right direction of the drawing will be described as the horizontal direction, and an up-down direction of the drawing will be described as the vertical direction.

Figure 6:
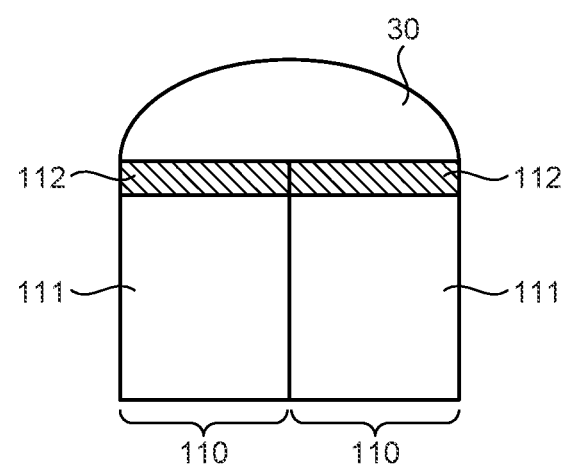
FIG. 6 is a diagram schematically illustrating a cross section of a pixel set applicable to each embodiment.

FIG. 6 is a diagram schematically illustrating a cross section of a pixel set applicable to each embodiment. In the example of FIG. 6, the pixel set includes two pixels 110 arranged adjacent to each other. In FIG. 6, each of the two pixels 110 included in the pixel set schematically has a structure in which a color filter 112 is provided on an incident surface of a photoelectric conversion unit 111 generating a charge according to incident light. The two color filters 112 included in one pixel set transmit light having the same wavelength band. An OCL 30 is provided across the respective color filters 112 of the two pixels 110 to be shared in common by the two pixels 110.

(Concerning Image Plane Phase Difference AF Technique)

Next, an image plane phase difference AF technique will be schematically described. In the image plane phase difference AF technique, autofocus control and parallax detection are performed on the basis of a phase difference of a pixel signal extracted from each of pixels 110 whose positions are different from each other. In the example of FIG. 5, for a pixel set including, for example, two pixels $110G_1$ and $110G_2$ with one OCL 30 shared in common thereby, a phase difference of a pixel signal from each of the pixels $110G_1$ and $110G_2$ is detected, and information for performing, for example, autofocus control is acquired on the basis of the detected phase difference.

Figure 7:
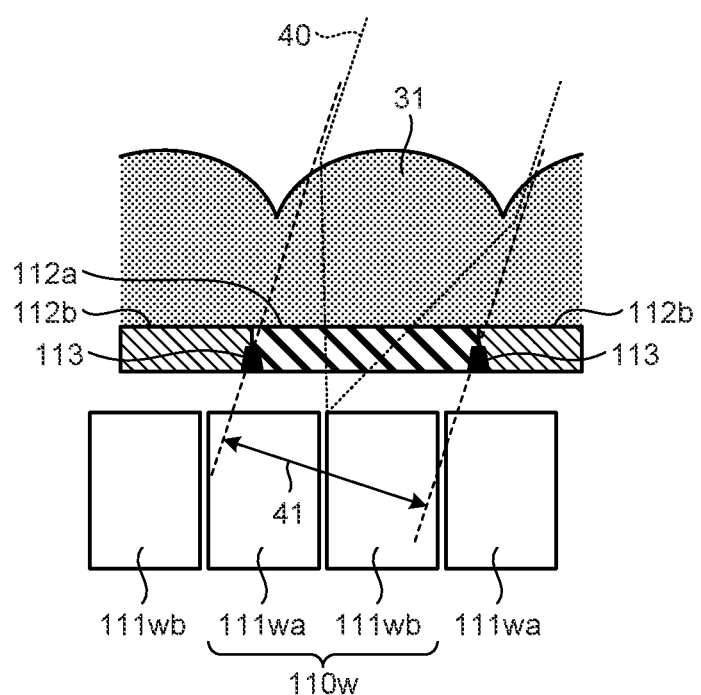
FIG. 7 is a diagram for describing a first example of a method according to a conventional art for realizing an image plane phase difference AF technique.

FIG. 7 is a diagram for describing a first example of a method according to a conventional art for realizing the image plane phase difference AF technique. In the first example, one pixel 110w includes two photoelectric conversion units 111wa and 111wb arranged adjacent to each other. The photoelectric conversion units 111wa and 111wb are provided with one color filter 112a and one OCL 31 shared in common thereby. A light shielding body 113 is provided between the color filter 112a and another color filter 112b arranged adjacent to the color filter 112a and having a different wavelength band for transmission from the color filter 112a to suppress leakage of light between the color filter 112a and the color filter 112b.

In such a configuration, by detecting a phase difference of a pixel signal, for example, from each of the photoelectric conversion units 111wa and 111wb, the image plane phase difference AF and the parallax detection can be realized. That is, in the configuration of FIG. 7, the pixel 110w including the two photoelectric conversion units 111wa and 111wb arranged adjacent to each other is a phase difference detection pixel. Hereinafter, the "phase difference detection pixel" will be described as "phase difference pixel" if appropriate.

Here, in the example of FIG. 7, the color filter 112a (light shielding body 113) and the OCL 31 are disposed to be shifted by a predetermined distance in a right direction of FIG. 7 with respect to the incident surface of each of the photoelectric conversion units 111wa and 111wb included in the pixel 110w. Thus, a pupil correction is made to light 40 incident on the incident surface in a diagonal direction. By performing the pupil correction, the light 40 can be incident on the incident surface in an appropriate range 41, and accuracy in the image plane phase difference AF and the parallax detection can be improved.

A pupil correction amount, that is, an amount in which the color filter 112a (light shielding body 113) and the OCL 31 are shifted with respect to the incident surface, is set depending on an image height with respect to an optical axis position of a main lens in the pixel array in which the pixels 110w are arranged. For example, the higher position of image height at which the pixels 110w are arranged, the larger pupil correction amount. For example, the pupil correction amount in the pixels 110w arranged at a position (image height center) corresponding to the optical axis position of the main lens in the pixel array is 0.

According to the configuration illustrated in FIG. 7, the pupil correction amount is fixed for each image height. Therefore, in order to achieve accuracy, it is necessary to use a main lens having an exit pupil distance (EPD) corresponding to the pupil correction amount. As a result, in a case where the main lens is replaced with another main lens having a different EPD by replacing a lens or the like, or in a case where the EPD changes due to a zoom operation, it is difficult to obtain high accuracy.

Figure 8A:
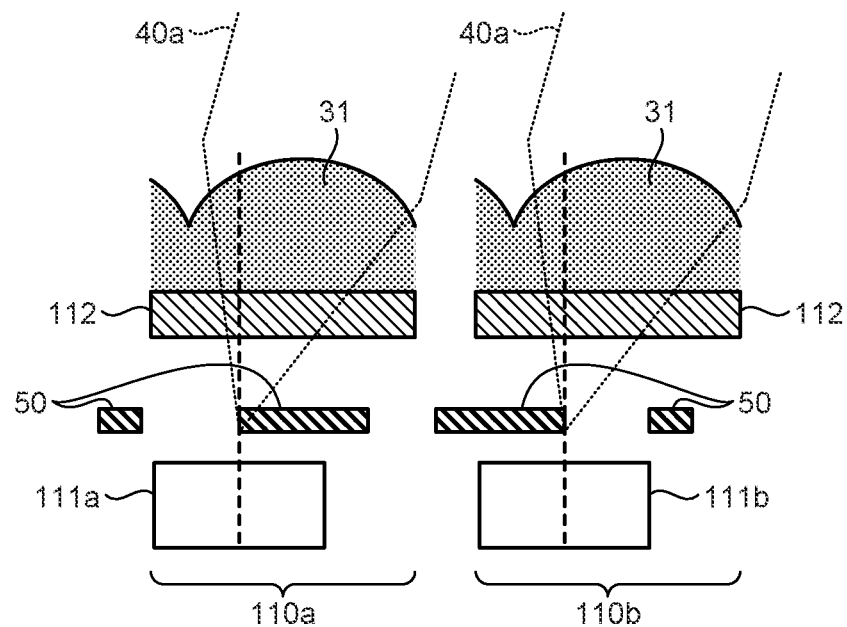
FIG. 8A is a diagram for describing a second example of a method according to a conventional art for realizing the image plane phase difference AF technique.
Figure 8B:
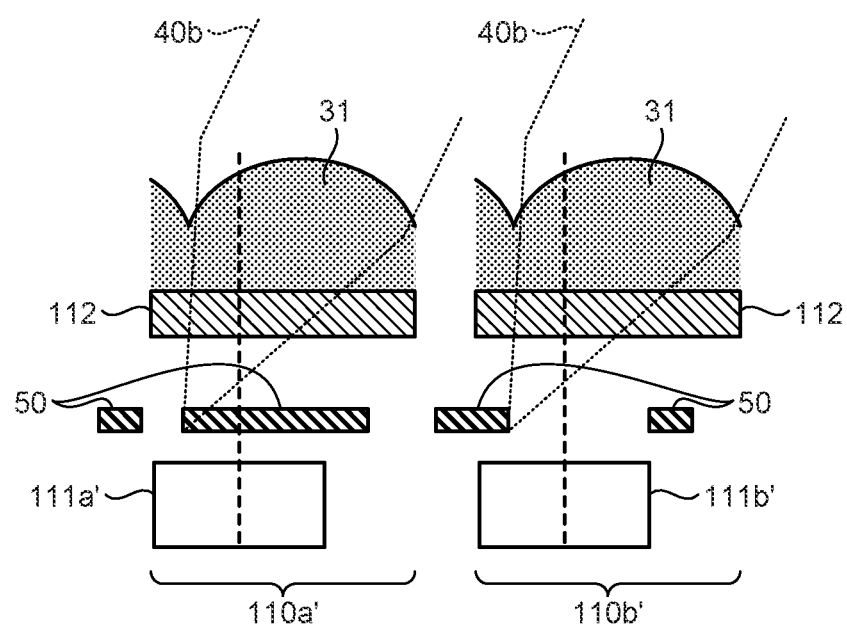
FIG. 8B is a diagram for describing the second example of the method according to the conventional art for realizing the image plane phase difference AF technique.

FIGS. 8A and 8B are diagrams for describing a second example of a method according to a conventional art for realizing the image plane phase difference AF technique. In the second example, phase difference pixels are provided separately from pixels for forming an image in a pixel array. In the example of FIG. 8A, two pixels 110a and 110b are illustrated as an example of the phase difference pixel.

In FIG. 8A, each of the pixels 110a and 110b includes one photoelectric conversion unit 111a or 111b. In the pixel 110a, a right half of an incident surface of the photoelectric conversion unit 111a in FIG. 8A is light-shielded using a light shielding body 50, and a left half thereof is in an open state. On the other hand, in the pixel 110b, a left half of an incident surface of the photoelectric conversion unit 111b in FIG. 8A is light-shielded using a light shielding body 50, and a right half thereof is in an open state.

The pixels 110a and 110b are arranged close to (for example, adjacent to) each other in a direction in which positions of openings of the light shielding bodies 50 are shifted with respect to the respective photoelectric conversion units 111a and 111b. By detecting a phase difference of a pixel signal from each of the pixels 110a and 110b, the image plane phase difference AF and the parallax detection can be realized. That is, in the second example, it can be considered that one phase difference pixel is constituted by the two pixels 110a and 110b.

Here, in the example of FIG. 8A, it is illustrated that the pixels 110a and 110b are arranged on a left end side of a pixel array of FIG. 8A. In the pixels 110a and 110b, OCLs 31 are arranged to be shifted to the right with respect to the incident surfaces of the photoelectric conversion units 111a and 111b, respectively, in FIG. 8A, and pupil corrections are made according to positions (image heights) on the pixel array.

In the second example, another phase difference pixel in which a pupil correction is made in a different amount from those of the pixels 110a and 110b is provided at a position where an image height thereof is substantially the same as those of the pixels 110a and 110b on the pixel array.

FIG. 8B is a diagram illustrating an example of another phase difference pixel according to the second example. In the example of FIG. 8B, pupil corrections are made in a larger amount to correspond to a main lens having a shorter EPD in two pixels 110a' and 110b' constituting a phase difference pixel, relative to those made in the pixels 110a and 110b illustrated in FIG. 8A.

In FIG. 8B, in the pixel 110a', a portion of a photoelectric conversion unit 111a' opened by a light shielding body 50 is narrower toward a left end side as compared with that in the pixel 110a illustrated in FIG. 8A. On the other hand, in the pixel 110b', a portion of a photoelectric conversion unit 111b' opened by a light shielding body 50 is wider toward a right direction as compared with that in the pixel 110b illustrated in FIG. 8A. That is, in the configuration of FIG. 8B, pupil corrections can be made to light 40a' and 40b' incident at a larger angle than light 40a and 40b to which pupil corrections can be made in the pixels 110a and 110b of FIG. 8A.

In the second example, by arranging a plurality of phase difference pixels in which pupil corrections are made in different amounts for a pixel array as described above, it is possible to widen an EPD range in which autofocus processing by image plane phase difference AF can be performed. However, in the second example, since the phase difference pixels are not used as pixels for forming an image, if the phase difference pixels with different pupil correction amounts are arranged in a large number, the number of pixels for forming an image decreases, and an image quality deteriorates.

First Embodiment

Figure 9:
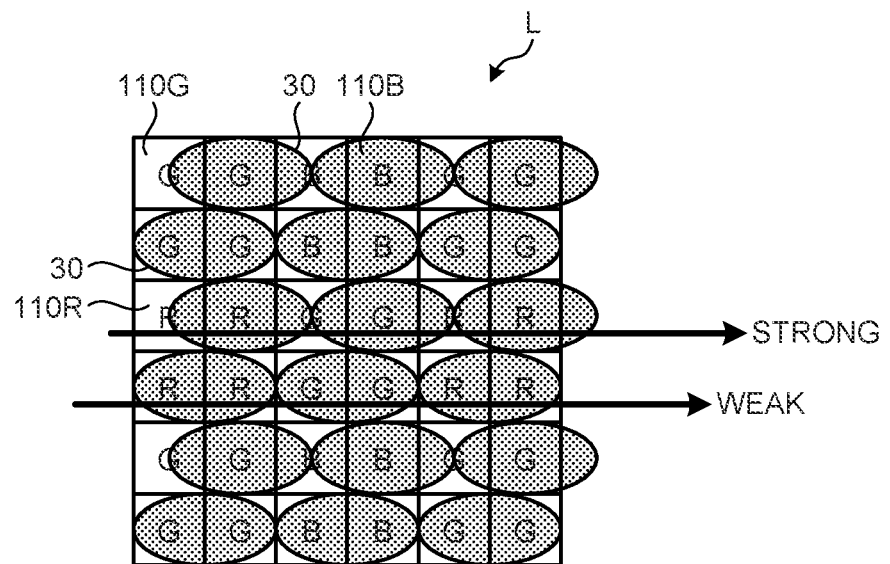
FIG. 9 is a diagram illustrating an example of the pixel configuration according to the first embodiment.

Next, a first embodiment will be described. FIG. 9 is a diagram illustrating an example of a pixel configuration according to the first embodiment. Note that FIG. 9 illustrates an example of a pixel configuration in a left end side region L of FIG. 10 with respect to an image height center in a pixel array unit 11 schematically illustrated in FIG. 10.

In FIG. 9, each of pixels 110R, 110G, and 110B is arrayed in the four-divided Bayer type described with reference to FIG. 4, and each pixel block includes four pixels 110R, four pixels 110G, or four pixels 110B. In addition, as described with reference to FIG. 5, a pixel set is constituted by arranging one OCL 30 to be shared in common by two same-color pixels adjacent to each other in the horizontal direction among the respective pixels 110R, 110G, and 110B. That is, each pixel block includes two pixel sets, i.e., a pixel set including two pixels at an upper stage and a pixel set including two pixels at a lower stage.

Here, in the first embodiment, the two pixel sets included in each pixel block are different from each other in pupil correction amount. More specifically, in a pixel set at an upper stage of each pixel block in FIG. 9, a strong pupil correction is made in a larger pupil correction amount in a right direction toward the image height center in FIG. 9 (hereinafter, referred to as "strong pupil correction"). Furthermore, in a pixel set at a lower stage of each pixel block in FIG. 9, a weak pupil correction is made in a smaller pupil correction amount than that made in the pixel set at the upper stage of the pixel block in the right direction toward the image height center in FIG. 9 (hereinafter, referred to as "weak pupil correction").

As described above, in the first embodiment, in a pixel block in which same-color pixels 110 are arranged in an array of 2 pixels×2 pixels, two pixel sets included in the pixel block are different from each other in pupil correction amount. Therefore, a pupil correction can be appropriately made for each of two types of main lenses which are different from each other in EPD.

The pupil correction according to the first embodiment will be described in more detail with reference to FIGS. 11A and 11B.

Figure 11A:
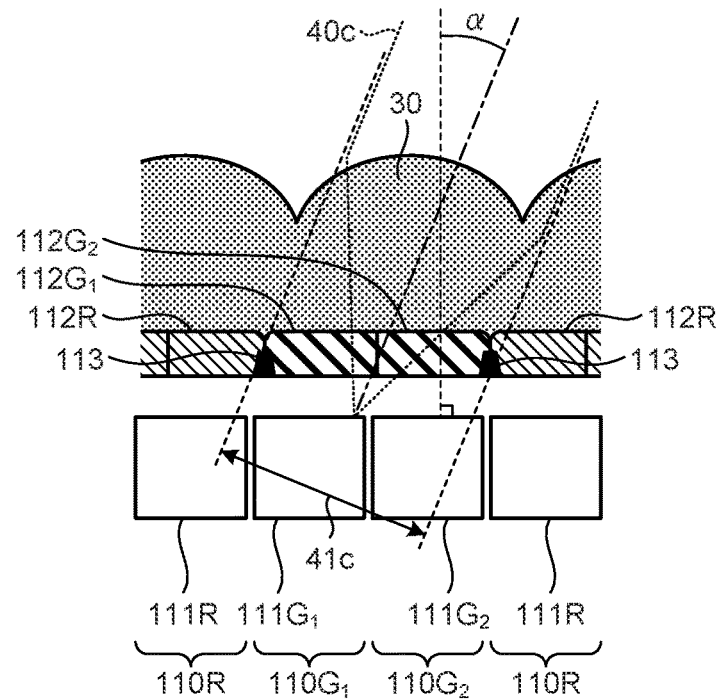
FIG. 11A is a diagram schematically illustrating a cross section of a pixel set in which a strong pupil correction is made according to the first embodiment.

FIG. 11A is a diagram schematically illustrating a cross section of a pixel set in which a strong pupil correction is made according to the first embodiment. FIG. 11A corresponds to a cross section of the pixel set at the upper stage of each pixel block illustrated in FIG. 9 as described above. For example, for a pixel block including four pixels 110G, the pixel set including two pixels $110G_1$ and $110G_2$ at the upper stage of the pixel block is used as an example with reference to FIG. 5 for description.

In FIG. 11A, color filters $112G_1$ and $112G_2$ provided in the pixels $110G_1$ and $110G_2$, respectively, are arranged to be shifted in position toward the image height center (in the right direction of FIG. 11A) with respect to incident surfaces of photoelectric conversion units $111G_1$ and $111G_2$ of the pixels $110G_1$ and $110G_2$, respectively. Furthermore, an OCL 30 provided to be shared in common by the pixels $110G_1$ and $110G_2$ is disposed to be shifted in position toward the image height center with respect to the color filters $112G_1$ and $112G_2$.

In this manner, the photoelectric conversion units $111G_1$ and $111G_2$, the color filters $112G_1$ and $112G_2$, and the OCL 30 are arranged to be each shifted in position in the same direction. Thus, in each of the pixels $110G_1$ and $110G_2$, a pupil correction is made to light 40c incident on an incident surface of each of the photoelectric conversion units $111G_1$ and $111G_2$ at a predetermined incident angle α.

This pupil correction is made on the basis of a pupil correction amount according to an amount in which each OCL 30 provided to be shared in common by the color filters $112G_1$ and $112G_2$ and the pixels $110G_1$ and $110G_2$ is shifted with respect to each of the photoelectric conversion units $111G_1$ and $111G_2$. Through this pupil correction, the light 40c can be incident on the incident surfaces of the photoelectric conversion units $111G_1$ and $111G_2$ at the incident angle α in an appropriate range 41c.

Figure 11B:
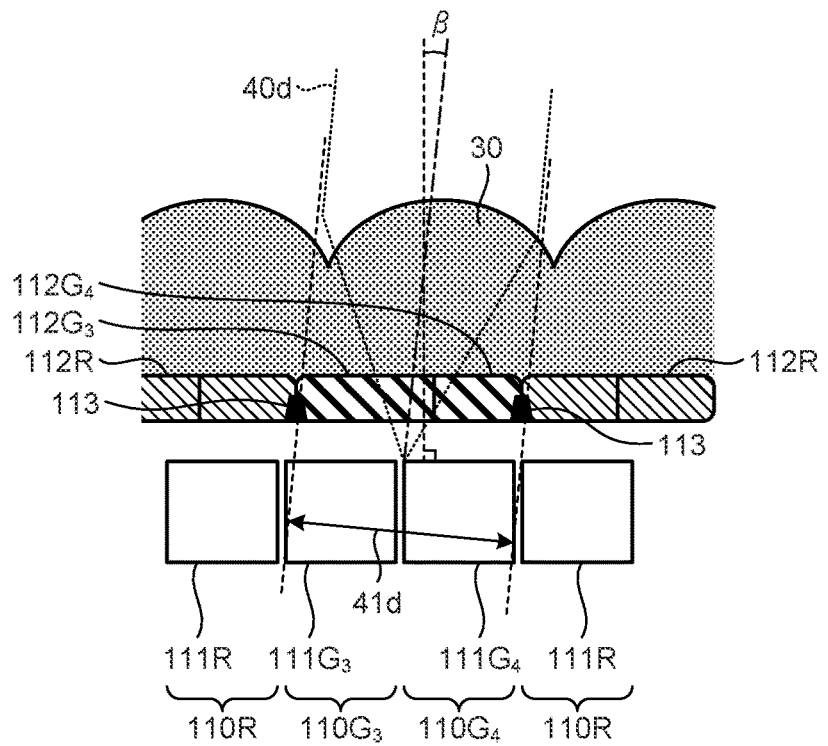
FIG. 11B is a diagram schematically illustrating a cross section of a pixel set in which a weak pupil correction is made according to the first embodiment.

FIG. 11B is a diagram schematically illustrating a cross section of a pixel set in which a weak pupil correction is made according to the first embodiment. FIG. 11B corresponds to a cross section of the pixel set at the lower stage of each pixel block illustrated in FIG. 9 as described above. For example, for a pixel block including four pixels 110G, the pixel set including two pixels $110G_3$ and $110G_4$ at the lower stage of the pixel block is used as an example with reference to FIG. 5 for description.

In FIG. 11B, color filters $112G_3$ and $112G_4$ provided in the pixels $110G_3$ and $110G_4$, respectively, are arranged to be shifted in position toward the image height center (in the right direction of FIG. 11B), in an amount smaller than that in the case of FIG. 11A, with respect to incident surfaces of photoelectric conversion units $111G_3$ and $111G_4$ of the pixels $110G_3$ and $110G_4$, respectively. Furthermore, an OCL 30 provided to be shared in common by the pixels $110G_3$ and $110G_4$ is disposed to be shifted in position toward the image height center, in an amount smaller than that in the case of FIG. 11A, with respect to the color filters $112G_3$ and $112G_4$.

In this manner, the photoelectric conversion units $111G_3$ and $111G_4$, the color filters $112G_3$ and $112G_4$, and the OCL 30 are arranged to be each shifted in position in the same direction in an amount smaller than that in the case of FIG. 11A. Thus, in each of the pixels $110G_3$ and $110G_4$, a pupil correction is made to light 40d incident on an incident surface of each of the photoelectric conversion units $111G_3$ and $111G_4$ at a predetermined incident angle β smaller than the incident angle α.

This pupil correction is made on the basis of a pupil correction amount according to an amount in which each OCL 30 provided to be shared in common by the color filters $112G_3$ and $112G_4$ and the pixels $110G_3$ and $110G_4$ is shifted with respect to each of the photoelectric conversion units $111G_3$ and $111G_4$. Through this pupil correction, the light 40*d* can be incident on the incident surfaces of the photoelectric conversion units $111G_3$ and $111G_4$ in an appropriate range 41*d*.

Note that, in the configurations of FIGS. 11A and 11B, for example, a metal film (metal mask) for restricting the incident light can be further provided. Taking FIG. 11A as an example, it may be considered to provide a metal mask having an opening that is shifted in position with respect to each of the photoelectric conversion units 111R, $111G_1$, and $111G_2$ according to the pupil correction amount between each of the photoelectric conversion units 111R, $111G_1$, and $111G_2$ and each of the color filters 112R, $112G_1$, and $112G_2$.

Figure 12:
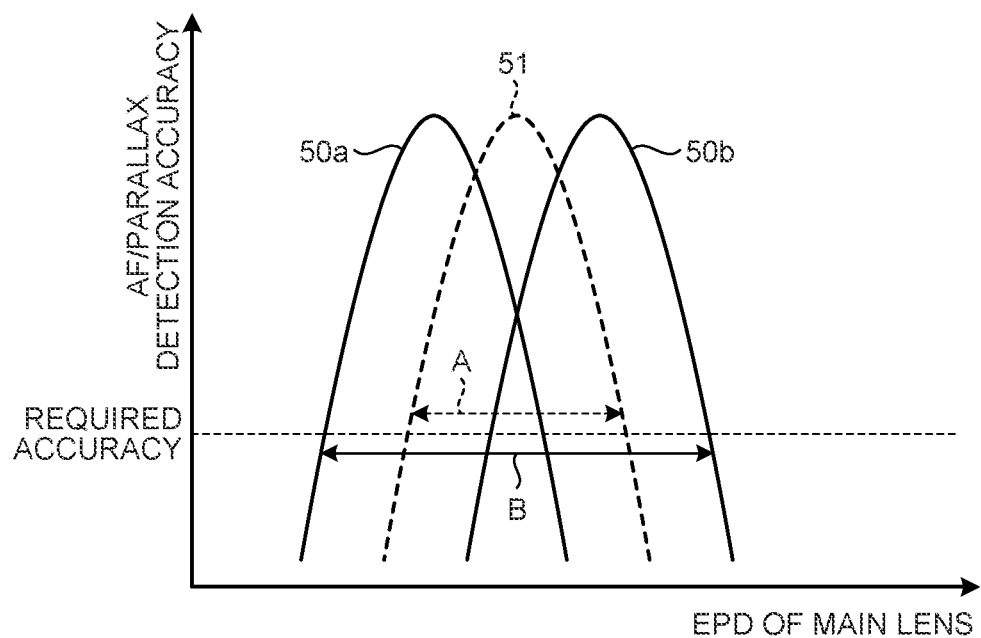
FIG. 12 is a diagram for describing an effect in a case where pupil corrections are made in a plurality of pupil correction amounts in one pixel block according to the first embodiment.

FIG. 12 is a diagram for describing an effect in a case where pupil corrections are made in a plurality of pupil correction amounts in one pixel block according to the first embodiment. FIG. 12 is a diagram schematically illustrating autofocus (AF) and parallax detection accuracy with respect to an EPD of a main lens. In FIG. 12, a horizontal axis represents the EPD of the main lens, and a vertical axis represents the AF and parallax detection accuracy (AF/parallax detection accuracy).

In FIG. 12, a characteristic line 51 is for schematically illustrating an example of AF/parallax detection accuracy in a case where a pupil correction is performed in a pupil correction amount corresponding to an EPD of a specific main lens. A peak position of the characteristic line 51 corresponds to the EPD of the main lens, and the AF/parallax detection accuracy attenuates with an expansion of the EPD of the main lens in an EPD direction.

In FIG. 12, a characteristic line 50*a* illustrates an example in a case where a strong pupil correction is made, and a characteristic line 50*b* illustrates an example in a case where a weak pupil correction is made. In this example, as indicated by the characteristic line 50*a*, the strong pupil correction is set to have a peak at an EPD shorter than the EPD of the specific main lens indicated by the characteristic line 51. On the other hand, as indicated by the characteristic line 50*b*, the weak pupil correction is set to have a peak at an EPD longer than the EPD of the specific main lens indicated by the characteristic line 51.

Here, required AF/parallax detection accuracy (required accuracy) is set with a margin with respect to the respective peaks of the characteristic lines 50*a*, 50*b*, and 51. In the example of FIG. 12, the required accuracy is set to be lower than a position of a point at which the characteristic lines 50*a* and 50*b* intersect with each other.

In this case, an EPD range in which the required accuracy can be obtained when the pupil correction is made in the pupil correction amount corresponding to the EPD of the specific main lens is set as range A based on the characteristic line 51. In this case, when zooming is performed in a wide range, for example, from a wide angle to a telescopic angle, it is difficult to execute autofocusing with accuracy required in a relatively wide range between the wide angle and the telescopic angle.

On the other hand, when the strong pupil correction and the weak pupil correction are combined together, as indicated by the characteristic lines 50*a* and 50*b*, an overlapping portion occurs between an EPD range in which the required accuracy can be obtained by the strong pupil correction and an EPD range in which the required accuracy can be obtained by the weak pupil correction. Thus, in a case where the strong pupil correction and the weak pupil correction are combined together, the required accuracy can be obtained at an EPD in range B wider than the range A. Therefore, even in a case where zooming is performed in a wide range from a wide angle to a telescopic angle as described above, autofocusing can be executed with an accuracy required on each of the wide angle side and the telescopic angle side.

(Specific Example of Pupil Correction According to First Embodiment)

Figure 10:
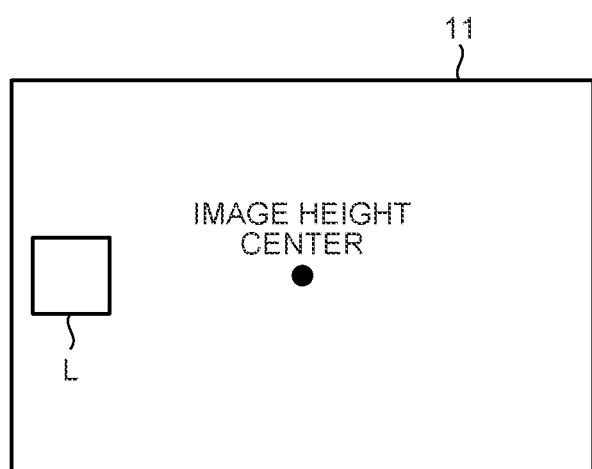
FIG. 10 is a diagram schematically illustrating a pixel array unit.

In the above description, as illustrated in FIG. 10, the pupil correction according to the first embodiment has been described using the left end side region L of FIG. 10 with respect to the image height center of the pixel array unit 11 as an example. Actually, a pupil correction according to the image height and the direction toward the image height center is executed in each direction with respect to the image height center of the pixel array unit 11.

Figure 13:
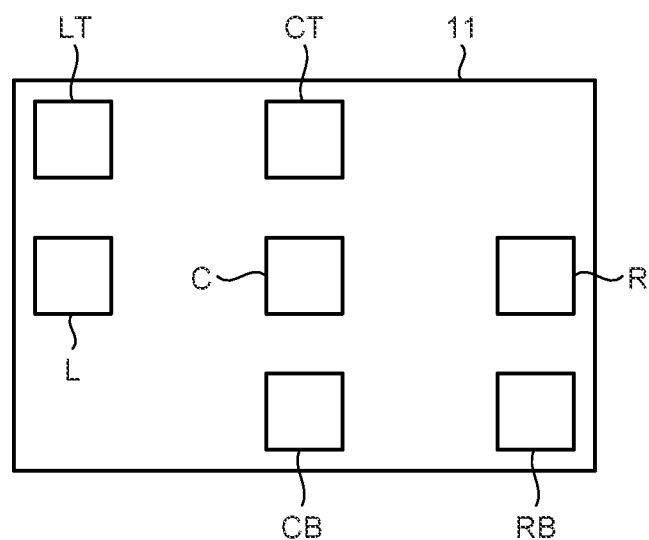
FIG. 13 is a diagram illustrating an example in which respective regions are located in different directions with respect to an image height center in the pixel array unit.

FIG. 13 is a diagram illustrating an example in which respective regions are located in different directions with respect to the image height center in the pixel array unit 11. In FIG. 13, region C is a region corresponding to the image height center. Regions L and R are end regions in the horizontal direction, respectively, with respect to the image height center. Regions CT and CB are end regions in the vertical direction, respectively, with respect to the image height center. In addition, regions LT and RB are upper-left and lower-right end (corner) regions, respectively, with respect to the image height center in FIG. 13.

Examples of directions of pupil corrections in the above-described regions C, L, R, CT, CB, LT, and RB according to the first embodiment will be described with reference to FIGS. 14A to 14G. Note that, in FIGS. 14A to 14G, "none" at a right end indicates that no pupil correction is made in a corresponding row. In addition, "strong" at the right end indicates that a strong pupil correction is made in a corresponding row, and "weak" indicates that a weak pupil correction is made in a corresponding row.

Figure 14A:
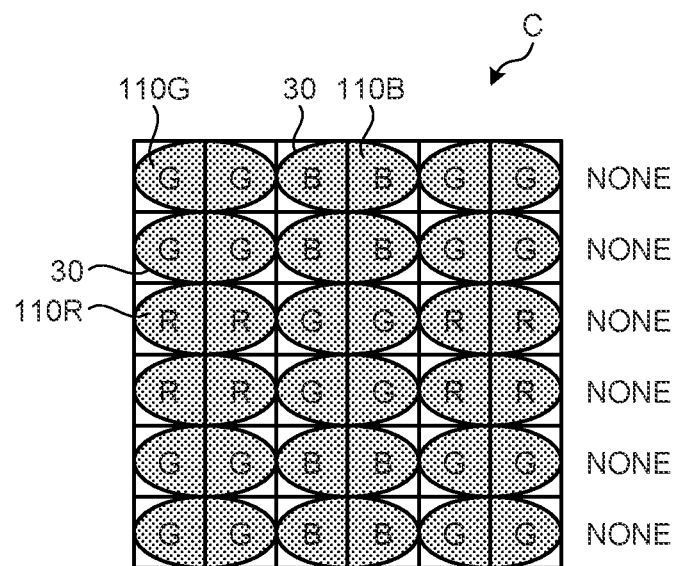
FIG. 14A is a diagram illustrating an example of a pupil correction in region C according to the first embodiment.

FIG. 14A is a diagram illustrating an example of a pupil correction in the region C according to the first embodiment. In the region C, as indicated at the right end of each row in FIG. 14A, no pupil correction is made in each pixel set of each pixel block.

Figure 14B:
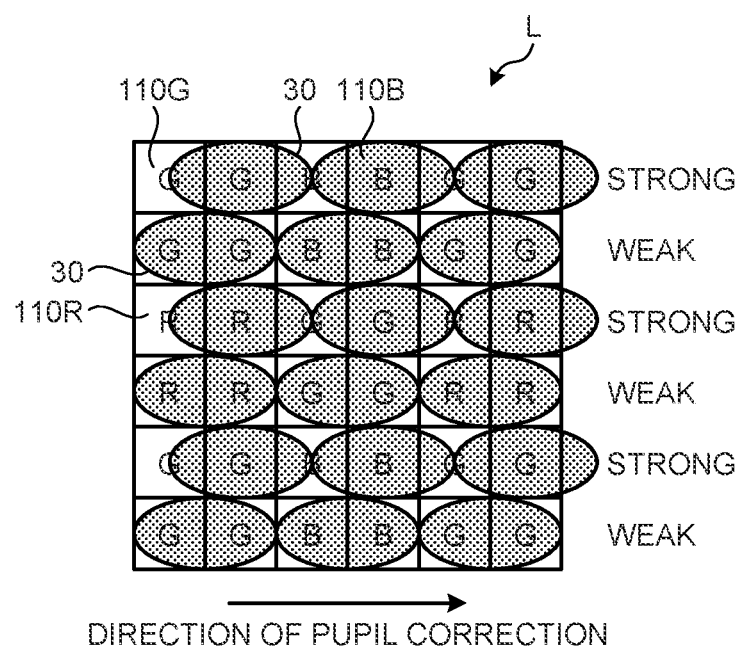
FIG. 14B is a diagram illustrating an example of a pupil correction in region L according to the first embodiment.

FIG. 14B is a diagram illustrating an example of a pupil correction in the region L according to the first embodiment. FIG. 14B is a diagram that is the same as FIG. 9 described above. In the region L, toward a right side (image height center) of FIG. 14B, a strong pupil correction is made in a pixel set at an upper stage of each pixel block and a weak pupil correction is made in a pixel set at a lower stage of each pixel block.

Figure 14C:
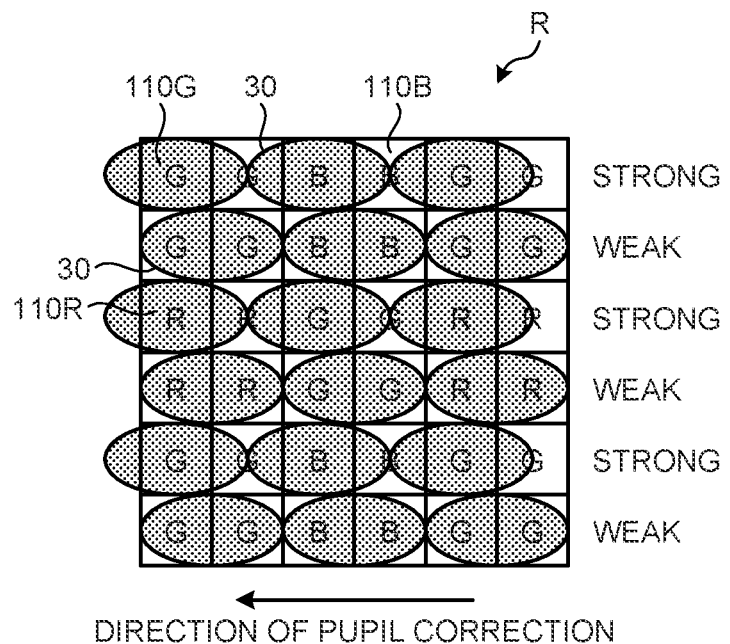
FIG. 14C is a diagram illustrating an example of a pupil correction in region R according to the first embodiment.

FIG. 14C is a diagram illustrating an example of a pupil correction in the region R according to the first embodiment. In the region R, toward a left side (image height center) of FIG. 14C, a strong pupil correction is made in a pixel set at an upper stage of each pixel block and a weak pupil correction is made in a pixel set at a lower stage of each pixel block.

Figure 14D:
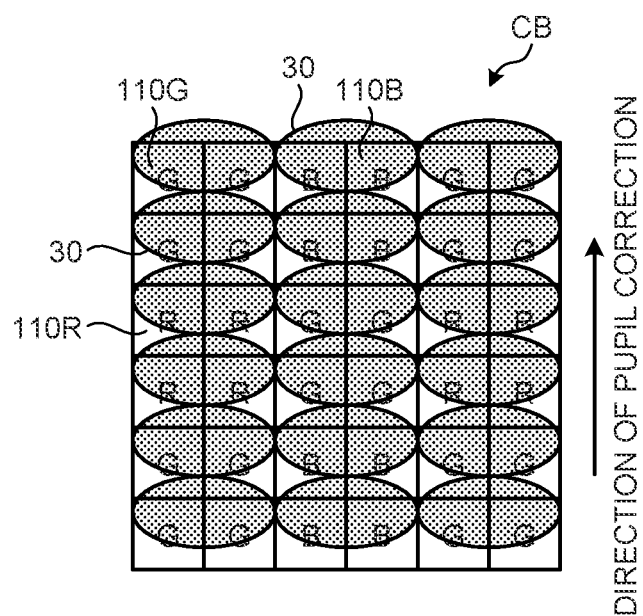
FIG. 14D is a diagram illustrating an example of a pupil correction in region CB according to the first embodiment.

FIG. 14D is a diagram illustrating an example of a pupil correction in the region CB according to the first embodiment. In the region CB, toward an upper side (image height center) of FIG. 14D, pupil corrections are made in the same pupil correction amount in pixel sets at upper and lower stages of each pixel block.

Figure 14E:
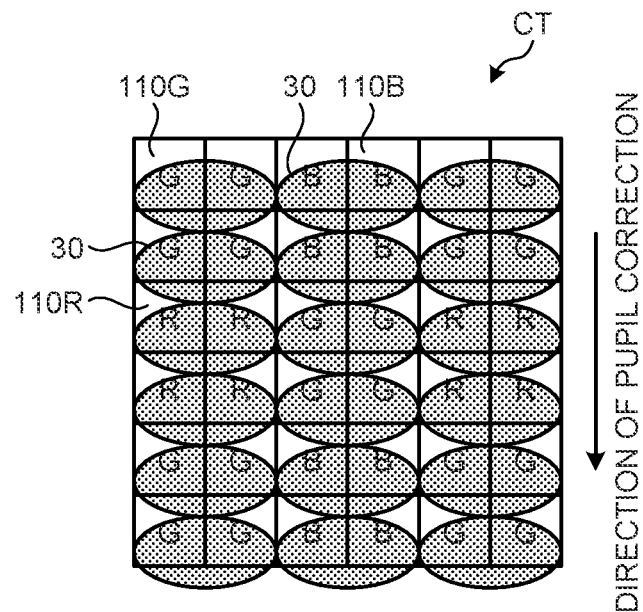
FIG. 14E is a diagram illustrating an example of a pupil correction in region CT according to the first embodiment.

FIG. 14E is a diagram illustrating an example of a pupil correction in the region CT according to the first embodiment. In the region CT, toward a lower side (image height center) of FIG. 14E, pupil corrections are made in the same pupil correction amount in pixel sets at upper and lower stages of each pixel block.

Figure 14F:
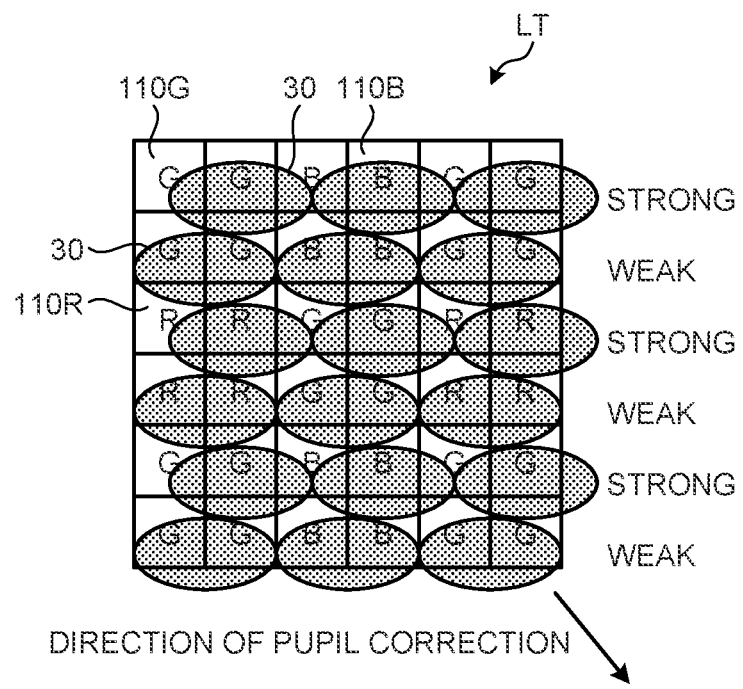
FIG. 14F is a diagram illustrating an example of a pupil correction in region LT according to the first embodiment.

FIG. 14F is a diagram illustrating an example of a pupil correction in the region LT according to the first embodiment. In the region LT, toward a lower-right side (image height center) of FIG. 14F in a diagonal direction, a strong pupil correction is made in a pixel set at an upper stage of each pixel block and a weak pupil correction is made in a pixel set at a lower stage of each pixel block. In the example of FIG. 14F, in the region LT, the pupil correction is made in a direction in which the direction (right side) of the pupil correction in the region L of FIG. 14B and the direction (lower side) of the pupil correction in the region CT of FIG. 14E are combined.

Figure 14G:
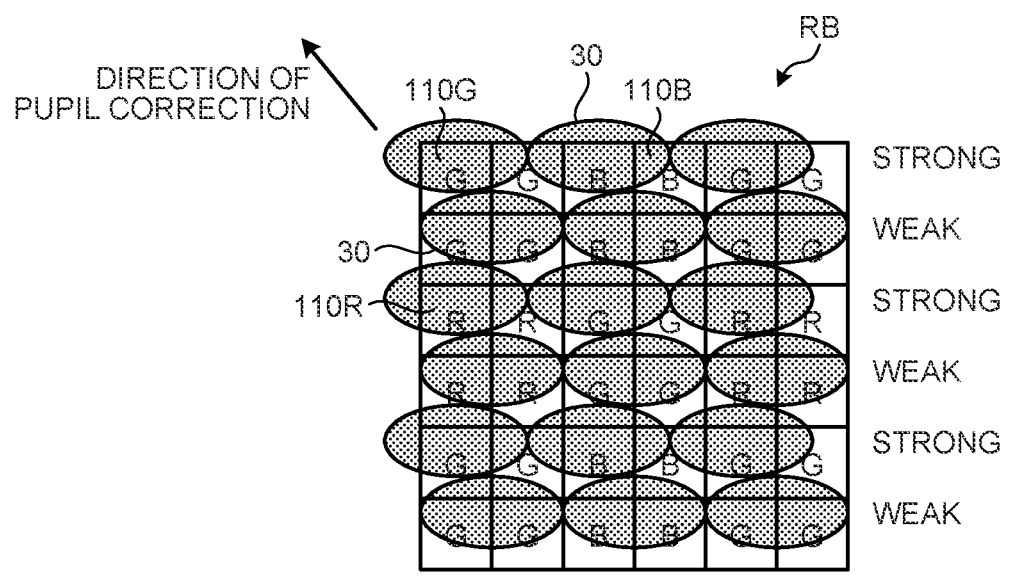
FIG. 14G is a diagram illustrating an example of a pupil correction in region RB according to the first embodiment.

FIG. 14G is a diagram illustrating an example of a pupil correction in the region RB according to the first embodiment. In the region RB, toward an upper-left side (image height center) of FIG. 14G in a diagonal direction, a strong pupil correction is made in a pixel set at an upper stage of each pixel block and a weak pupil correction is made in a pixel set at a lower stage of each pixel block. In the example of FIG. 14G, in the region RB, the pupil correction is made in a direction in which the direction (left side) of the pupil correction in the region R of FIG. 14C and the direction (upper side) of the pupil correction in the region CB of FIG. 14D are combined.

Note that, in addition to the pupil correction in each direction with respect to the image height center as described above, the pupil correction amount can be changed according to an image height.

Furthermore, it has been described above that in all regions included in the pixel array unit 11, other than the regions each having a predetermined width in the horizontal direction including the regions C, CT, and CB, each pixel block includes a pixel set in which a strong pupil correction is made and a pixel set in which a weak pupil correction is made. However, the pixel block is not limited to this example. For example, in all regions included in the pixel array unit 11, other than the regions each having a predetermined width in the horizontal direction including the region C, the regions C, CT, and CB, at least one pixel block may include a pixel set in which a strong pupil correction is made and a pixel set in which a weak pupil correction is made.

(Read-Out Method in Each Pixel Block According to First Embodiment)

Next, a method of reading out a signal from each pixel 110 (photoelectric conversion unit 111) in each pixel block according to the first embodiment will be described. In the first embodiment, in each pixel block, a first reading-out method in which a signal from each pixel 110 is individually read out and a second reading-out method in which signals from respective pixels 110 are added together and read out in a lump can be executed.

Figure 15:
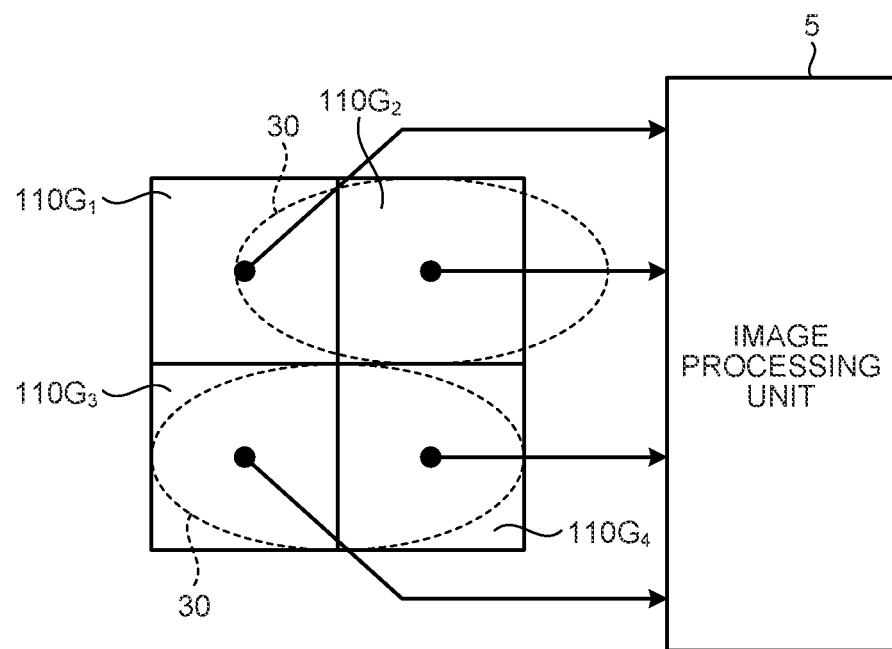
FIG. 15 is a diagram for describing a first method in which a signal is read out from each pixel in each pixel block according to the first embodiment.
Figure 16:
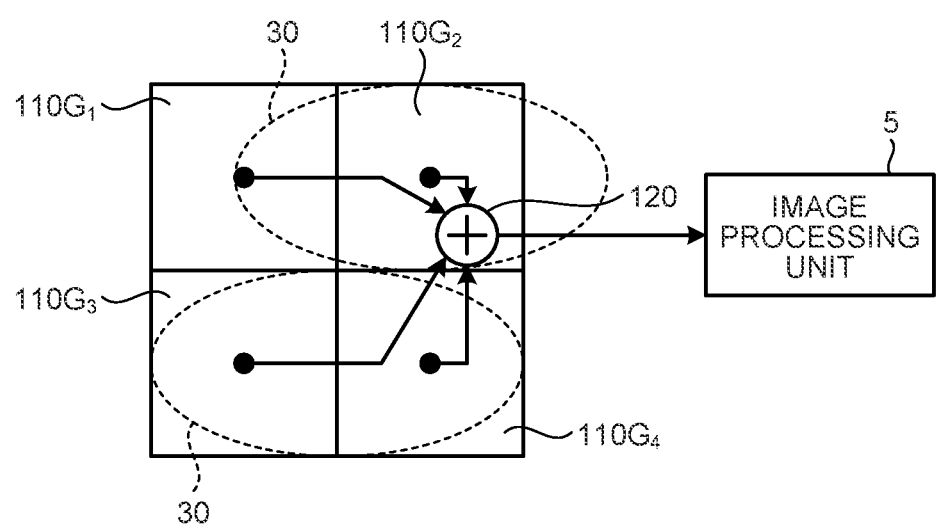
FIG. 16 is a diagram for describing a second method in which a signal is read out from each pixel in each pixel block according to the first embodiment.

FIG. 15 is a diagram for describing the first method in which a signal is read out from each pixel 110 in each pixel block according to the first embodiment. In FIG. 15 and FIG. 16, which will be described later, the pixel block including pixels $110G_1$, $110G_2$, $110G_3$, and $110G_4$ of FIG. 5 is used as an example for description. Here, in the pixel block, the pixels $110G_1$, $110G_2$, $110G_3$, and $110G_4$ share one floating diffusion layer.

In the first reading-out method, in the pixels $110G_1$, $110G_2$, $110G_3$, and $110G_4$, charges are sequentially read out from photoelectric conversion elements (photoelectric conversion units 111) according to the above-described reading-out control.

That is, for example, according to control of the control unit 19, the vertical scanning unit 12 resets the floating diffusion layer in the pixel block, and thereafter reads out a charge from the photoelectric conversion unit 111 in the pixel $110G_1$ and transfers the read-out charge to the floating diffusion layer. The transferred charge is converted into a voltage corresponding to a charge amount in the floating diffusion layer, and the converted voltage is output to the vertical signal line 17 as a pixel signal read out from the pixel $110G_1$.

Next, the vertical scanning unit 12 resets the floating diffusion layer in the pixel block, and thereafter reads out a charge from the photoelectric conversion unit 111 in the pixel $110G_2$ and transfers the read-out charge to the floating diffusion layer. The transferred charge is converted into a voltage corresponding to a charge amount in the floating diffusion layer, and the converted voltage is output to the vertical signal line 17 as a pixel signal read out from the pixel $110G_2$.

Similarly, in order to read out a pixel signal from each of the pixels $110G_3$ and $110G_4$, the vertical scanning unit 12 resets the floating diffusion layer, and thereafter reads out a charge from the photoelectric conversion unit 111 and transfers the read-out charge to the floating diffusion layer.

The respective pixel signals read out from the pixels $110G_1$ to $110G_4$ are supplied to, for example, the image processing unit 5. The image processing unit 5 detects a phase difference in the horizontal direction on the basis of a pixel signal from each of two pixels constituting a pixel set, for example, the pixels $110G_1$ and $110G_2$ or the pixels $110G_3$ and $110G_4$, among the supplied pixel signals. The image processing unit 5 delivers information indicating the detected phase difference to the control unit 3.

The control unit 3 generates a control signal for executing, for example, an image plane phase difference AF on the basis of the information indicating the phase difference, which is delivered from the image processing unit 5. The control unit 3 controls the optical system 2 on the basis of the control signal, such that the optical system 2 executes an AF operation. The control unit 3 is not limited thereto, and can also obtain parallax information on the basis of the information indicating the phase difference, which is delivered from the image processing unit 5.

FIG. 16 is a diagram for describing the second method in which a signal is read out from each pixel 110 in each pixel block according to the first embodiment. In the second reading-out method, charges accumulated in the respective photoelectric conversion units 111 of the pixels $110G_1$, $110G_2$, $110G_3$, and $110G_4$ are read out after being added together in the pixel block.

That is, for example, according to control of the control unit 19, the vertical scanning unit 12 resets the floating diffusion layer in the pixel block, and thereafter reads out charges from the respective photoelectric conversion units 111 in the pixels $110G_1$ to $110G_4$ at a predetermined timing and transfers the read-out charges to the floating diffusion layer. In the floating diffusion layer, the charges transferred from the respective photoelectric conversion units 111 are added together by an addition unit 120. In this case, the addition unit 120 corresponds to the floating diffusion layer shared in common by the pixels $110G_1$ to $110G_4$. The charges transferred from the respective photoelectric conversion units 111 and added together in the floating diffusion layer are converted into a voltage corresponding to a charge amount, and the converted voltage is output to the vertical signal line 17 as a summed-up pixel signal of the pixels $110G_1$ to $110G_4$.

The summed-up pixel signal of the pixels $110G_1$ to $110G_4$ is supplied to, for example, the image processing unit 5. The image processing unit 5 performs predetermined image processing on the supplied pixel signal, and stores the processed pixel signal in the memory 6 as image data, for example, on a one-frame basis. For example, the control unit 3 causes the storage unit 7 to store the image data stored in the memory 6 as a result of the image processing by the image processing unit 5, and causes the display unit 8 to display the image data. The control unit 3 can also transmit the image data to the outside via the I/F unit 9.

Examples in which the first reading-out method and the second reading-out method are utilized will be schematically described. In a case where the electronic device 1 illustrated in FIG. 1 is a digital still camera, in an operation where a shutter button is pressed down, it is general that an autofocusing operation is instructed by a half-pressing operation, and exposure is instructed by a full-pressing operation following the half-pressing operation. Therefore, the control unit 3 executes the first reading-out method described above according to the half-pressing operation on the shutter button as the input device 10 to execute autofocusing based on a phase difference. Thereafter, the second reading-out method described above is executed according to the full-pressing operation on the shutter button to acquire a pixel signal based on a charge obtained by summing up charges from four pixels included in a pixel block.

By performing such control, in the electronic device 1, for example, as a digital still camera, according to a series of operations on the shutter button, autofocusing control based on the phase difference can be executed, and image data based on the pixel signals from the plurality of pixels 110 can be acquired. At this time, since the autofocusing based on the phase difference can be executed using all the pixels 110 included in the pixel array unit 11, the autofocusing can be controlled with higher accuracy. In addition, since the acquired image data is configured on the basis of the pixel signal obtained by summarizing the four pixels 110 included in the pixel block, a brighter screen can be realized.

The electronic device 1 according to the first embodiment is not limited thereto, and can individually read out each pixel signal from each pixel 110 included in the pixel block according to the first reading-out method. Therefore, it is possible to easily install an application for generating a three-dimensional (3D) image and an application for realizing a function of a light-field camera in the electronic device 1 according to the first embodiment.

(Action Against Color Mixing)

Next, an action against color mixing between pixels, which is applicable to the first embodiment will be described. In the first embodiment, an OCL 30 for a certain pixel set may be applied to another pixel set adjacent to the certain pixel set with each pixel 110 in which a color filter 112 of color different from that of a color filter 112 provided in each pixel 110 included in the certain pixel set is provided. In this case, there is concern that color mixing may occur between adjacent pixel sets depending on a chief ray angle (CRA) of a main lens.

Figure 17:
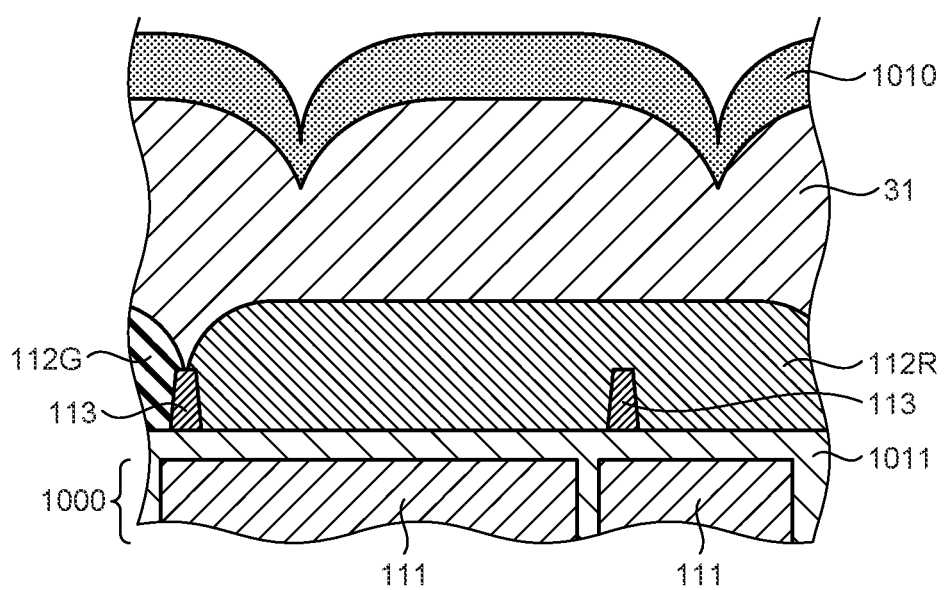
FIG. 17 is a cross-sectional view illustrating a first example of a configuration of a pixel for suppressing color mixing between pixel sets, which is applicable to the first embodiment.

FIG. 17 is a cross-sectional view illustrating a first example of a configuration of a pixel 110 for suppressing color mixing between pixel sets (between pixels 110), which is applicable to the first embodiment. Note that FIG. 17 illustrates a configuration in which one OCL 31 is provided for one photoelectric conversion unit 111 for convenience' sake.

In FIG. 17, an upper side of a substrate 1000 made of silicon is a back surface of the substrate 1000, and a lower side of the substrate 1000 is a front surface of the substrate 1000. That is, after photoelectric conversion units 111, respective wirings, etc. are formed on the front surface side, the substrate 1000 is turned over, and a planarization film 1011 is formed on the back surface thereof. A light shielding body 113 and an R color filter 112R are formed on the planarization film 1011. A G color filter 112G is formed to the left of the color filter 112R. OCLs 31 are formed for the color filters 112R and 112G, and protective films 1010 are formed for the OCLs 31.

In addition, in FIG. 17, with respect to the photoelectric conversion unit 111, the light shielding body 113 and the color filter 112R are formed to be shifted to a right side of FIG. 17, and the OCL 31 is further disposed to be shifted to the right side. Thus, a pupil correction is made to light incident from an upper-right side to a lower-left side.

According to this configuration, the color filter 112R and the light shielding body 113 are formed directly on the photoelectric conversion unit 111. Therefore, it is possible to suppress leakage of light incident on the photoelectric conversion unit 111 via the OCL 31 and the color filter 112R from the upper-right side toward the lower-left side of FIG. 17 to a photoelectric conversion unit 111 provided with the color filter 112G to the left side.

Figure 18:
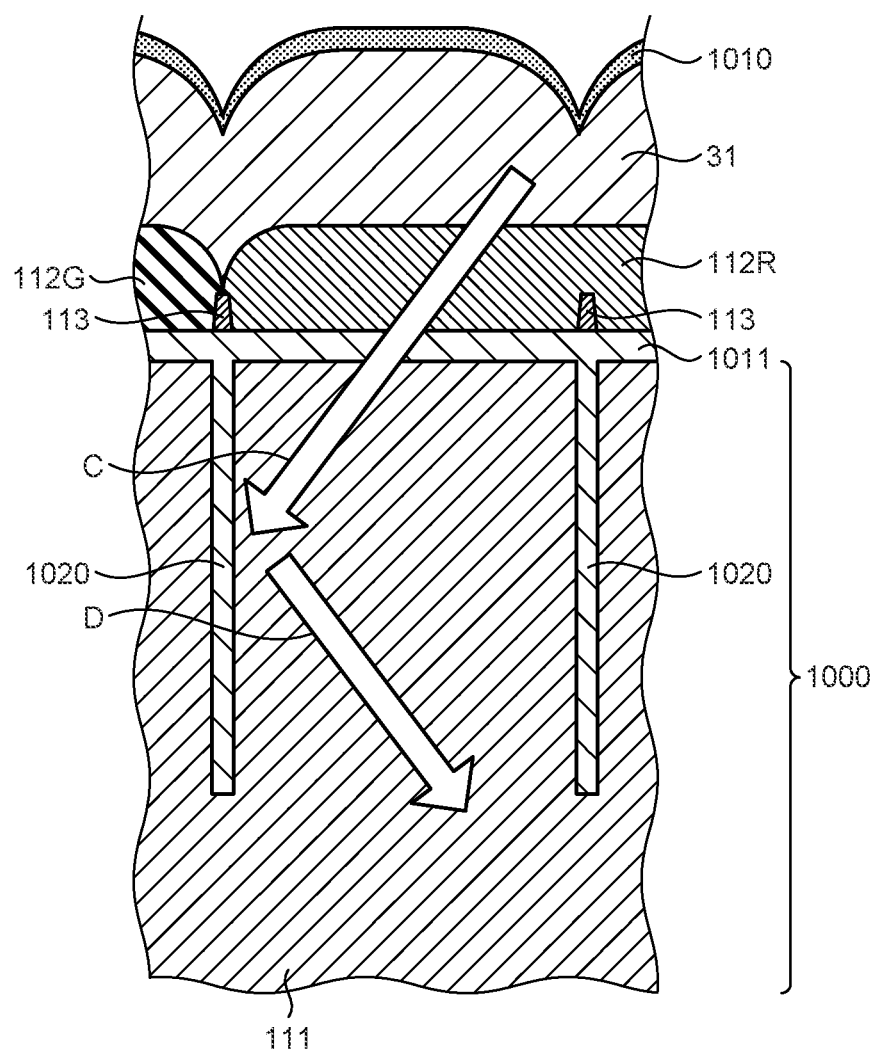
FIG. 18 is a cross-sectional view illustrating a second example of a configuration of a pixel for suppressing color mixing between pixel sets, which is applicable to the first embodiment.

FIG. 18 is a cross-sectional view illustrating a second example of a configuration of a pixel 110 for suppressing color mixing between pixel sets (between pixels 110), which is applicable to the first embodiment. Similarly to FIG. 17, FIG. 18 illustrates a configuration in which one OCL 31 is provided for one photoelectric conversion unit 111 for convenience' sake. A front-back relationship of a substrate 1000 made of silicon is also similar to that in the example of FIG. 17.

In FIG. 18, an upper side of the substrate 1000 made of silicon is a back surface of the substrate 1000, and a lower side of the substrate 1000 is a front surface of the substrate 1000. In the example of FIG. 18, the substrate 1000 is turned over after photoelectric conversion units 111, respective wirings, etc. are formed on the front surface side in the same manner as described above. A light shielding body 1020 is formed in a trench and a planarization film 1011 is further formed on the back surface side. Since the configuration on the planarization film 1011 is similar to that in the example of FIG. 17, the description thereof is omitted here.

According to this configuration, light incident on the photoelectric conversion unit 111, for example, via the color filter 112R from an upper-right side toward a lower-left side of FIG. 18 (indicated by arrow C) is reflected by a surface of the light shielding body 1020 (indicated by arrow D). Therefore, it is possible to suppress leakage of light incident on a corresponding photoelectric conversion unit 111 into an adjacent photoelectric conversion unit 111 provided with the color filter 112G.

Figure 19:
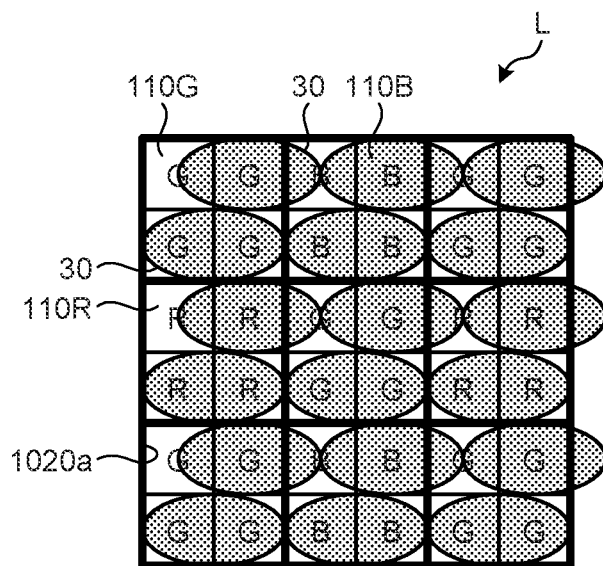
FIG. 19 is a diagram illustrating an example of a light shielding body disposed along a boundary of each pixel block, which is applicable to the first embodiment.
Figure 20:
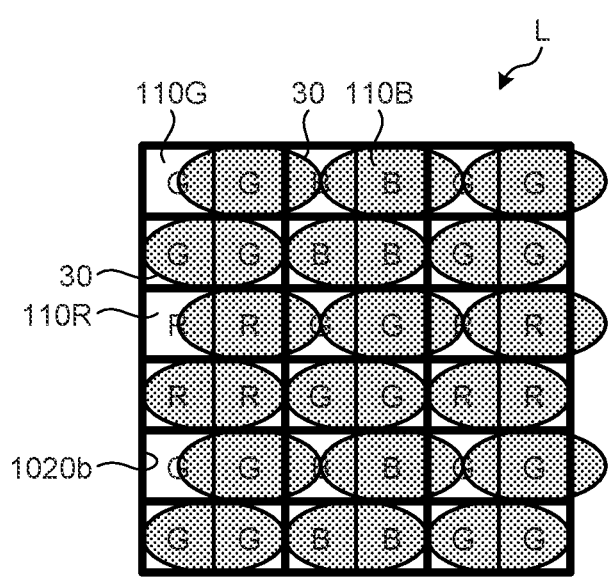
FIG. 20 is a diagram illustrating an example of a light shielding body disposed along a boundary of each pixel set, which is applicable to the first embodiment.

FIGS. 19 and 20 are diagrams each illustrating an example in which the light shielding body 1020 illustrated in FIG. 18 is arranged, which is applicable to the first embodiment.

FIG. 19 is a diagram illustrating an example of a light shielding body 1020a disposed along a boundary of each pixel block, which is applicable to the first embodiment. The light shielding body 1020a of FIG. 19 suppresses leakage of light into a pixel block in which a color filter 112 for a different color is provided in each pixel 110, and is more effective, for example, in the second reading-out method described with reference to FIG. 16. For example, by using the light shielding body 1020a illustrated in FIG. 19, an image quality of an image according to image data based on pixel signals for each pixel block can be improved.

FIG. 20 is a diagram illustrating an example of a light shielding body 1020b disposed along a boundary of each pixel set, which is applicable to the first embodiment. The light shielding body 1020b of FIG. 20 suppresses leakage of light between pixel sets for detecting a phase difference, and is more effective, for example, in the first reading-out method described with reference to FIG. 15. For example, by using the light shielding body 1020b illustrated in FIG. 20, a phase difference can be detected with higher accuracy. Furthermore, the light shielding body 1020b illustrated in FIG. 20 can also obtain the same effect as the light shielding body 1020a illustrated in FIG. 19 described above.

Modification of First Embodiment

Next, a modification of the first embodiment will be described. In the modification of the first embodiment, a pixel set in a pixel block includes pixels 110 adjacent to each other in a different direction from the pixel set in the first embodiment described above. More specifically, taking FIG. 9 as an example, the pixel set in the above-described first embodiment includes two pixels 110 adjacent to each other in the horizontal direction. On the other hand, in the modification of the first embodiment, the pixel set includes two pixels 110 adjacent to each other in the vertical direction.

(Specific Example of Pupil Correction According to Modification of First Embodiment)

With reference to FIGS. 21A to 21G, pixel sets according to the modification of the first embodiment will be described, and at the same time, examples of directions of pupil corrections in the regions C, L, R, CT, CB, LT, and RB illustrated in FIG. 13 will be described. Note that, in FIGS. 21A to 21G, "none" at a lower end indicates that no pupil correction is made in a corresponding column. In addition, "strong" at the lower end indicates that a strong pupil correction is made in a corresponding column, and "weak" indicates that a weak pupil correction is made in a corresponding column.

Figure 21A:
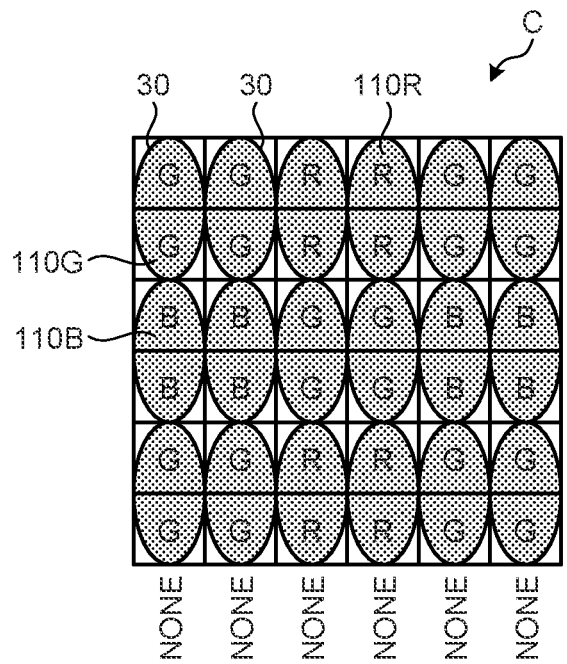
FIG. 21A is a diagram illustrating an example of a pupil correction in region C according to a modification of the first embodiment.

FIG. 21A is a diagram illustrating an example of a pupil correction in the region C according to the modification of the first embodiment. Here, as illustrated in FIG. 21A, in the modification of the first embodiment, in each pixel block including 2 pixels×2 pixels, each pixel set includes two pixels 110G adjacent to each other in the vertical direction, two pixels 110R adjacent to each other in the vertical direction, or two pixels 110B adjacent to each other in the vertical direction. One OCL 30 is provided for each pixel set.

As illustrated in FIG. 21A, in the region C, as indicated at the lower end of each column in FIG. 21A, no pupil correction is made in each pixel set of each pixel block.

Figure 21B:
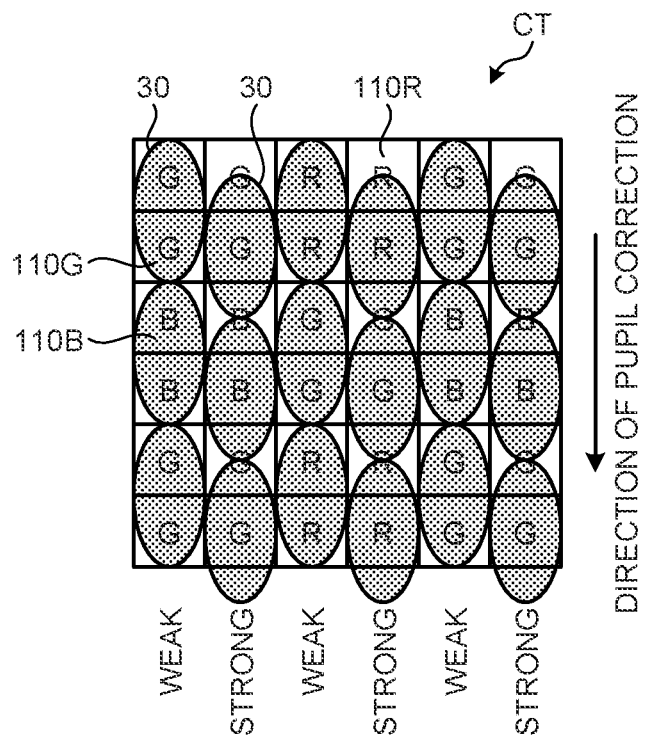
FIG. 21B is a diagram illustrating an example of a pupil correction in region CT according to the modification of the first embodiment.

FIG. 21B is a diagram illustrating an example of a pupil correction in the region CT according to the modification of the first embodiment. In FIG. 21B, in the region CT, toward a lower side (image height center) of FIG. 21B, a strong pupil correction is made in a right pixel set of each pixel block and a weak pupil correction is made in a left pixel set of each pixel block.

Figure 21C:
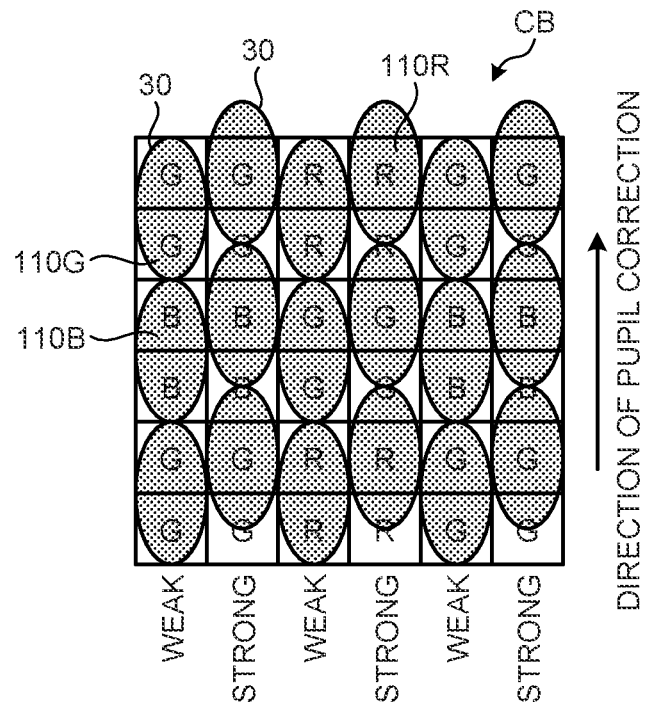
FIG. 21C is a diagram illustrating an example of a pupil correction in region CB according to the modification of the first embodiment.

FIG. 21C is a diagram illustrating an example of a pupil correction in the region CB according to the modification of the first embodiment. In the region CB, toward an upper side (image height center) of FIG. 21C, a strong pupil correction is made in a right pixel set of each pixel block and a weak pupil correction is made in a left pixel set of each pixel block.

Figure 21D:
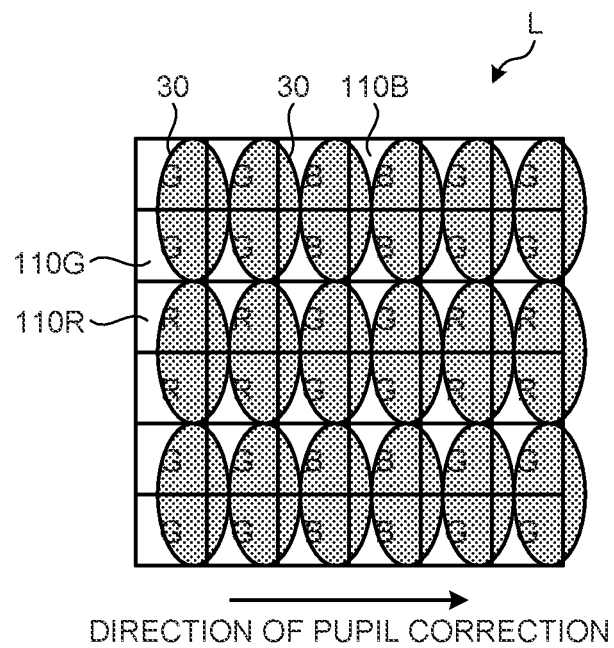
FIG. 21D is a diagram illustrating an example of a pupil correction in region L according to the modification of the first embodiment.

FIG. 21D is a diagram illustrating an example of a pupil correction in the region L according to the modification of the first embodiment. In the region L, toward a right side (image height center) of FIG. 21D, pupil corrections are made in the same pupil correction amount in right and left pixel sets of each pixel block.

Figure 21E:
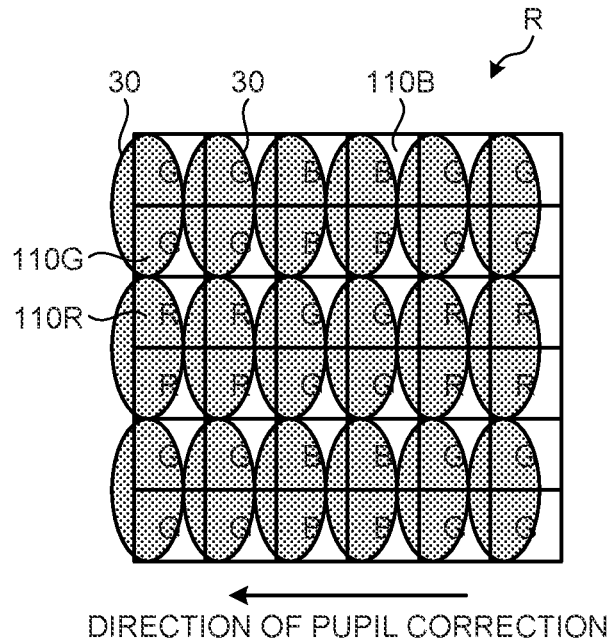
FIG. 21E is a diagram illustrating an example of a pupil correction in region R according to the modification of the first embodiment.

FIG. 21E is a diagram illustrating an example of a pupil correction in the region R according to the modification of the first embodiment. In the region R, toward a left side (image height center) of FIG. 21E, pupil corrections are made in the same pupil correction amount in right and left pixel sets of each pixel block.

Figure 21F:
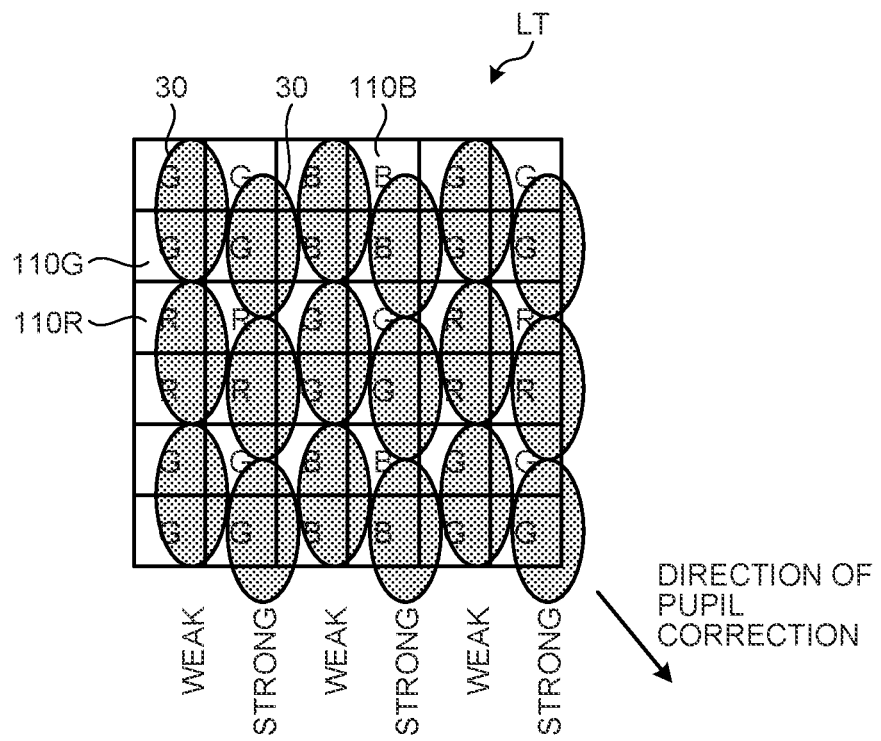
FIG. 21F is a diagram illustrating an example of a pupil correction in region LT according to the modification of the first embodiment.

FIG. 21F is a diagram illustrating an example of a pupil correction in the region LT according to the modification of the first embodiment. In the region LT, toward a lower-right side (image height center) of FIG. 21F in a diagonal direction, a strong pupil correction is made in a right pixel set of each pixel block and a weak pupil correction is made in a left pixel set of each pixel block. In the example of FIG. 21F, in the region LT, the pupil correction is made in a direction in which the direction (lower side) of the pupil correction in the region CT of FIG. 21B and the direction (right side) of the pupil correction in the region L of FIG. 21D are combined.

Figure 21G:
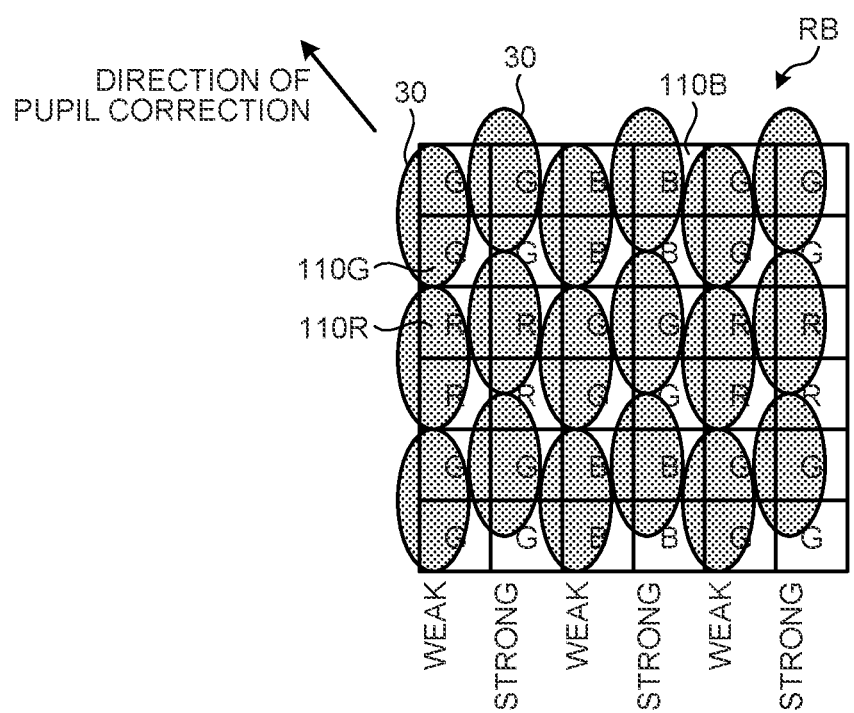
FIG. 21G is a diagram illustrating an example of a pupil correction in region RB according to the modification of the first embodiment.

FIG. 21G is a diagram illustrating an example of a pupil correction in the region RB according to the modification of the first embodiment. In the region RB, toward an upper-left side (image height center) of FIG. 21G in a diagonal direction, a strong pupil correction is made in a right pixel set of each pixel block and a weak pupil correction is made in a left pixel set of each pixel block. In the example of FIG. 21G, in the region RB, the pupil correction is made in a direction in which the direction (upper side) of the pupil correction in the region CB of FIG. 21C and the direction (left side) of the pupil correction in the region R of FIG. 21E are combined.

According to the modification of the first embodiment, the image plane phase difference AF and the parallax detection can be executed with higher accuracy based on information on the phase difference in the vertical direction.

Second Embodiment

Next, a second embodiment will be described. In the first embodiment and the modification thereof described above, a pixel block includes four pixels 110 of 2 pixels×2 pixels. On the other hand, in the second embodiment, a pixel block includes (n×n) pixels 110 of n pixels×n pixels, with n being an integer of 3 or more. In addition, a pixel set in the pixel block includes two pixels 110 adjacent to each other in the horizontal direction, similarly to the pixel set in the first embodiment described above.

In the second embodiment, pupil corrections in three or more different pupil correction amounts can be realized in one pixel block. Thus, the image plane phase difference AF and the parallax detection can be executed with high accuracy in a wider range of an EPD of a main lens, as compared with those in the first embodiment and the modification thereof described above.

Figure 22:
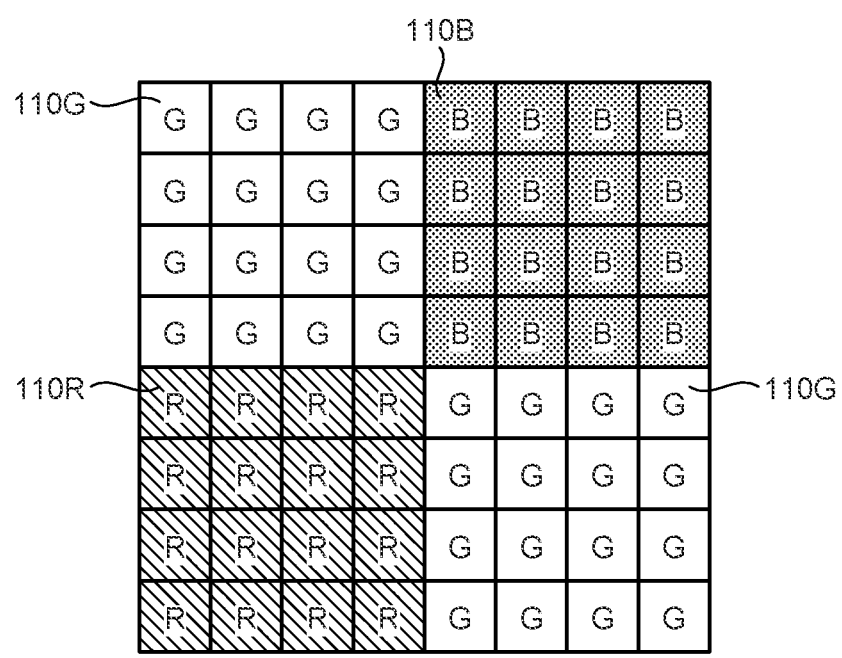
FIG. 22 is a diagram illustrating an example of a pixel configuration applicable to a second embodiment.

FIG. 22 is a diagram illustrating an example of a pixel configuration applicable to the second embodiment. In the pixel configuration of FIG. 22, n is 4 as described above, and each pixel block including 16 R color pixels 110R, 16 G color pixels 110G, or 16 B color pixels 110B is arranged in a pixel array according to the Bayer array, with a pixel block in which 4 pixels×4 pixels for the same color are arranged in a lattice pattern as a unit. Hereinafter, unless otherwise specified, such a pixel array will be referred to as a four-divided Bayer type RGB array (n=4).

More specifically, similarly to the above-described four-divided Bayer type RGB array, in the four-divided Bayer type RGB array (n=4), pixel blocks, each including R color pixels 110R, G color pixels 110G, or B color pixels 110B, are arranged in a 4×4 lattice pattern such that the same-color pixel blocks are not adjacent to each other, with the numbers of pixels 110R, pixels 110G, and pixels 110B in a ratio of 1:2:1. In the example of FIG. 22, the pixel blocks including the G color pixels 110G are arranged to the left of and under the pixel block including the B color pixels 110B, and the pixel block including the R color pixels 110R is arranged diagonally to the pixel block including the B color pixels 110B.

(Specific Example of Pupil Correction According to Second Embodiment)

With reference to FIGS. 23A to 23G, pixel sets according to the second embodiment will be described, and at the same time, examples of directions of pupil corrections in the regions C, L, R, CT, CB, LT, and RB illustrated in FIG. 13 will be described.

Note that, in FIGS. 23A to 23G, "none" at a right end indicates that no pupil correction is made in a corresponding row. "Strong" at the right end indicates that a strong pupil correction is made in a corresponding row, and "very strong" indicates that a stronger pupil correction is made in a corresponding row as compared with the "strong" (which will be referred to as "stronger pupil correction"). Further, "weak" at the right end indicates that a weak pupil correction is made in a corresponding row, and "very weak" indicates that a weaker pupil correction is made in a corresponding row as compared with the "weak" (which will be referred to as "weaker pupil correction").

The "very weak" is not limited thereto, and may indicate a negative pupil correction, that is, a pupil correction made in an opposite direction to the "very strong", the "strong", and the "weak". For example, in a case where a main lens has a diameter larger than a width of a light receiving surface (pixel array unit 11), light from an edge portion of the main lens may be incident on the pixel array unit 11 from an opposite direction to light from a central portion of the main lens. A negative pupil correction is made to the light incident on the pixel array unit 11 from the opposite direction to the light from the central portion of the main lens as described above.

Figure 23A:
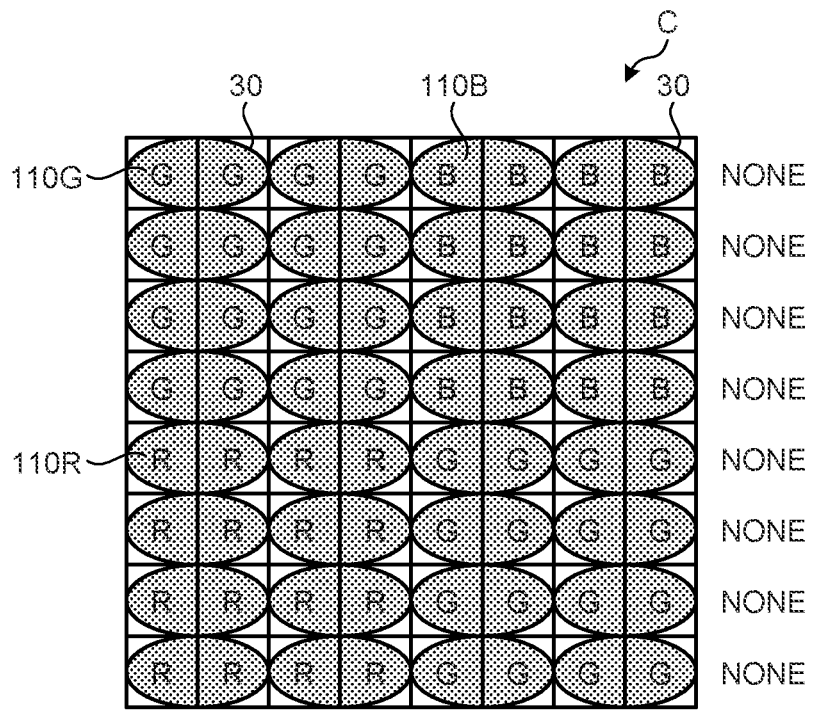
FIG. 23A is a diagram illustrating an example of a pupil correction in region C according to the second embodiment.

FIG. 23A is a diagram illustrating an example of a pupil correction in the region C according to the second embodiment. Here, as illustrated in FIG. 23A, in the second embodiment, in each pixel block including 4 pixels×4 pixels, each pixel set includes two pixels 110G adjacent to each other in the horizontal direction, two pixels 110R adjacent to each other in the horizontal direction, or two pixels 110B adjacent to each other in the horizontal direction. That is, in the second embodiment, one pixel block includes eight pixel sets. One OCL 30 is provided for each pixel set.

As illustrated in FIG. 23A, in the region C, as indicated at a right end of each column in FIG. 23A, no pupil correction is made in each pixel set of each pixel block.

Figure 23B:
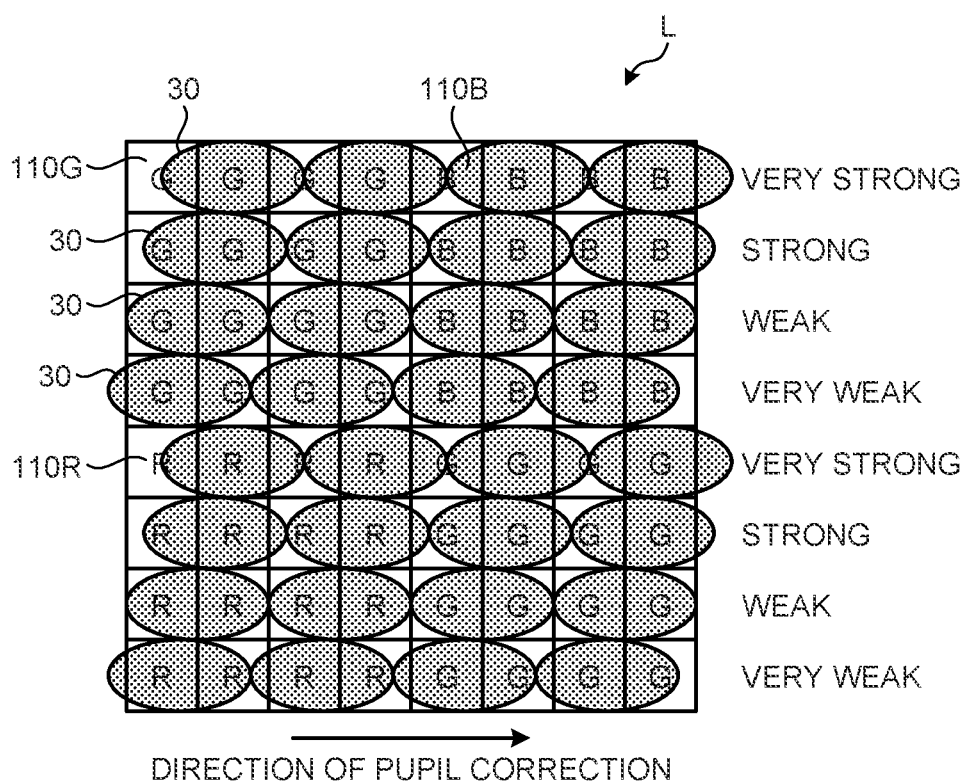
FIG. 23B is a diagram illustrating an example of a pupil correction in region L according to the second embodiment.

FIG. 23B is a diagram illustrating an example of a pupil correction in the region L according to the second embodiment. In the region L, toward a right side (image height center) of FIG. 23B, stronger pupil corrections are made in two pixel sets at an uppermost stage of each pixel block, strong pupil corrections are made in two pixel sets at a second-highest stage of each pixel block, weak pupil corrections are made in pixel sets at a third-highest stage of each pixel block, and weaker pupil corrections are made in pixel sets at a lowermost stage of each pixel block.

Figure 23C:
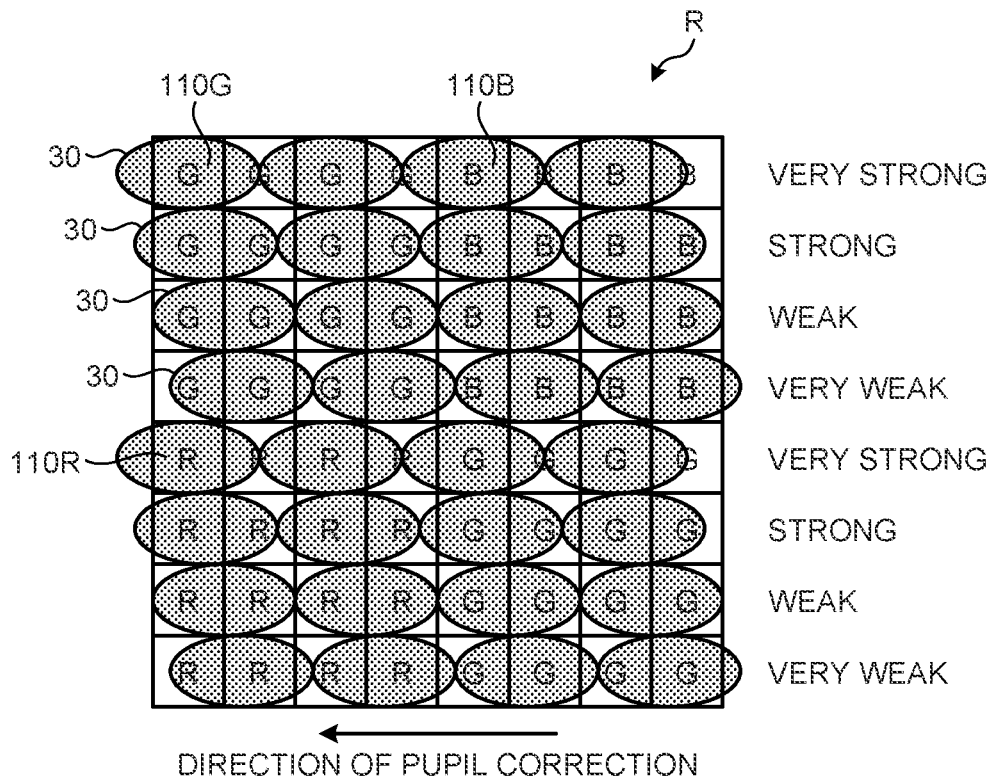
FIG. 23C is a diagram illustrating an example of a pupil correction in region R according to the second embodiment.

FIG. 23C is a diagram illustrating an example of a pupil correction in the region R according to the second embodiment. In the region R, toward a left side (image height center) of FIG. 23C, stronger pupil corrections are made in two pixel sets at an uppermost stage of each pixel block, strong pupil corrections are made in two pixel sets at a second-highest stage of each pixel block, weak pupil corrections are made in pixel sets at a third-highest stage of each pixel block, and weaker pupil corrections are made in pixel sets at a lowermost stage of each pixel block.

Figure 23D:
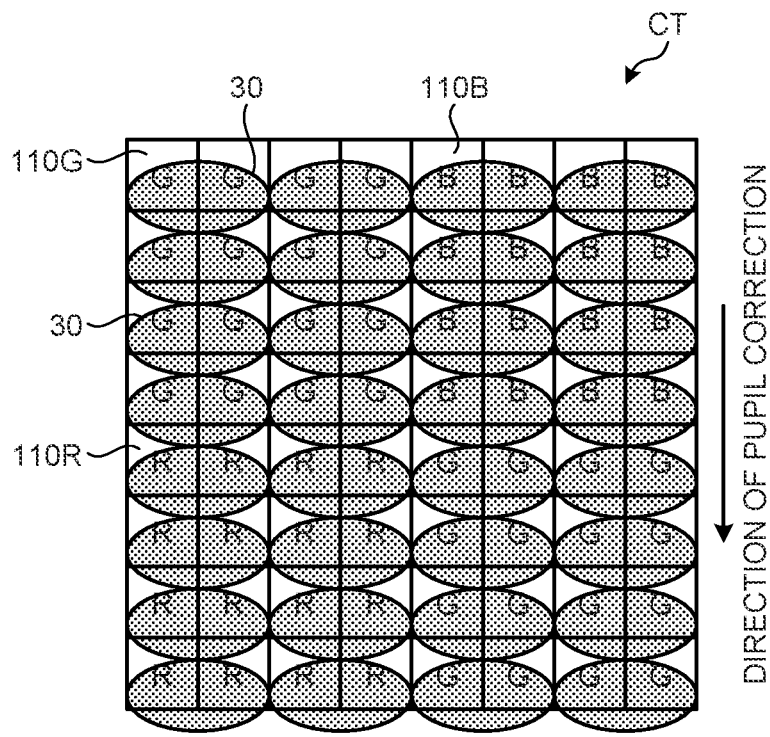
FIG. 23D is a diagram illustrating an example of a pupil correction in region CT according to the second embodiment.

FIG. 23D is a diagram illustrating an example of a pupil correction in the region CT according to the second embodiment. In the region CT, toward a lower side (image height center) of FIG. 23D, pupil corrections are made in the same pupil correction amount in respective-stage pixel sets of each pixel block.

Figure 23E:
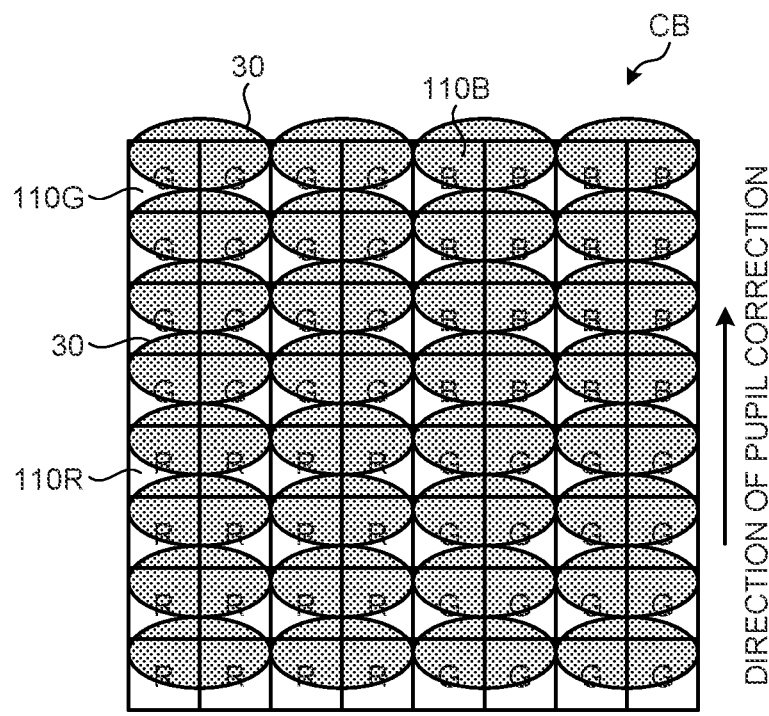
FIG. 23E is a diagram illustrating an example of a pupil correction in region CB according to the second embodiment.

FIG. 23E is a diagram illustrating an example of a pupil correction in the region CB according to the second embodiment. In the region CT, toward an upper side (image height center) of FIG. 23E, pupil corrections are made in the same pupil correction amount in respective-stage pixel sets of each pixel block.

Figure 23F:
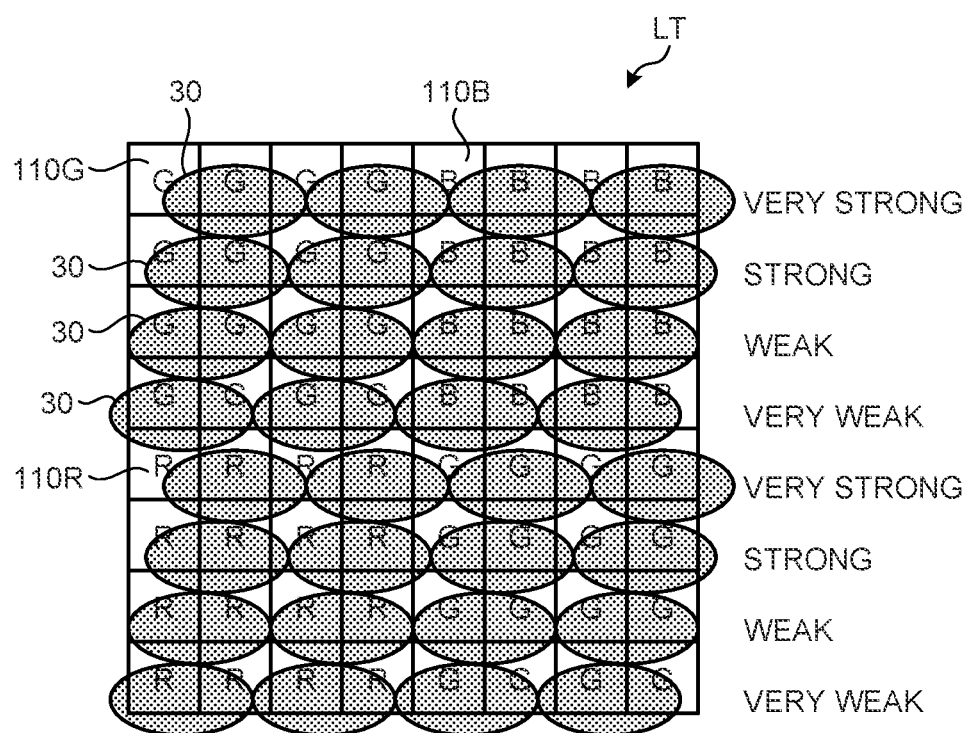
FIG. 23F is a diagram illustrating an example of a pupil correction in region LT according to the second embodiment.

FIG. 23F is a diagram illustrating an example of a pupil correction in the region LT according to the second embodiment. In the region LT, toward a lower-right side (image height center) of FIG. 23F in a diagonal direction, stronger pupil corrections are made in two pixel sets at an uppermost stage of each pixel block, strong pupil corrections are made in two pixel sets at a second-highest stage of each pixel block, weak pupil corrections are made in pixel sets at a third-highest stage of each pixel block, and weaker pupil corrections are made in pixel sets at a lowermost stage of each pixel block. In the example of FIG. 23F, in the region LT, the pupil correction is made in a direction in which the direction (right side) of the pupil correction in the region L of FIG. 23B and the direction (lower side) of the pupil correction in the region CT of FIG. 23D are combined.

Figure 23G:
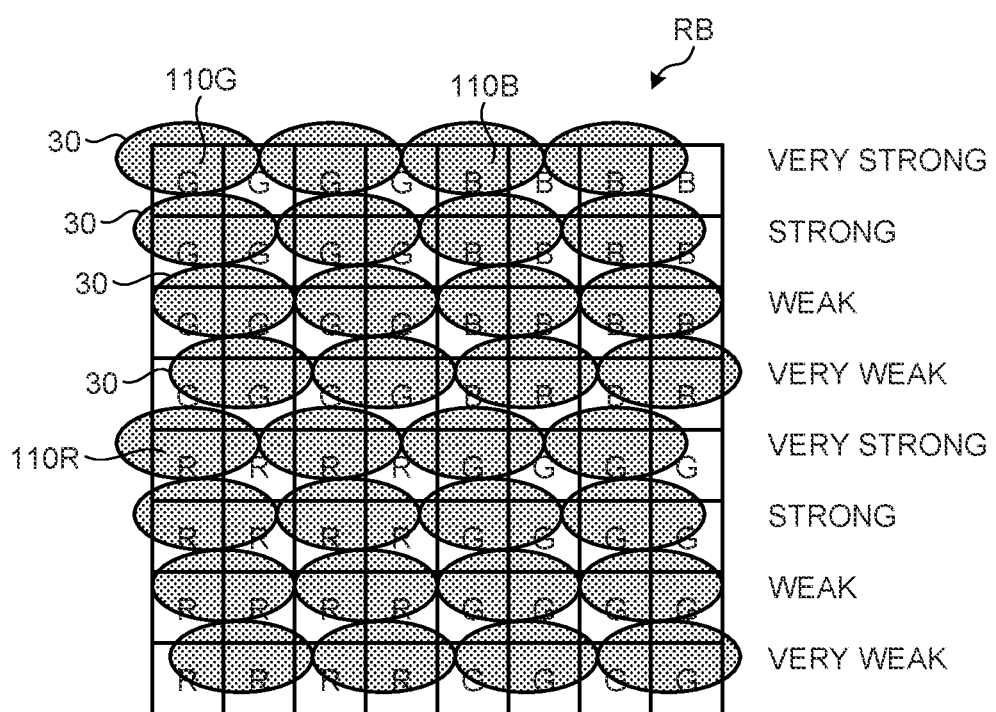
FIG. 23G is a diagram illustrating an example of a pupil correction in region RB according to the second embodiment.

FIG. 23G is a diagram illustrating an example of a pupil correction in the region RB according to the second embodiment. In the region RB, toward an upper-left side (image height center) of FIG. 23G in a diagonal direction, stronger pupil corrections are made in two pixel sets at an uppermost stage of each pixel block, strong pupil corrections are made in two pixel sets at a second-highest stage of each pixel block, weak pupil corrections are made in pixel sets at a third-highest stage of each pixel block, and weaker pupil corrections are made in pixel sets at a lowermost stage of each pixel block. In the example of FIG. 23G, in the region RB, the pupil correction is made in a direction in which the direction (left side) of the pupil correction in the region R of FIG. 23C and the direction (upper side) of the pupil correction in the region CB of FIG. 23E are combined.

Note that, in addition to the pupil correction in each direction with respect to the image height center as described above, the pupil correction amount can be changed according to an image height.

Furthermore, in the second embodiment, similarly to the modification of the first embodiment described above, each pixel set can include two pixels 110 adjacent to each other in the vertical direction and one OCL 30 provided to be shared in common by the two pixels 110.

Modification of Second Embodiment

Next, a modification of the second embodiment will be described. In the modification of the second embodiment, the pixel block including (n×n) pixels 110 of n pixels×n pixels, with n being an integer of 3 or more, according to the second embodiment described above, a plurality of pixel sets in which pixels 110 are adjacent to each other in different directions are mixed. For example, in one pixel block, pixel sets each including two pixels 110 adjacent to each other in the horizontal direction (which will be referred to as horizontal pixel sets) and pixel sets each including two pixels 110 adjacent to each other in the vertical direction (which will be referred to as vertical pixel sets) are mixed.

In the modification of the second embodiment, since the plurality of pixel sets in which the pixels 110 are adjacent to each other in different directions are mixed in one pixel block, a phase difference can be detected in each of the different directions. More specifically, by mixing the horizontal pixel sets and the vertical pixel sets in one pixel block, a phase difference can be detected in each of the horizontal direction and the vertical direction. Thus, the image plane phase difference AF and the parallax detection can be performed with high accuracy (Specific Example of Pupil Correction According to Modification of Second Embodiment)

With reference to FIGS. 24A to 24G, pixel sets according to the modification of the second embodiment will be described, and at the same time, examples of directions of pupil corrections in the regions C, L, R, CT, CB, LT, and RB illustrated in FIG. 13 will be described.

Note that, in FIGS. 24A to 24G, "none" at a right end indicates that no pupil correction is made in a corresponding row. "Strong" at the right end indicates that a strong pupil correction is made in a corresponding row, and "weak" at the right end indicates that a weak pupil correction is made in a corresponding row. In addition, "target CRA" at the right end indicates that an optimal pupil correction is made in terms of the EPD of the main lens. For example, the "target CRA" may be considered as performing a pupil correction with an approximately medium intensity between the strong pupil correction and the weak pupil correction.

Figure 24A:
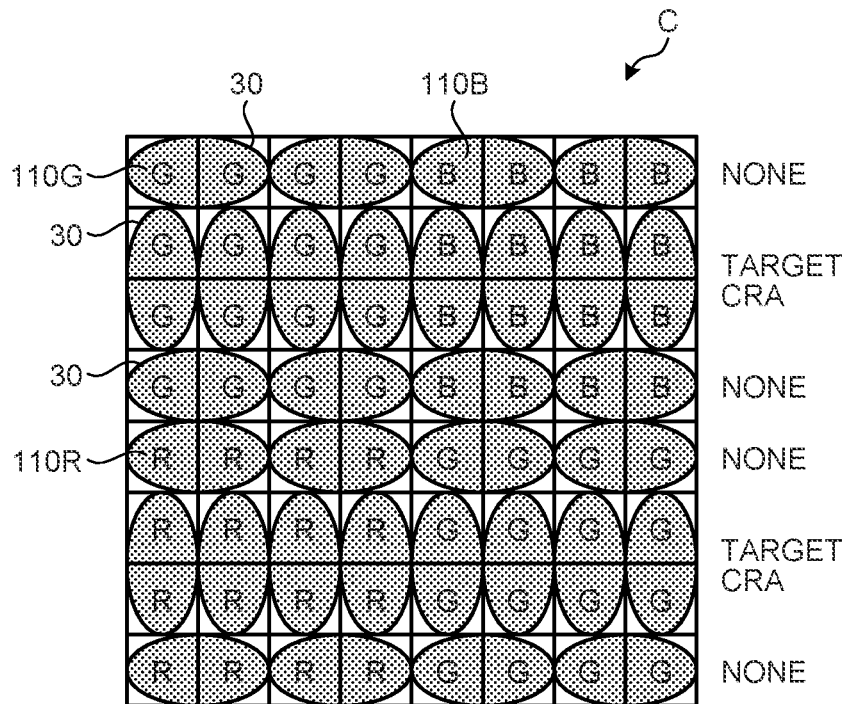
FIG. 24A is a diagram illustrating an example of a pupil correction in region C according to a modification of the second embodiment.

FIG. 24A is a diagram illustrating an example of a pupil correction in the region C according to the modification of the second embodiment. Here, as illustrated in FIG. 24A, in the modification of the second embodiment, n is 4, and four horizontal pixel sets and four vertical pixel sets are mixed in each pixel block including 4 pixels×4 pixels. At this time, in each pixel block, two horizontal pixel sets are arranged adjacent to each other in the horizontal direction at an upper stage, four vertical pixel sets are sequentially arranged adjacent to each other in the horizontal direction at a middle stage, and two horizontal pixel sets are arranged adjacent to each other in the horizontal direction at a lower stage. One OCL 30 is provided for each pixel set.

As illustrated in FIG. 24A, in the region C, as indicated at a right end of each column in FIG. 24A, no pupil correction is made in each of the horizontal pixel sets at the upper and lower stages of each pixel block. In each of the vertical pixel sets at the middle stage, an optimal pupil correction is made in terms of the EPD of the main lens. Since the region C is located at the image height center, no pupil correction is actually made in each vertical pixel set at the middle stage illustrated in FIG. 24A.

Figure 24B:
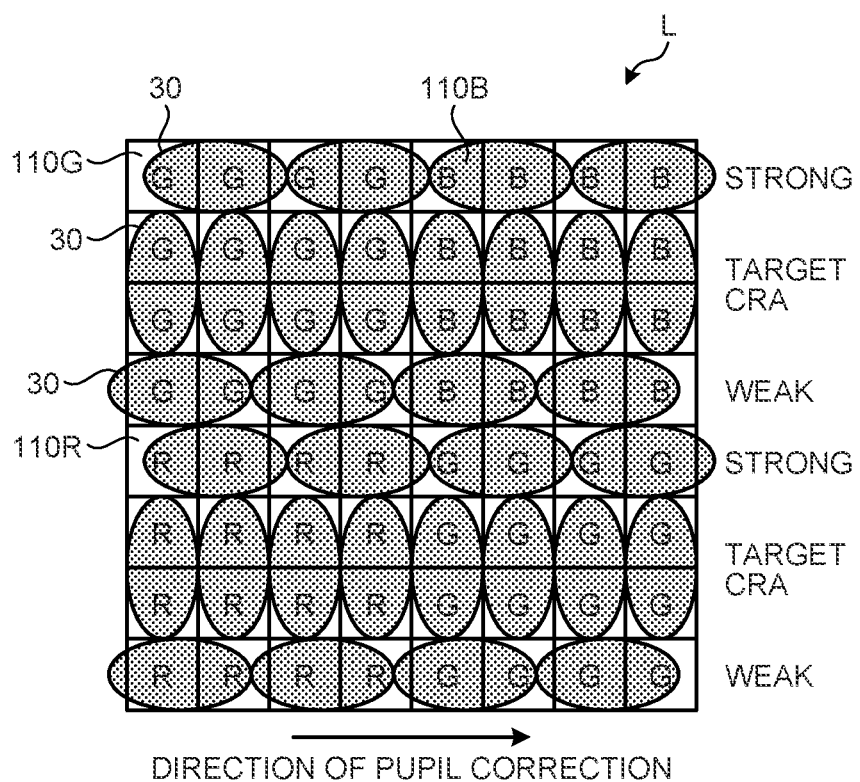
FIG. 24B is a diagram illustrating an example of a pupil correction in region L according to the modification of the second embodiment.

FIG. 24B is a diagram illustrating an example of a pupil correction in the region L according to the modification of the second embodiment. In the region L, toward a right side (image height center) of FIG. 24B, strong pupil corrections are made in two horizontal pixel sets at an upper stage of each pixel block, and weak pupil corrections are made in two pixel sets at a lower stage of each pixel block. In addition, in each vertical pixel set at a middle stage, an optimal pupil correction is made, in terms of the EPD of the main lens, according to an image height and a direction with respect to the image height center of each vertical pixel set.

Figure 24C:
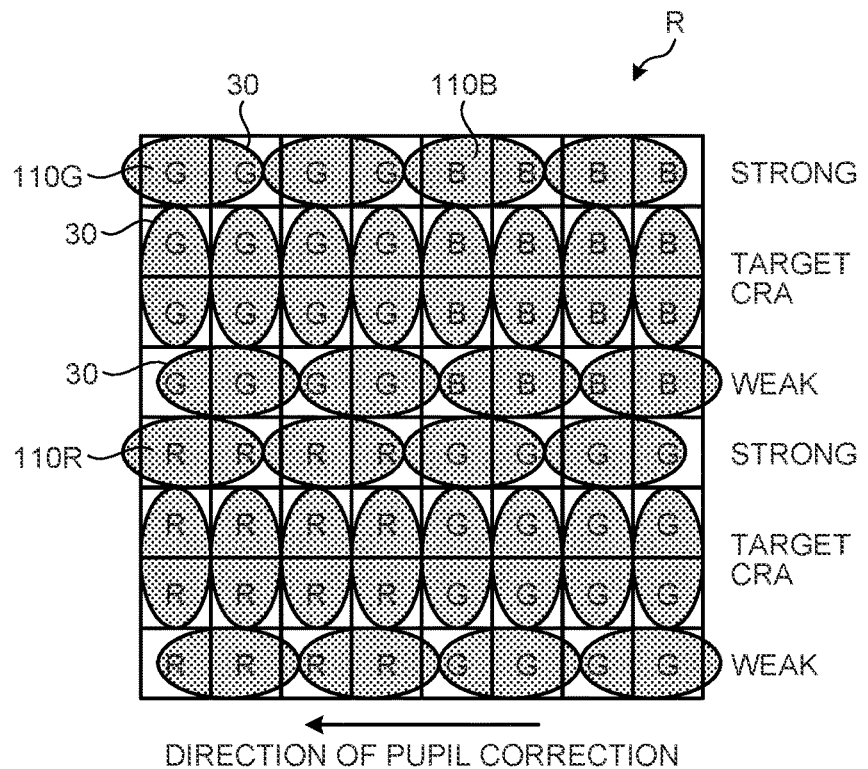
FIG. 24C is a diagram illustrating an example of a pupil correction in region R according to the modification of the second embodiment.

FIG. 24C is a diagram illustrating an example of a pupil correction in the region R according to the modification of the second embodiment. In the region R, toward a left side (image height center) of FIG. 24C, strong pupil corrections are made in two pixel sets at an upper stage of each pixel block and weak pupil corrections are made in two pixel sets at a lower stage of each pixel block. In addition, in each vertical pixel set at a middle stage, an optimal pupil correction is made, in terms of the EPD of the main lens, according to an image height and a direction with respect to the image height center of each vertical pixel set.

Figure 24D:
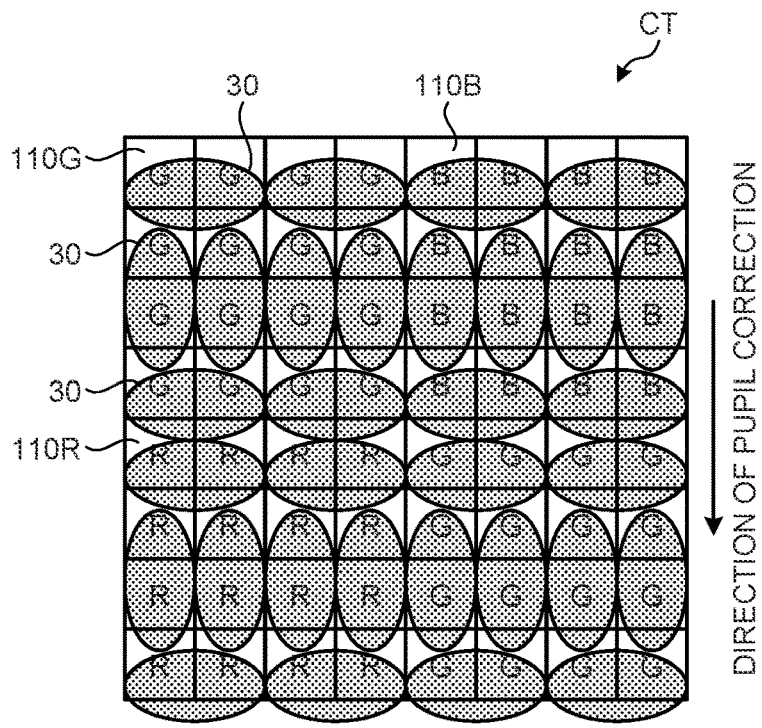
FIG. 24D is a diagram illustrating an example of a pupil correction in region CT according to the modification of the second embodiment.

FIG. 24D is a diagram illustrating an example of a pupil correction in the region CT according to the modification of the second embodiment. In the region CT, toward a lower side (image height center) of FIG. 24D, pupil corrections are made in the same pupil correction amount in respective horizontal pixel sets at upper and lower stages of each pixel block and in respective vertical pixel sets at a middle stage of each pixel block.

Figure 24E:
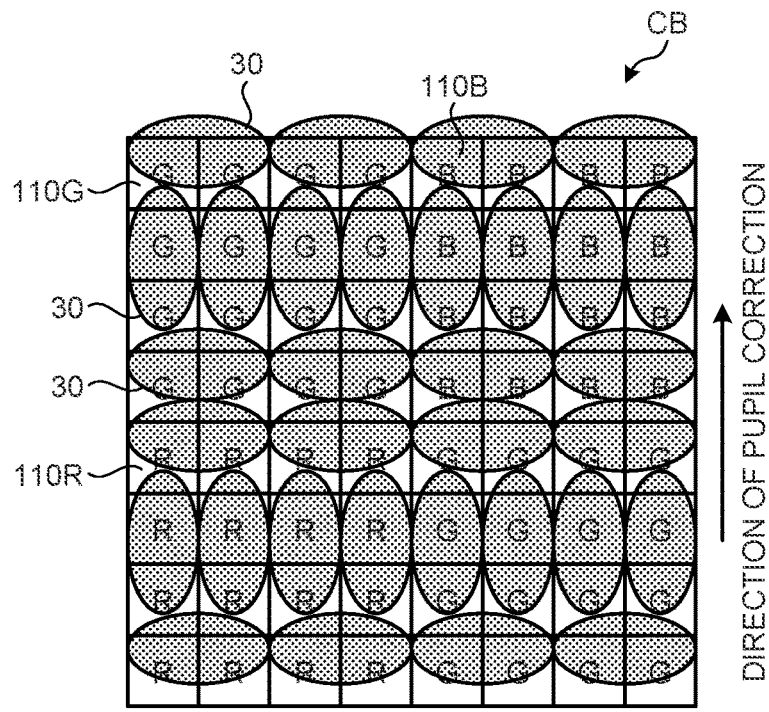
FIG. 24E is a diagram illustrating an example of a pupil correction in region CB according to the modification of the second embodiment.

FIG. 24E is a diagram illustrating an example of a pupil correction in the region CB according to the modification of the second embodiment. In the region CT, toward a lower side (image height center) of FIG. 24E, pupil corrections are made in the same pupil correction amount in respective horizontal pixel sets at upper and lower stages of each pixel block and in respective vertical pixel sets at a middle stage of each pixel block.

Figure 24F:
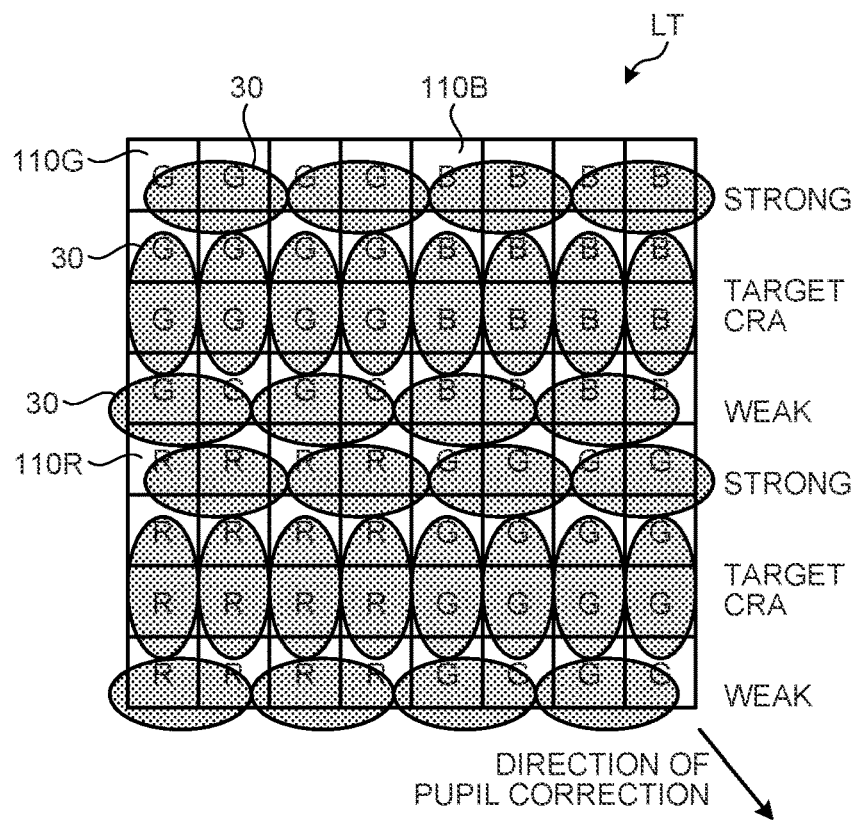
FIG. 24F is a diagram illustrating an example of a pupil correction in region LT according to the modification of the second embodiment.

FIG. 24F is a diagram illustrating an example of a pupil correction in the region LT according to the modification of the second embodiment. In the region LT, toward a lower-right side (image height center) of FIG. 24F in a diagonal direction, strong pupil corrections are made in two horizontal pixel sets at an upper stage of each pixel block, and weak pupil corrections are made in two pixel sets at a lower stage of each pixel block. In addition, in each vertical pixel set at a middle stage, an optimal pupil correction is made, in terms of the EPD of the main lens, according to an image height and a direction with respect to the image height center of each vertical pixel set. In the example of FIG. 24F, in the region LT, the pupil correction is made in a direction in which the direction (right side) of the pupil correction in the region L of FIG. 24B and the direction (lower side) of the pupil correction in the region CT of FIG. 24D are combined.

Figure 24G:
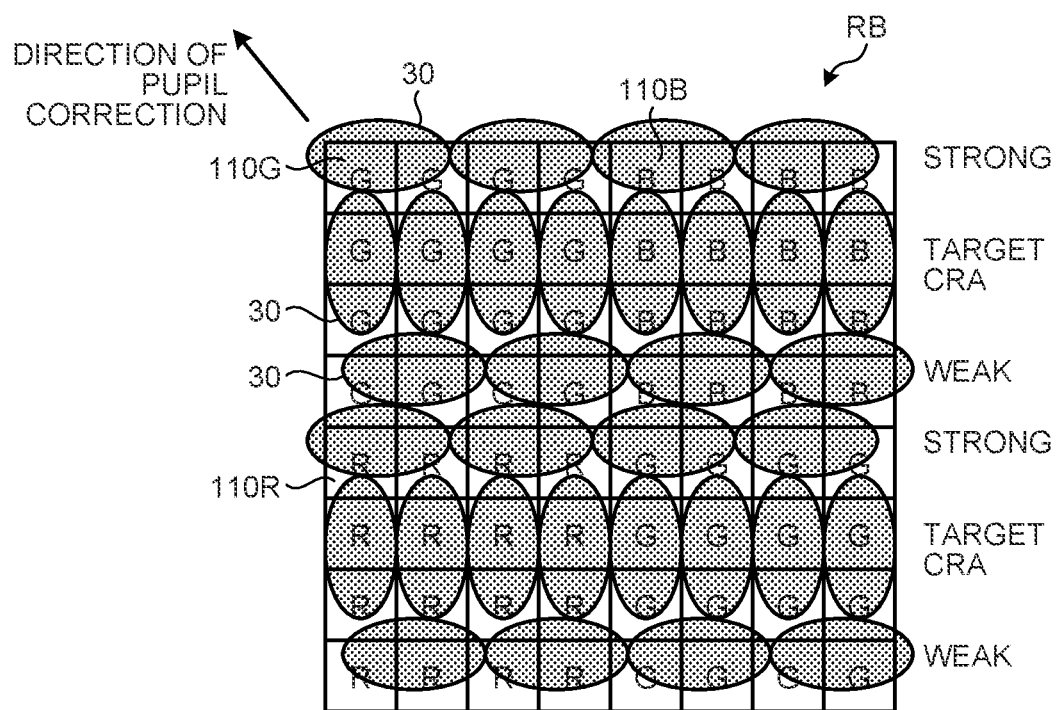
FIG. 24G is a diagram illustrating an example of a pupil correction in region RB according to the modification of the second embodiment.

FIG. 24G is a diagram illustrating an example of a pupil correction in the region RB according to the modification of the second embodiment. In the region RB, toward an upper-left side (image height center) of FIG. 24G in a diagonal direction, strong pupil corrections are made in two horizontal pixel sets at an upper stage of each pixel block, and weak pupil corrections are made in two pixel sets at a lower stage of each pixel block. In addition, in each vertical pixel set at a middle stage, an optimal pupil correction is made, in terms of the EPD of the main lens, according to an image height and a direction with respect to the image height center of each vertical pixel set. In the example of FIG. 24G, in the region RB, the pupil correction is made in a direction in which the direction (left side) of the pupil correction in the region R of FIG. 24C and the direction (upper side) of the pupil correction in the region CB of FIG. 24E are combined.

Note that, in addition to the pupil correction in each direction with respect to the image height center as described above, the pupil correction amount can be changed according to an image height.

Third Embodiment

Figure 25:
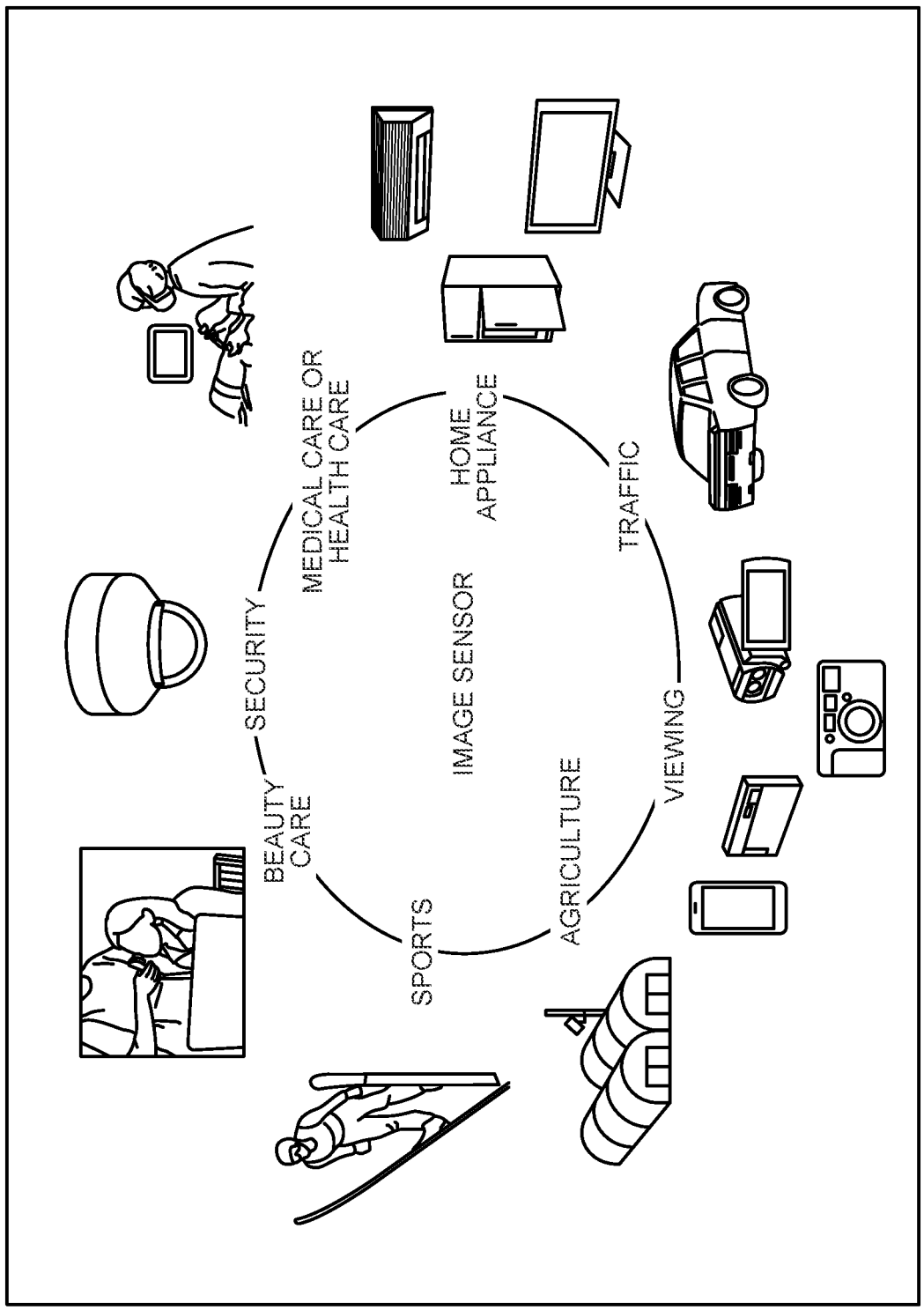
FIG. 25 is a diagram illustrating examples in which the imaging elements according to the first embodiment and its modification and the second embodiment and its modification are used.

Next, as a third embodiment, application examples of imaging elements 4 according to the first embodiment and its modification and the second embodiment and its modification of the present disclosure will be described. FIG. 25 is a diagram illustrating examples in which the imaging elements 4 according to the first embodiment and its modification and the second embodiment and its modification described above are used.

Each of the imaging elements 4 described above can be used, for example, in various cases where light such as visible light, infrared light, ultraviolet light, and X-rays is sensed, which will be described below.

- A device capturing images to be used for viewing, such as a digital camera or a portable device having a camera function.
- A device used for traffic, such as an in-vehicle sensor imaging the front, the rear, the surroundings, the inside, and the like of an automobile for safe driving, such as automatic stop, recognition of a driver's condition, or the like, a monitoring camera monitoring traveling vehicles and roads, or a distance measurement sensor measuring a distance between vehicles and the like.
- A device used for a home appliance, such as a TV, a refrigerator, or an air conditioner, to image a user's gesture and operate the appliance according to the gesture.
- A device used for medical care or health care, such as an endoscope or a device performing angiography by receiving infrared light.
- A device used for security, such as a monitoring camera for crime prevention or a camera for person authentication.
- A device used for beauty care, such as a skin measurement instrument for imaging a skin or a microscope for imaging a scalp.
- A device used for sports, such as an action camera or a wearable camera for sports or the like.
- A device used for agriculture, such as a camera for monitoring a condition of a farm or a crop.

[Additional Application Example of Technology According to Present Disclosure]

The technology according to the present disclosure (the present technology) can be applied to various products. For example, the technology according to the present disclosure may be applied to an endoscopic surgery system.

(Example of Application to In-Vivo Information Acquisition System)

Figure 26:
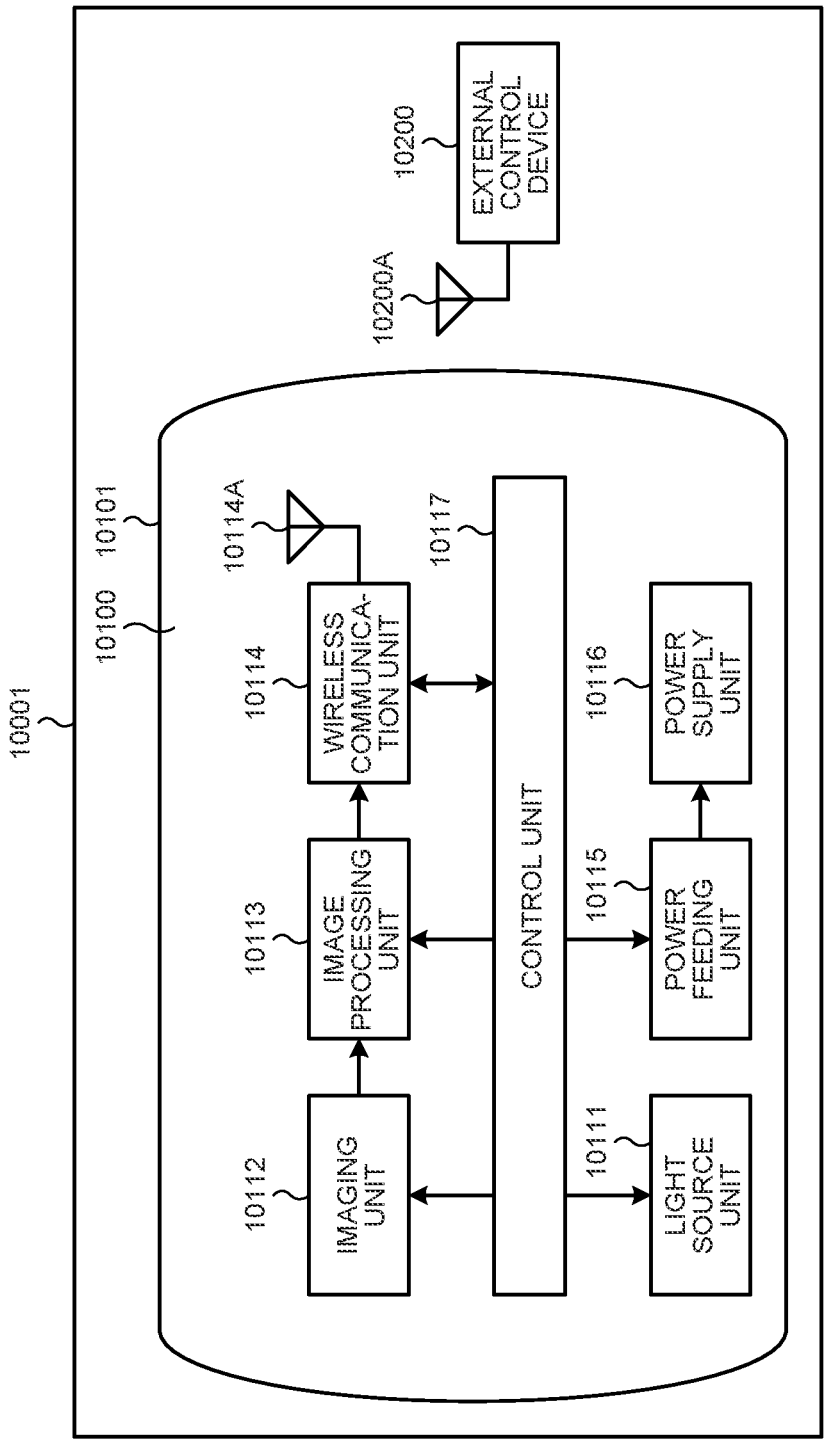
FIG. 26 is a block diagram illustrating an example of a schematic configuration of a patient's in-vivo information acquisition system using a capsule-type endoscope to which the technology according to the present disclosure can be applied.

FIG. 26 is a block diagram illustrating an example of a schematic configuration of a patient's in-vivo information acquisition system using a capsule-type endoscope to which the technology according to the present disclosure (the present technology) can be applied.

An in-vivo information acquisition system 10001 includes a capsule-type endoscope 10100 and an external control device 10200.

The capsule-type endoscope 10100 is swallowed by a patient at the time of examination. The capsule-type endoscope 10100, which has an imaging function and a wireless communication function, sequentially captures images of the inside of organs such as a stomach and an intestine (hereinafter also referred to as in-vivo images) at predetermined intervals while moving inside the organs by peristaltic movement or the like until being naturally discharged from the patient, and sequentially transmits information regarding the in-vivo images to the in-vitro external control device 10200 in a wireless manner.

The external control device 10200 integrally controls operations of the in-vivo information acquisition system 10001. In addition, the external control device 10200 receives the information regarding the in-vivo images transmitted from the capsule-type endoscope 10100, and generates image data for displaying the in-vivo images on a display device (not illustrated) on the basis of the received information regarding the in-vivo images.

In this manner, the in-vivo information acquisition system 10001 can frequently obtain an in-vivo image formed by imaging a patient's in-vivo condition from the time when the capsule-type endoscope 10100 is swallowed until the capsule-type endoscope 10100 is discharged.

Configurations and functions of the capsule-type endoscope 10100 and the external control device 10200 will be described in more detail.

The capsule-type endoscope 10100 includes a capsule-type casing 10101. In the casing 10101, a light source unit 10111, an imaging unit 10112, an image processing unit 10113, a wireless communication unit 10114, a power feeding unit 10115, a power supply unit 10116, and a control unit 10117 are housed.

The light source unit 10111 includes a light source, for example, a light emitting diode (LED) or the like, and irradiates an imaging field of view of the imaging unit 10112 with light.

The imaging unit 10112 includes an imaging element and an optical system including a plurality of lenses provided in front of the imaging element. Reflected light of light irradiated to a body tissue to be observed (hereinafter, referred to as observation light) is condensed by the optical system and incident on the imaging element. In the imaging unit 10112, the observation light incident on the imaging element is photoelectrically converted, and an image signal corresponding to the observation light is generated. The image signal generated by the imaging unit 10112 is provided to the image processing unit 10113.

The image processing unit 10113 includes processors such as a CPU and a graphics processing unit (GPU), and performs various kinds of signal processing on the image signal generated by the imaging unit 10112. The image processing unit 10113 provides the image signal subjected to the signal processing to the wireless communication unit 10114 as RAW data.

The wireless communication unit 10114 performs predetermined processing such as modulation processing on the image signal subjected to the signal processing by the image processing unit 10113, and transmits the processed image signal to the external control device 10200 via an antenna 10114A. In addition, the wireless communication unit 10114 receives a control signal related to drive control of the capsule-type endoscope 10100 from the external control device 10200 via the antenna 10114A. The wireless communication unit 10114 provides the control signal received from the external control device 10200 to the control unit 10117.

The power feeding unit 10115 includes an antenna coil for receiving power, a power regeneration circuit regenerating power from a current generated in the antenna coil, a booster circuit, etc. In the power feeding unit 10115, the power is generated using a so-called non-contact charging principle.

The power supply unit 10116 includes a secondary battery, and accumulates the power generated by the power feeding unit 10115. In FIG. 26, in order to avoid complication of the drawing, an arrow or the like indicating a destination to which the power is supplied from the power supply unit 10116 is not illustrated, but the power accumulated in the power supply unit 10116 is supplied to the light source unit 10111, the imaging unit 10112, the image processing unit 10113, the wireless communication unit 10114, and the control unit 10117, and can be used for driving them.

The control unit 10117 includes a processor such as a CPU, and appropriately controls driving of the light source unit 10111, the imaging unit 10112, the image processing unit 10113, the wireless communication unit 10114, and the power feeding unit 10115 according to the control signal transmitted from the external control device 10200.

The external control device 10200 includes a processor such as a CPU or a GPU, a microcomputer on which a processor and a storage element such as a memory are mixedly mounted, a control board, or the like. The external control device 10200 controls an operation of the capsule-type endoscope 10100 by transmitting a control signal to the control unit 10117 of the capsule-type endoscope 10100 via an antenna 10200A. In the capsule-type endoscope 10100, a condition under which the light source unit 10111 irradiates an observation target with light can be changed, for example, by the control signal from the external control device 10200. In addition, an imaging condition (for example, a frame rate, an exposure value, or the like in the imaging unit 10112) can be changed by the control signal from the external control device 10200. In addition, details of processing in the image processing unit 10113 or a condition (for example, a transmission interval, the number of transmitted images, or the like) under which the wireless communication unit 10114 transmits the image signal may be changed by the control signal from the external control device 10200.

In addition, the external control device 10200 performs various kinds of image processing on the image signal transmitted from the capsule-type endoscope 10100, and generates image data for displaying the captured in-vivo image on the display device. As the image processing, various kinds of signal processing, for example, development processing (demosaic processing), high-definition processing (band emphasis processing, super-resolution processing, noise reduction processing, image stabilization processing, or the like), enlargement processing (electronic zoom processing), and the like, can be performed alone or in combination. The external control device 10200 controls driving of the display device to display the captured in-vivo image on the basis of the generated image data. Alternatively, the external control device 10200 may cause a recording device (not illustrated) to record the generated image data or cause a printing device (not illustrated) to print out the generated image data.

An example of the in-vivo information acquisition system to which the technology according to the present disclosure can be applied has been described above. The technology according to the present disclosure can be applied to, for example, the imaging unit 10112 among the above-described components. By applying the imaging element 4 according to the present disclosure to the imaging unit 10112, autofocusing can be performed well even in a case where zooming or the like is performed, and a higher-quality in-vivo image or the like can be acquired.

(Example of Application to Endoscopic Surgery System)

Figure 27:
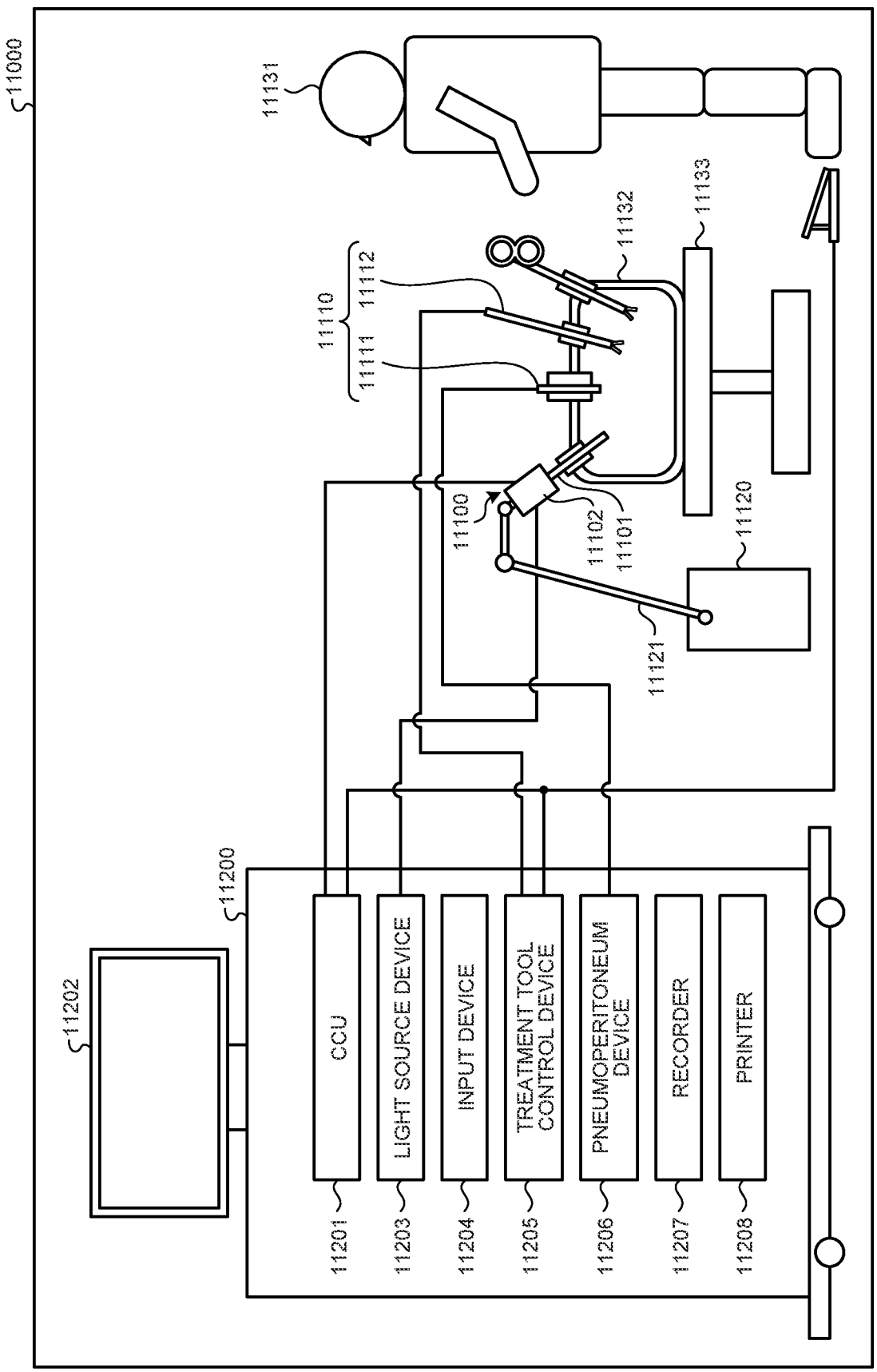
FIG. 27 is a diagram illustrating an example of a schematic configuration of an endoscopic surgery system to which the technology according to the present disclosure can be applied.

The technology according to the present disclosure may further be applied to an endoscopic surgery system. FIG. 27 is a diagram illustrating an example of a schematic configuration of an endoscopic surgery system to which the technology according to the present disclosure (the present technology) can be applied.

In FIG. 27, it is illustrated that an operator (doctor) 11131 is performing surgery on a patient 11132 on a patient bed 11133 using an endoscopic surgery system 11000. As illustrated, the endoscopic surgery system 11000 includes an endoscope 11100, other surgical tools 11110 such as a pneumoperitoneum tube 11111 and an energy treatment tool 11112, a support arm device 11120 supporting the endoscope 11100, and a cart 11200 on which various kinds of devices for endoscopic surgery are mounted.

The endoscope 11100 includes a lens barrel 11101 whose region of a predetermined length from a distal end thereof is inserted into a somatic cavity of the patient 11132, and a camera head 11102 connected to a proximal end of the lens barrel 11101. In the illustrated example, the endoscope 11100 is configured as a so-called rigid scope having the lens barrel 11101 that is rigid. However, the endoscope 11100 may be configured as a so-called flexible scope having a lens barrel that is flexible.

An opening into which an objective lens has been fitted is provided at the distal end of the lens barrel 11101. A light source device 11203 is connected to the endoscope 11100, and light generated by the light source device 11203 is guided up to the distal end of the lens barrel by a light guide that is provided to extend inside the lens barrel 11101, and the light is irradiated toward an observation target in the somatic cavity of the patient 11132 via the objective lens. Note that the endoscope 11100 may be a forward-viewing scope, an oblique-viewing scope, or a side-viewing scope.

An optical system and an imaging element are provided inside the camera head 11102, and reflected light (observation light) from the observation target is condensed on the imaging element by the optical system. The observation light is photoelectrically converted by the imaging element, and an electric signal corresponding to the observation light, that is, an image signal corresponding to the observation image is generated. The image signal is transmitted to a camera control unit (CCU) 11201 as RAW data.

The CCU 11201 includes a CPU, a GPU, and the like, and integrally controls operations of the endoscope 11100 and a display device 11202. Further, the CCU 11201 receives an image signal from the camera head 11102, and performs various kinds of image processing for displaying an image based on the image signal, for example, development processing (demosaic processing) and the like, on the image signal.

The display device 11202 displays an image based on the image signal subjected to the image processing by the CCU 11201 according to the control of the CCU 11201.

The light source device 11203 includes a light source, for example, a light emitting diode (LED) or the like, and supplies irradiation light to the endoscope 11100 at the time of imaging a surgical site or the like.

An input device 11204 is an input interface for the endoscopic surgery system 11000. A user can input various kinds of information and instructions to the endoscopic surgery system 11000 via the input device 11204. For example, the user inputs an instruction for changing an imaging condition of the endoscope 11100 (such as type of irradiation light, magnification, or focal length) or the like.

A treatment tool control device 11205 controls driving of the energy treatment tool 11112 for cauterization or incision of tissue, sealing of a blood vessel, or the like. A pneumoperitoneum device 11206 feeds gas into the somatic cavity of the patient 11132 via the pneumoperitoneum tube 11111 to inflate the somatic cavity of the patient 11132 for the purpose of securing a visual field for the endoscope 11100 and securing a working space for the operator. A recorder 11207 is a device capable of recording various kinds of information regarding surgery. The printer 11208 is a device capable of printing out various kinds of information regarding surgery in any format such as text, image, or graph.

Note that the light source device 11203 supplying irradiation light to the endoscope 11100 at the time of imaging a surgical site or the like can include, for example, an LED, a laser light source, or a white light source constituted by a combination thereof. In a case where the white light source is constituted by a combination of RGB laser light sources, it is possible to control an output intensity and an output timing of each color (each wavelength) with high accuracy, thereby adjusting a white balance of an image to be captured in the light source device 11203. Furthermore, in this case, by irradiating the observation target with laser light from each of the RGB laser light sources in a time division manner and controlling the driving of the imaging element in the camera head 11102 in synchronization with the irradiation timing, an image corresponding to each of RGB can be captured in a time division manner. According to this method, a color image can be obtained without providing color filters in the imaging element.

In addition, the driving of the light source device 11203 may be controlled to change an intensity of light to be output every predetermined time interval. By controlling the driving of the imaging element in the camera head 11102 in synchronization with the timing at which the intensity of the light is changed to acquire an image in a time division manner and synthesizing the image, a high dynamic range image without so-called underexposure and overexposure can be generated.

In addition, the light source device 11203 may be configured to be able to supply light having a predetermined wavelength band corresponding to special light observation. In the special light observation, so-called narrow band imaging is performed to image predetermined tissue such as a blood vessel of a superficial portion of a mucous membrane with high contrast, by irradiating light having a narrower band than irradiation light (that is, white light) at the time of normal observation, for example, using the fact that absorption of light by body tissue depends on a wavelength of the light. Alternatively, in the special light observation, fluorescence observation may be performed to obtain an image using fluorescence generated by irradiating excitation light. In the fluorescence observation, fluorescence can be observed from body tissue by irradiating the body tissue with excitation light (autofluorescence observation), or a fluorescent image can be obtained by locally injecting a reagent such as indocyanine green (ICG) into body tissue and irradiating the body tissue with excitation light corresponding to a fluorescence wavelength of the reagent. The light source device 11203 can be configured to be able to supply narrow band light and/or excitation light corresponding to such special light observation.

Figure 28:
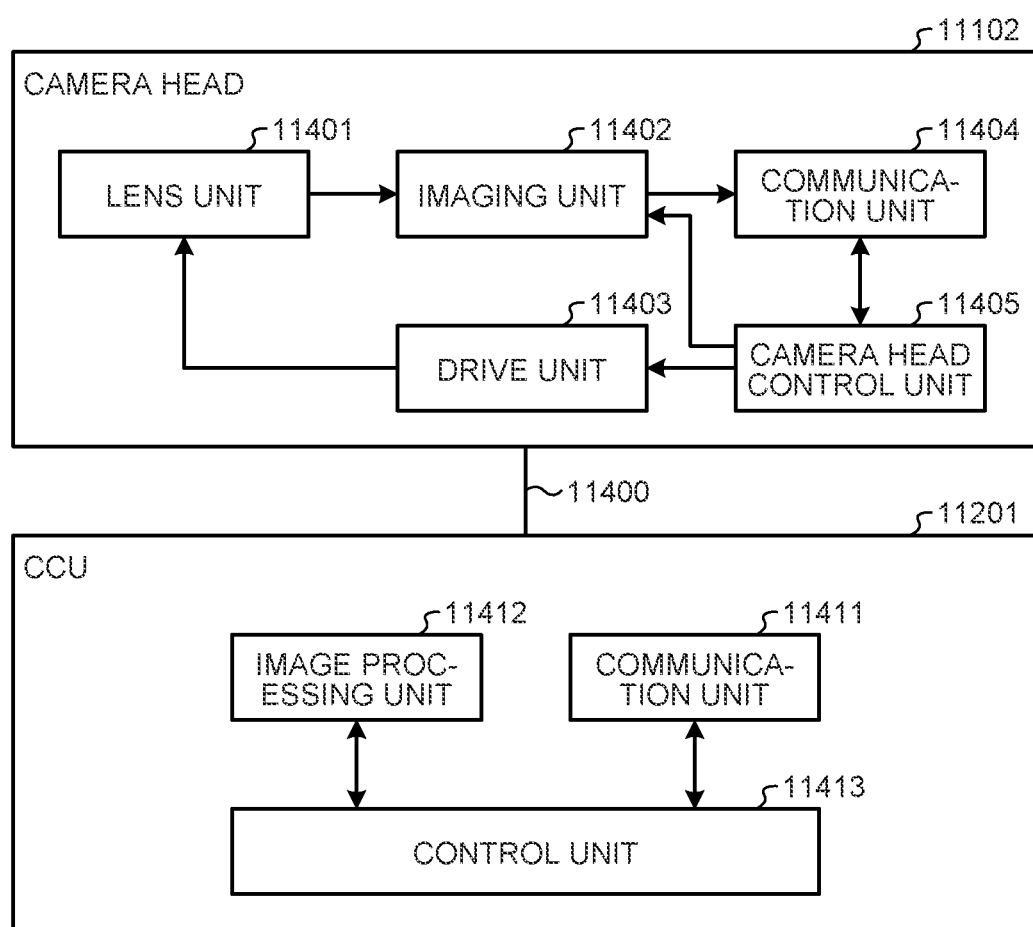
FIG. 28 is a block diagram illustrating an example of a functional configuration between a camera head and a CCU.

FIG. 28 is a block diagram illustrating an example of a functional configuration between the camera head 11102 and the CCU 11201 illustrated in FIG. 27.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided in a portion for connection with the lens barrel 11101. The observation light taken in from the distal end of the lens barrel 11101 is guided to the camera head 11102 and incident on the lens unit 11401. The lens unit 11401 is configured by combining a plurality of lenses including a zoom lens and a focus lens.

The imaging unit 11402 includes an imaging element. The imaging unit 11402 may include one imaging element (so-called single-plate type) or a plurality of imaging elements (so-called multi-plate type). In a case where the imaging unit 11402 is configured in the multi-plate type, for example, image signals corresponding to RGB, respectively, may be generated by the respective imaging elements, and the generated image signals may be combined together, thereby obtaining a color image. Alternatively, the imaging unit 11402 may include a pair of imaging elements for acquiring image signals corresponding to three-dimensional (3D) display for a right eye and for a left eye, respectively. Since the 3D display is performed, an operator 11131 can more accurately grasp a depth of biological tissue at a surgical site. Note that, in a case where the imaging unit 11402 is configured in the multi-plate type, a plurality of lens units 11401 can be provided to correspond to the respective imaging elements.

In addition, the imaging unit 11402 is not necessarily provided in the camera head 11102. For example, the imaging unit 11402 may be provided immediately after the objective lens inside the lens barrel 11101.

The drive unit 11403 includes an actuator, and moves the zoom lens and the focus lens of the lens unit 11401 by a predetermined distance along an optical axis according to control of the camera head control unit 11405. Thus, a magnification and a focus for an image to be captured by the imaging unit 11402 can be appropriately adjusted.

The communication unit 11404 includes a communication device for transmitting and receiving various kinds of information to and from the CCU 11201. The communication unit 11404 transmits an image signal obtained from the imaging unit 11402 as RAW data to the CCU 11201 via the transmission cable 11400.

In addition, the communication unit 11404 receives a control signal for controlling driving of the camera head 11102 from the CCU 11201, and supplies the control signal to the camera head control unit 11405. The control signal includes information regarding imaging conditions, for example, information for specifying a frame rate for an image to be captured, information for specifying an exposure value at an imaging time, and/or information for specifying a magnification and a focus for an image to be captured, or the like.

Note that the imaging conditions such as frame rate, exposure value, magnification, and focus may be appropriately specified by the user, or may be automatically set by the control unit 11413 of the CCU 11201 on the basis of the acquired image signal. In the latter case, the endoscope 11100 has so-called auto exposure (AE), auto focus (AF), and auto white balance (AWB) functions.

The camera head control unit 11405 controls driving of the camera head 11102 on the basis of the control signal from the CCU 11201 received via the communication unit 11404.

The communication unit 11411 includes a communication device for transmitting and receiving various kinds of information to and from the camera head 11102. The communication unit 11411 receives an image signal transmitted from the camera head 11102 via the transmission cable 11400.

In addition, the communication unit 11411 transmits a control signal for controlling driving of the camera head 11102 to the camera head 11102. The image signal and the control signal can be transmitted by electric communication, optical communication, or the like.

The image processing unit 11412 performs various kinds of image processing on the image signal that is RAW data transmitted from the camera head 11102.

The control unit 11413 performs various kinds of control relating to imaging of a surgical site or the like by the endoscope 11100 and displaying of a captured image obtained by imaging the surgical site or the like. For example, the control unit 11413 generates a control signal for controlling driving of the camera head 11102.

In addition, the control unit 11413 causes the display device 11202 to display the captured image of the surgical site or the like on the basis of the image signal subjected to the image processing by the image processing unit 11412. At this time, the control unit 11413 may recognize various objects in the captured image using various image recognition technologies. For example, the control unit 11413 can recognize a surgical tool such as forceps, a specific biological part, bleeding, a mist at the time of using the energy treatment tool 11112, and the like by detecting a shape, a color, and the like of an edge of an object included in the captured image. When displaying the captured image on the display device 11202, the control unit 11413 may superimpose various kinds of surgery support information on the image of the surgical site by using the recognition result. Since the image of the surgical site with the surgery support information superimposed thereon is displayed and presented to the operator 11131, it is possible to lessen burden on the operator 11131, and the operator 11131 can reliably proceed with surgery.

The transmission cable 11400 connecting the camera head 11102 and the CCU 11201 to each other is an electric signal cable dealing with electric signal communication, an optical fiber dealing with optical communication, or a composite cable thereof.

Here, in the example of FIG. 28, communication is performed in a wired manner using the transmission cable 11400. However, communication between the camera head 11102 and the CCU 11201 may be performed in a wireless manner.

An example of the endoscopic surgery system to which the technology according to the present disclosure can be applied has been described above. The technology according to the present disclosure can be applied to, for example, the endoscope 11100 or the imaging unit 11402 of the camera head 11102 among the above-described components. By applying the imaging element 4 according to the present disclosure to the imaging unit 11402, autofocusing can be performed well even in a case where zooming or the like is performed, and a higher-quality captured image can be acquired. Thus, it is possible to lessen burden on the operator 11131, and the operator 11131 can reliably proceed with surgery.

Note that although the endoscopic surgery system has been described as an example here, the technology according to the present disclosure may also be applied to, for example, a microscopic surgery system or the like.

(Example of Application to Moving Body)

The technology according to the present disclosure may be further applied to devices mounted on various types of moving bodies such as an m-car, an electric car, a hybrid electric car, a motorcycle, a bicycle, a personal mobility, an airplane, a drone, a ship, and a robot.

Figure 29:
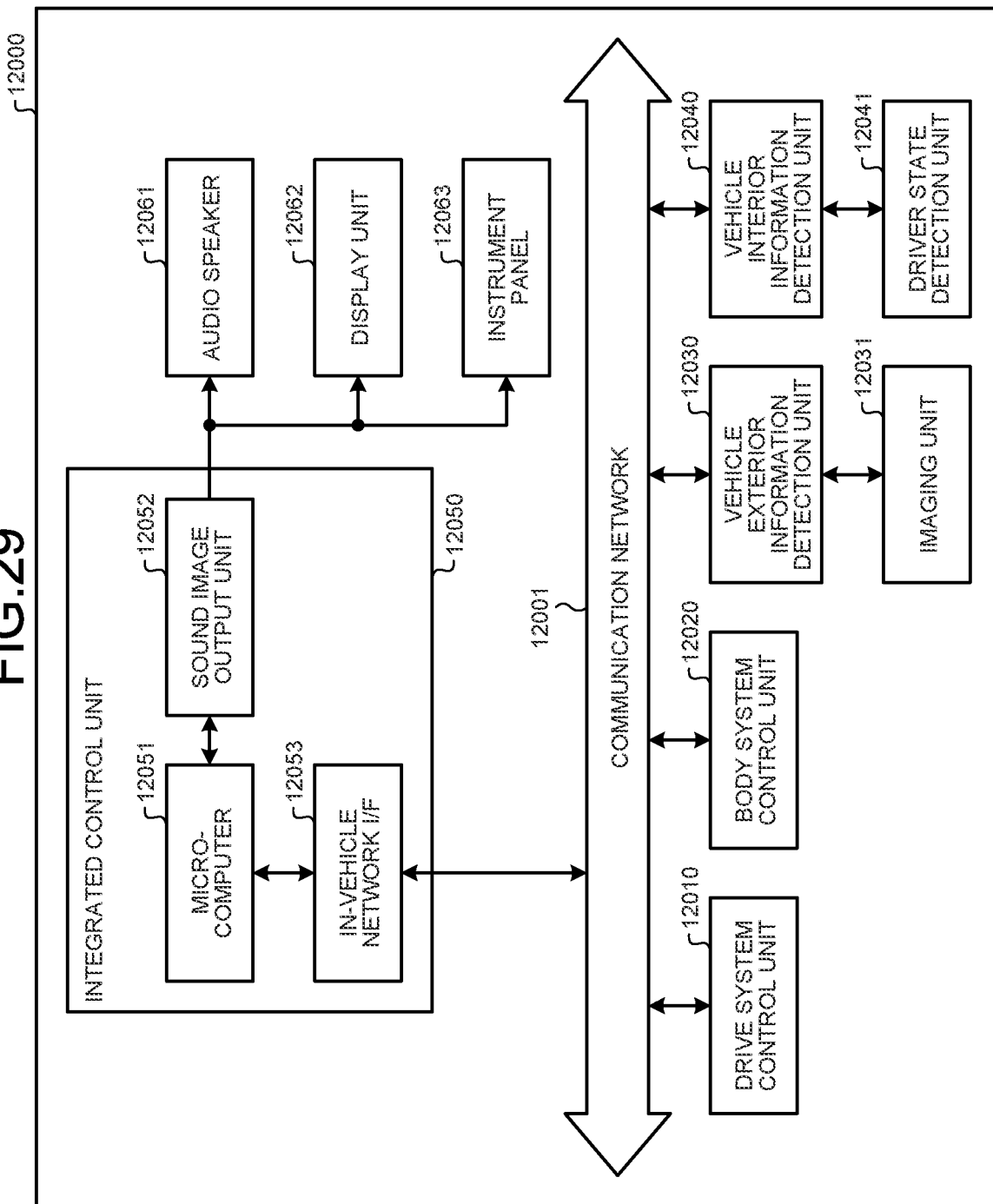
FIG. 29 is a block diagram illustrating a schematic configuration example of a vehicle control system which is an example of a moving body control system to which the technology according to the present disclosure can be applied.

FIG. 29 is a block diagram illustrating a schematic configuration example of a vehicle control system which is an example of a moving body control system to which the technology according to the present disclosure can be applied.

A vehicle control system 12000 includes a plurality of electronic control units connected to each other via a communication network 12001. In the example illustrated in FIG. 29, the vehicle control system 12000 includes a drive system control unit 12010, a body system control unit 12020, a vehicle exterior information detection unit 12030, a vehicle interior information detection unit 12040, and an integrated control unit 12050. Furthermore, as functional components of the integrated control unit 12050, a microcomputer 12051, a sound image output unit 12052, and an in-vehicle network interface (I/F) 12053 are illustrated.

The drive system control unit 12010 controls operations of devices related to a drive system of a vehicle according to various programs. For example, the drive system control unit 12010 functions as a control device for a driving force generation device for generating a driving force of the vehicle such as an internal combustion engine or a driving motor, a driving force transmission mechanism for transmitting the driving force to wheels, a steering mechanism adjusting a steering angle of the vehicle, a braking device generating a braking force of the vehicle, and the like.

The body system control unit 12020 controls operations of various devices mounted on a vehicle body according to various programs. For example, the body system control unit 12020 functions as a control device for a keyless entry system, a smart key system, a power window device, or various types of lamps such as a head lamp, a back lamp, a brake lamp, a blinker, and a fog lamp. In this case, radio waves transmitted from a portable machine substituting for a key or signals of various switches can be input to the body system control unit 12020. The body system control unit 12020 receives these radio waves or signals input thereto, and controls a door lock device, a power window device, a lamp, and the like of the vehicle.

The vehicle exterior information detection unit 12030 detects information outside the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image of the outside of the vehicle, and receives the captured image. The vehicle exterior information detection unit 12030 may perform object detection processing or distance detection processing with respect to a person, a vehicle, an obstacle, a sign, a character on a road surface, or the like on the basis of the received image. For example, the vehicle exterior information detection unit 12030 performs image processing on the received image, and performs object detection processing or distance detection processing on the basis of the image processing result.

The imaging unit 12031 is an optical sensor receiving light and outputting an electric signal corresponding to an amount of the received light. The imaging unit 12031 can output the electric signal as an image or as distance measurement information. In addition, the light received by the imaging unit 12031 may be visible light or invisible light such as infrared rays.

The vehicle interior information detection unit 12040 detects information inside the vehicle. For example, a driver state detection unit 12041 detecting a driver's state is connected to the vehicle interior information detection unit 12040. The driver state detection unit 12041 includes, for example, a camera imaging the driver. On the basis of detection information input from the driver state detection unit 12041, the vehicle interior information detection unit 12040 may calculate a degree of fatigue or a degree of concentration of the driver or may determine whether or not the driver is dozing off.

The microcomputer 12051 can calculate a control target value of the driving force generation device, the steering mechanism, or the braking device on the basis of the information inside or outside the vehicle acquired by the vehicle exterior information detection unit 12030 or the vehicle interior information detection unit 12040, and output a control command to the drive system control unit 12010. For example, the microcomputer 12051 can perform cooperative control for the purpose of realizing functions of an advanced driver assistance system (ADAS) including collision avoidance or impact mitigation of the vehicle, follow-up traveling based on a distance between vehicles, constant-speed vehicle traveling, warning of vehicle collision, warning of vehicle lane departure, and the like.

Furthermore, the microcomputer 12051 can perform cooperative control for the purpose of automatic driving to autonomously travel or the like, rather than depending on a driver's operation, by controlling the driving force generation device, the steering mechanism, the braking device, or the like on the basis of the information around the vehicle acquired by the vehicle exterior information detection unit 12030 or the vehicle interior information detection unit 12040.

In addition, the microcomputer 12051 can output a control command to the body system control unit 12020 on the basis of the information outside the vehicle acquired by the vehicle exterior information detection unit 12030. For example, the microcomputer 12051 can perform cooperative control for the purpose of preventing glare, such as switching from a high beam to a low beam, by controlling the head lamp according to a position of a preceding vehicle or an oncoming vehicle detected by the vehicle exterior information detection unit 12030.

The sound image output unit 12052 transmits an output signal of at least one of a sound and an image to an output device capable of visually or acoustically notifying an occupant of the vehicle or the outside of the vehicle of information. In the example of FIG. 29, an audio speaker 12061, a display unit 12062, and an instrument panel 12063 are illustrated as the output device. For example, the display unit 12062 may include at least one of an on-board display and a head-up display.

Figure 30:
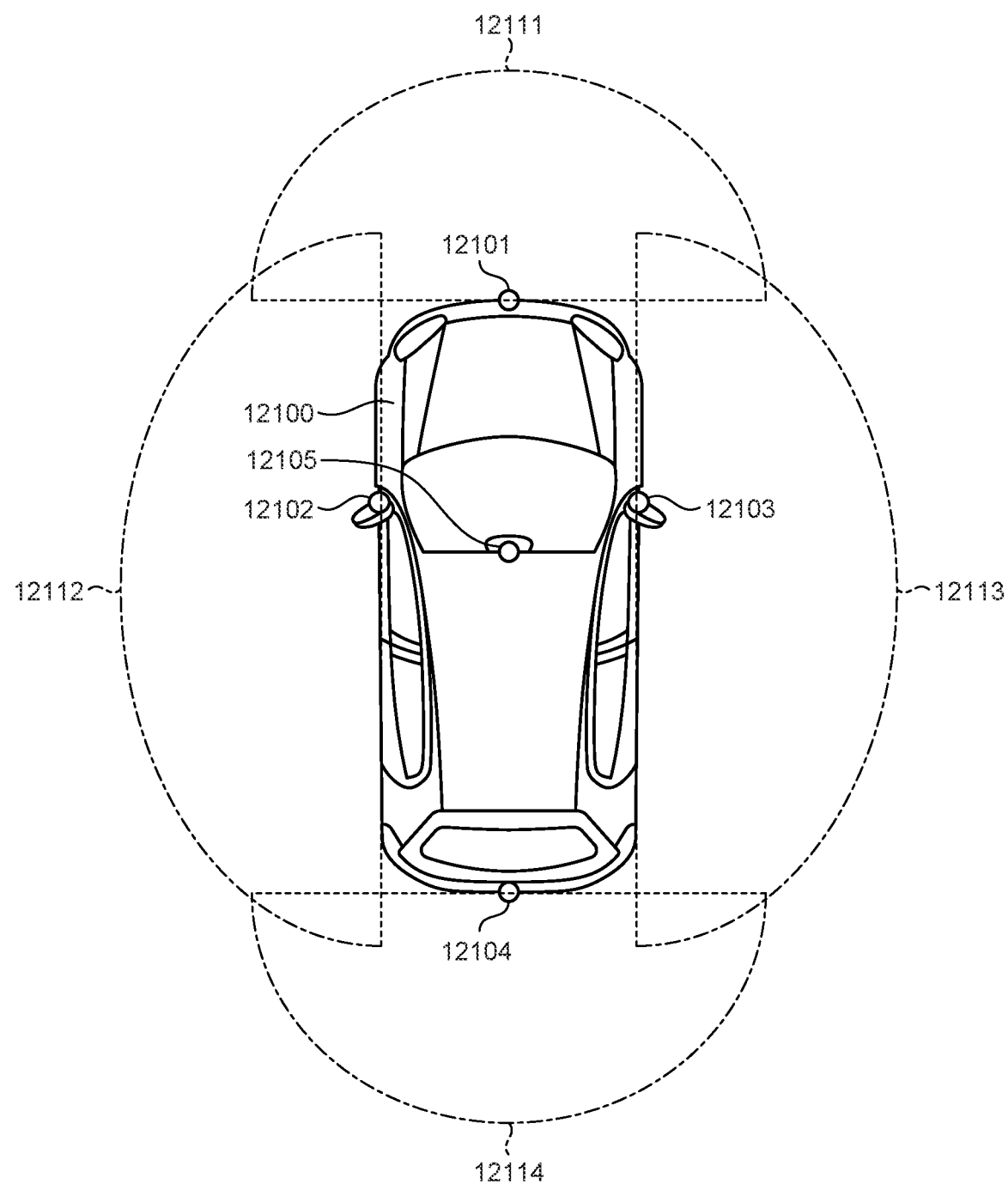
FIG. 30 is a diagram illustrating an example of a position at which an imaging unit is installed.

FIG. 30 is a diagram illustrating an example of a position at which the imaging unit 12031 is installed. In FIG. 30, a vehicle 12100 includes imaging units 12101, 12102, 12103, 12104, and 12105 as the imaging unit 12031.

The imaging units 12101, 12102, 12103, 12104, and 12105 are positioned, for example, at a front nose, at a side mirror, at a rear bumper, at a back door, and at an upper portion of a windshield in a vehicle interior of the vehicle 12100. The imaging unit 12101 provided at the front nose and the imaging unit 12105 provided at the upper portion of the windshield in the vehicle interior of the vehicle mainly acquire images in front of the vehicle 12100. The imaging units 12102 and 12103 provided at the side mirrors mainly acquire images around the sides of the vehicle 12100. The imaging unit 12104 provided at the rear bumper or the back door mainly acquires images behind the vehicle 12100. The front images acquired by the imaging units 12101 and 12105 are mainly used for detecting a preceding vehicle, a pedestrian, an obstacle, a traffic light, a traffic sign, a lane, and the like.

Note that an example of an imaging range of each of the imaging units 12101 to 12104 is illustrated in FIG. 30. An imaging range 12111 indicates an imaging range of the imaging unit 12101 provided at the front nose, imaging ranges 12112 and 12113 indicate imaging ranges of the imaging units 12102 and 12103 provided at the side mirrors, respectively, and an imaging range 12114 indicates an imaging range of the imaging unit 12104 provided at the rear bumper or the back door. For example, a bird's-eye view image of the vehicle 12100 as viewed from above is obtained by superimposing image data captured by the imaging units 12101 to 12104.

At least one of the imaging units 12101 to 12104 may have a function of acquiring distance information. For example, at least one of the imaging units 12101 to 12104 may be a stereo camera including a plurality of imaging elements, or may be an imaging element having pixels for detecting a phase difference.

For example, the microcomputer 12051 can obtain a distance to each three-dimensional object in the imaging ranges 12111 to 12114 and a temporal change of the distance (a relative speed with respect to the vehicle 12100) on the basis of the distance information obtained from the imaging units 12101 to 12104, thereby extracting, as a preceding vehicle, a three-dimensional object traveling at a predetermined speed (for example, 0 km/h or more) in the substantially same direction as the vehicle 12100, in particular, a three-dimensional object closest to the vehicle 12100 on a traveling track. In addition, the microcomputer 12051 can set an inter-vehicle distance to be secured in advance with respect to an immediate preceding vehicle to perform automatic brake control (including follow-up stop control), automatic acceleration control (including follow-up start control), and the like. As described above, it is possible to perform cooperative control for the purpose of automatic driving to autonomously travel or the like, rather than depending on a driver's operation.

For example, on the basis of the distance information obtained from the imaging units 12101 to 12104, the microcomputer 12051 can classify three-dimensional object data related to three-dimensional objects into a two-wheel vehicle, an ordinary vehicle, a large vehicle, a pedestrian, and other three-dimensional objects such as a utility pole, and extract the classified three-dimensional object data to be used in automatically avoiding an obstacle. For example, the microcomputer 12051 identifies obstacles around the vehicle 12100 as obstacles that can be visually recognized by the driver of the vehicle 12100 and obstacles that are difficult for the driver of the vehicle 12100 to visually recognize. Then, the microcomputer 12051 can determine a risk of collision indicating a degree of risk of collision with each obstacle. In a situation where the risk of collision is a set value or more and there is a possibility of collision, the microcomputer 12051 can perform driving assistance to avoid the collision by outputting an alarm to the driver via the audio speaker 12061 or the display unit 12062 or performing forced deceleration or collision avoidance steering via the drive system control unit 12010.

At least one of the imaging units 12101 to 12104 may be an infrared camera detecting infrared rays. For example, the microcomputer 12051 can recognize a pedestrian by determining whether or not there is a pedestrian in images captured by the imaging units 12101 to 12104. Such recognition of a pedestrian is performed, for example, by extracting feature points in the images captured by the imaging units 12101 to 12104 as infrared cameras and performing pattern matching processing on a series of feature points indicating an outline of an object to determine whether or not the object is a pedestrian. When the microcomputer 12051 recognizes a pedestrian by determining that there is a pedestrian in the images captured by the imaging units 12101 to 12104, the sound image output unit 12052 controls the display unit 12062 to display a square contour line superimposed to emphasize the recognized pedestrian. Furthermore, the sound image output unit 12052 may control the display unit 12062 to display an icon or the like indicating a pedestrian at a desired position.

An example of the vehicle control system to which the technology according to the present disclosure can be applied has been described above. The technology according to the present disclosure can be applied to, for example, the imaging unit 12031 among the above-described components. By applying the imaging element 4 according to the present disclosure to the imaging unit 12031, autofocusing can be performed well even in a case where zooming or the like is performed, and a higher-quality captured image can be acquired.

Note that the effects described in the present specification are merely examples and are not limited, and there may be other effects as well.

Note that the present technology can also have the following configurations.

(1) An imaging element comprising:
  a light receiving unit that includes
    a plurality of photoelectric conversion elements arranged in a lattice-pattern array, and
    a plurality of lenses provided for respective sets of elements on a one-to-one basis, each set of elements including two or more of the plurality of photoelectric conversion elements arranged adjacent to each other,
  wherein in the light receiving unit,
    among a plurality of pixel sets each including the set of elements and one of the plurality of lenses provided in the set of elements, at least two pixel sets adjacent to each other are different from each other in pupil correction amount.

(2) The imaging element according to the above (1),
  wherein the light receiving unit includes
    a plurality of pixel blocks each having n×n photoelectric conversion elements (n is an integer of 2 or more) receiving light having the same wavelength band, among the plurality of photoelectric conversion elements, and arranged in a lattice-pattern array,
    the plurality of pixel blocks are arranged according to a pattern in which pixel blocks having photoelectric conversion elements receiving light having the same wavelength band are not adjacent to each other, and
    at least one of the plurality of pixel blocks includes two of the pixel sets that are different from each other in the pupil correction amount.

(3) The imaging element according to the above (2),
  wherein the n is an integer of 3 or more, and at least one of the plurality of pixel blocks includes three or more of the pixel sets that are different from each other in the pupil correction amount.

(4) The imaging element according to the above (2) or (3),
  wherein the n is an integer of 3 or more, and at least one of the plurality of pixel blocks includes two of the pixel sets that are different from each other in direction in which adjacent ones of the plurality of photoelectric conversion elements included in the light receiving unit are aligned in the array.

(5) The imaging element according to any one of the above (2) to (4), further comprising
  a control unit that controls read-out from the plurality of photoelectric conversion elements,
  wherein the control unit has,
    as a read-out mode in which a plurality of outputs corresponding, on a one-to-one basis, to the respective photoelectric conversion elements arranged in each of the plurality of pixel blocks are read out:
    a mode in which the plurality of outputs are individually read out; and
    a mode in which the plurality of outputs are read out as one output by being combined in the pixel block where the respective photoelectric conversion elements corresponding to the plurality of outputs are arranged.

(6) The imaging element according to the above (2),
  wherein the n is 2.

(7) The imaging element according to any one of the above (2) to (6),
  wherein the light receiving unit further includes
    a filter provided on an incident surface of each of the plurality of photoelectric conversion elements to restrict a wavelength band of incident light, and a first light shielding body provided around the filter.

(8) The imaging element according to the above (7),
  wherein positions of the filter and the first light shielding body with respect to one of the plurality of photoelectric conversion elements corresponding to the filter and the first light shielding body are different between the at least two pixel sets adjacent to each other, each including the photoelectric conversion element, so that the at least two pixel sets are different from each other in the pupil correction amount.

(9) The imaging element according to any one of the above (2) to (8),
  wherein the light receiving unit further includes
    a second light shielding body that is a groove formed in a depth direction of a substrate, in which each of the plurality of photoelectric conversion elements is formed, with respect to an incident surface of each of the plurality of photoelectric conversion elements, and
    the second light shielding body is
    formed between the plurality of pixel blocks.

(10) The imaging element according to the above (9),
  wherein the second light shielding body is further formed between the pixel sets.

(11) The imaging element according to any one of the above (1) to (10),
  wherein a position of the lens included in the pixel set with respect to the set of elements included in the pixel set is different between the at least two pixel sets adjacent to each other, so that the at least two pixel sets are different from each other in the pupil correction amount.

(12) The imaging element according to any one of the above (1) to (11),
wherein the pupil correction amount and a direction in which a pupil correction is made in the pupil correction amount are further different depending on a position of a light receiving surface including an incident surface of each of the plurality of photoelectric conversion elements with respect to an image height center corresponding to an optical axis of a main lens for irradiating the light receiving surface with light.

(13) The imaging element according to any one of the above (1) to (12),
wherein the light receiving unit further includes
a mask for restricting light incident on the set of elements included in the pixel set, and
a position of the mask with respect to the set of elements included in the pixel set is different between the at least two pixel sets adjacent to each other, so that the at least two pixel sets are different from each other in the pupil correction amount.

(14) An electronic device comprising:
a light receiving unit that includes
a plurality of photoelectric conversion elements arranged in a lattice-pattern array, and
a plurality of lenses provided for respective sets of elements on a one-to-one basis, each set of elements including two or more of the plurality of photoelectric conversion elements arranged adjacent to each other;
an optical unit that guides external light to the light receiving unit;
an image processing unit that generates image data by executing image processing on the basis of a plurality of outputs read out from the plurality of photoelectric conversion elements, respectively; and
a storage unit that stores the image data generated by the image processing unit,
wherein in the light receiving unit,
among a plurality of pixel sets each including the set of elements and one of the plurality of lenses provided in the set of elements, at least two pixel sets adjacent to each other are different from each other in pupil correction amount.

REFERENCE SIGNS LIST

1 ELECTRONIC DEVICE
4 IMAGING ELEMENT
5 IMAGE PROCESSING UNIT
11 PIXEL ARRAY UNIT
30, 31 OCL
50, 113, 1020a, 1020b LIGHT SHIELDING BODY
110, 110a, 110b, 110a', 110b', 110R, 110G, $110G_1$, $110G_2$, $110G_3$, $110G_4$, 110B, 110w PIXEL
111, 111a, 111b, 111a', 111b', $111G_1$, $111G_2$, $111G_3$, $111G_4$, 111wa, 111wb PHOTOELECTRIC CONVERSION UNIT
112, 112a, 112b, $112G_1$, $112G_2$, $112G_3$, $112G_4$, 112R COLOR FILTER

The invention claimed is:

1. An imaging element, comprising:
a light receiving unit that includes:
a plurality of photoelectric conversion elements arranged in a lattice-pattern array, and
a plurality of lenses provided for respective sets of elements on a one-to-one basis, each set of elements including two or more of the plurality of photoelectric conversion elements arranged adjacent to each other, and
a plurality of pixel blocks each having n×n photoelectric conversion elements receiving light having a same wavelength band, among the plurality of photoelectric conversion elements, and arranged in a lattice-pattern array,
wherein, in the light receiving unit,—among a plurality of pixel sets each including the set of elements and one of the plurality of lenses provided in the set of elements, at least two pixel sets adjacent to each other are different from each other in pupil correction amount,
wherein the plurality of pixel blocks are arranged according to a pattern in which pixel blocks having photoelectric conversion elements receiving light having the same wavelength band are not adjacent to each other, and
wherein at least one of the plurality of pixel blocks includes two of the pixel sets that are different from each other in the pupil correction amount,
wherein the n is an integer of 3 or more, and
wherein at least one of the plurality of pixel blocks includes three or more of the pixel sets that are different from each other in the pupil correction amount.

2. An imaging element, comprising:
a light receiving unit that includes:
a plurality of photoelectric conversion elements arranged in a lattice-pattern array, and
a plurality of lenses provided for respective sets of elements on a one-to-one basis, each set of elements including two or more of the plurality of photoelectric conversion elements arranged adjacent to each other, and
a plurality of pixel blocks each having n×n photoelectric conversion elements receiving light having a same wavelength band, among the plurality of photoelectric conversion elements, and arranged in a lattice-pattern array,
wherein, in the light receiving unit, among a plurality of pixel sets each including the set of elements and one of the plurality of lenses provided in the set of elements, at least two pixel sets adjacent to each other are different from each other in pupil correction amount,
wherein the plurality of pixel blocks are arranged according to a pattern in which pixel blocks having photoelectric conversion elements receiving light having the same wavelength band are not adjacent to each other, and
wherein at least one of the plurality of pixel blocks includes two of the pixel sets that are different from each other in the pupil correction amount,
wherein the n is an integer of 3 or more, and
wherein at least one of the plurality of pixel blocks includes two of the pixel sets that are different from each other in direction in which adjacent ones of the plurality of photoelectric conversion elements included in the light receiving unit are aligned in the array.

3. The imaging element according to claim 2, further comprising
a control unit that controls read-out from the plurality of photoelectric conversion elements,
wherein the control unit has,
as a read-out mode in which a plurality of outputs corresponding, on a one-to-one basis, to the respective photoelectric conversion elements arranged in each of the plurality of pixel blocks are read out:

a mode in which the plurality of outputs are individually read out; and
a mode in which the plurality of outputs are read out as one output by being combined in the pixel block where the respective photoelectric conversion elements corresponding to the plurality of outputs are arranged.

4. The imaging element according to claim 2,
wherein the light receiving unit further includes
a filter provided on an incident surface of each of the plurality of photoelectric conversion elements to restrict a wavelength band of incident light, and a first light shielding body provided around the filter.

5. The imaging element according to claim 4,
wherein positions of the filter and the first light shielding body with respect to one of the plurality of photoelectric conversion elements corresponding to the filter and the first light shielding body are different between the at least two pixel sets adjacent to each other, each including the photoelectric conversion element, so that the at least two pixel sets are different from each other in the pupil correction amount.

6. The imaging element according to claim 2,
wherein the light receiving unit further includes
a second light shielding body that is a groove formed in a depth direction of a substrate, in which each of the plurality of photoelectric conversion elements is formed, with respect to an incident surface of each of the plurality of photoelectric conversion elements, and
the second light shielding body is
formed between the plurality of pixel blocks.

7. The imaging element according to claim 6,
wherein the second light shielding body is further formed between the pixel sets.

8. The imaging element according to claim 2,
wherein a position of the lens included in the pixel set with respect to the set of elements included in the pixel set is different between the at least two pixel sets adjacent to each other, so that the at least two pixel sets are different from each other in the pupil correction amount.

9. The imaging element according to claim 2,
wherein the pupil correction amount and a direction in which a pupil correction is made in the pupil correction amount are further different depending on a position of a light receiving surface including an incident surface of each of the plurality of photoelectric conversion elements with respect to an image height center corresponding to an optical axis of a main lens for irradiating the light receiving surface with light.

10. The imaging element according to claim 2,
wherein the light receiving unit further includes
a mask for restricting light incident on the set of elements included in the pixel set, and
a position of the mask with respect to the set of elements included in the pixel set is different between the at least two pixel sets adjacent to each other, so that the at least two pixel sets are different from each other in the pupil correction amount.

11. An electronic device, comprising:
a light receiving unit that includes
  a plurality of photoelectric conversion elements arranged in a lattice-pattern array, and
  a plurality of lenses provided for respective sets of elements on a one-to-one basis, each set of elements including two or more of the plurality of photoelectric conversion elements arranged adjacent to each other; and
a plurality of pixel blocks each having n×n photoelectric conversion elements receiving light having a same wavelength band, among the plurality of photoelectric conversion elements, and arranged in a lattice-pattern array;
an optical unit that guides external light to the light receiving unit;
an image processing unit that generates image data by executing image processing on the basis of a plurality of outputs read out from the plurality of photoelectric conversion elements, respectively; and
a storage unit that stores the image data generated by the image processing unit,
wherein, in the light receiving unit,—among a plurality of pixel sets each including the set of elements and one of the plurality of lenses provided in the set of elements, at least two pixel sets adjacent to each other are different from each other in pupil correction amount,
wherein the plurality of pixel blocks are arranged according to a pattern in which pixel blocks having photoelectric conversion elements receiving light having the same wavelength band are not adjacent to each other, and
wherein at least one of the plurality of pixel blocks includes two of the pixel sets that are different from each other in the pupil correction amount,
wherein the n is an integer of 3 or more, and
wherein at least one of the plurality of pixel blocks includes three or more of the pixel sets that are different from each other in the pupil correction amount.

12. The imaging element according to claim 1, further comprising
a control unit that controls read-out from the plurality of photoelectric conversion elements,
wherein the control unit has,
as a read-out mode in which a plurality of outputs corresponding, on a one-to-one basis, to the respective photoelectric conversion elements arranged in each of the plurality of pixel blocks are read out:
a mode in which the plurality of outputs are individually read out; and
a mode in which the plurality of outputs are read out as one output by being combined in the pixel block where the respective photoelectric conversion elements corresponding to the plurality of outputs are arranged.

13. The imaging element according to claim 1,
wherein the light receiving unit further includes
a filter provided on an incident surface of each of the plurality of photoelectric conversion elements to restrict a wavelength band of incident light, and a first light shielding body provided around the filter.

14. The imaging element according to claim 13,
wherein positions of the filter and the first light shielding body with respect to one of the plurality of photoelectric conversion elements corresponding to the filter and the first light shielding body are different between the at least two pixel sets adjacent to each other, each including the photoelectric conversion element, so that the at least two pixel sets are different from each other in the pupil correction amount.

15. The imaging element according to claim 1,
wherein the light receiving unit further includes
a second light shielding body that is a groove formed in a depth direction of a substrate, in which each of the plurality of photoelectric conversion elements is formed, with respect to an incident surface of each of the plurality of photoelectric conversion elements, and the second light shielding body is formed between the plurality of pixel blocks.

16. The imaging element according to claim 15, wherein the second light shielding body is further formed between the pixel sets.

17. The imaging element according to claim 1, wherein a position of the lens included in the pixel set with respect to the set of elements included in the pixel set is different between the at least two pixel sets adjacent to each other, so that the at least two pixel sets are different from each other in the pupil correction amount.

18. The imaging element according to claim 1, wherein the pupil correction amount and a direction in which a pupil correction is made in the pupil correction amount are further different depending on a position of a light receiving surface including an incident surface of each of the plurality of photoelectric conversion elements with respect to an image height center corresponding to an optical axis of a main lens for irradiating the light receiving surface with light.

19. The imaging element according to claim 1, wherein the light receiving unit further includes a mask for restricting light incident on the set of elements included in the pixel set, and a position of the mask with respect to the set of elements included in the pixel set is different between the at least two pixel sets adjacent to each other, so that the at least two pixel sets are different from each other in the pupil correction amount.

* * * * *